United States Patent [19]

Valdettaro

[11] 4,200,850
[45] Apr. 29, 1980

[54] COMBINATION VHF AND UHF TUNER ARRANGEMENT

[75] Inventor: Alarico A. Valdettaro, Bloomington, Ind.

[73] Assignee: Sarkes Tarzian, Inc., Bloomington, Ind.

[21] Appl. No.: 971,343

[22] Filed: Dec. 20, 1978

Related U.S. Application Data

[63] Continuation of Ser. No. 776,890, Mar. 11, 1977, abandoned.

[51] Int. Cl.² .............................................. H03J 5/30
[52] U.S. Cl. ...................................... 334/1; 74/10.41;
74/10.6; 334/51; 334/87
[58] Field of Search .................. 74/10.22, 10.29, 10.41,
74/10.45, 10.6, 10.85; 334/1, 2, 47, 50, 51,
85–88

[56] References Cited

U.S. PATENT DOCUMENTS

| 3,038,346 | 6/1962 | MacFarland | 74/10.85 |
| 3,234,490 | 2/1966 | Dickinson et al. | 334/2 |
| 3,513,418 | 5/1970 | Schwartz | 334/1 |
| 3,593,226 | 7/1971 | Weigel | 334/2 X |
| 3,618,561 | 11/1971 | Wallis et al. | 334/86 X |
| 3,689,853 | 9/1972 | Badger et al. | 334/87 X |
| 3,886,890 | 6/1975 | Gibson et al. | 334/86 X |
| 3,972,240 | 8/1976 | Valdettaro | 334/51 X |
| 3,973,229 | 8/1976 | Weigel | 334/86 |
| 3,990,315 | 11/1976 | Weigel | 334/2 X |

*Primary Examiner*—Paul L. Gensler

*Attorney, Agent, or Firm*—Mason, Kolehmainen, Rathburn & Wyss

[57] ABSTRACT

A combination VHF and UHF tuner is provided in which a common station selector shaft may be rotated a number of revolutions to cover the seventy stations in the UHF band. The common selector shaft is provided with twenty-four detent positions per revolution and in alternate positions of the shaft the twelve VHF stations in the VHF band are received. As the common selector shaft is rotated through several revolutions the VHF stations are repeatedly received but are interspersed with different individual stations in the UHF band. Accordingly, no matter what UHF station is being received, all of the VHF stations are always within one turn of the common selector shaft. In many mixed UHF-VHF reception areas a single turn of the common selector shaft is sufficient to select all of the UHF stations as well as all of the VHF stations which are broadcasting in that area. Also, any UHF station anywhere in the UHF band is selected with the same ease of selection as the interspersed VHF stations so that true comparability between VHF and UHF reception is achieved.

A single readout window is provided which displays alternately and sequentially each individual channel number, whether UHF or VHF, in numerals of identical size and legibility. A common fine tuning shaft for both UHF and VHF is provided concentric with the common station selector shaft. VHF fine tuning may be either of the memory or nonmemory type.

109 Claims, 55 Drawing Figures

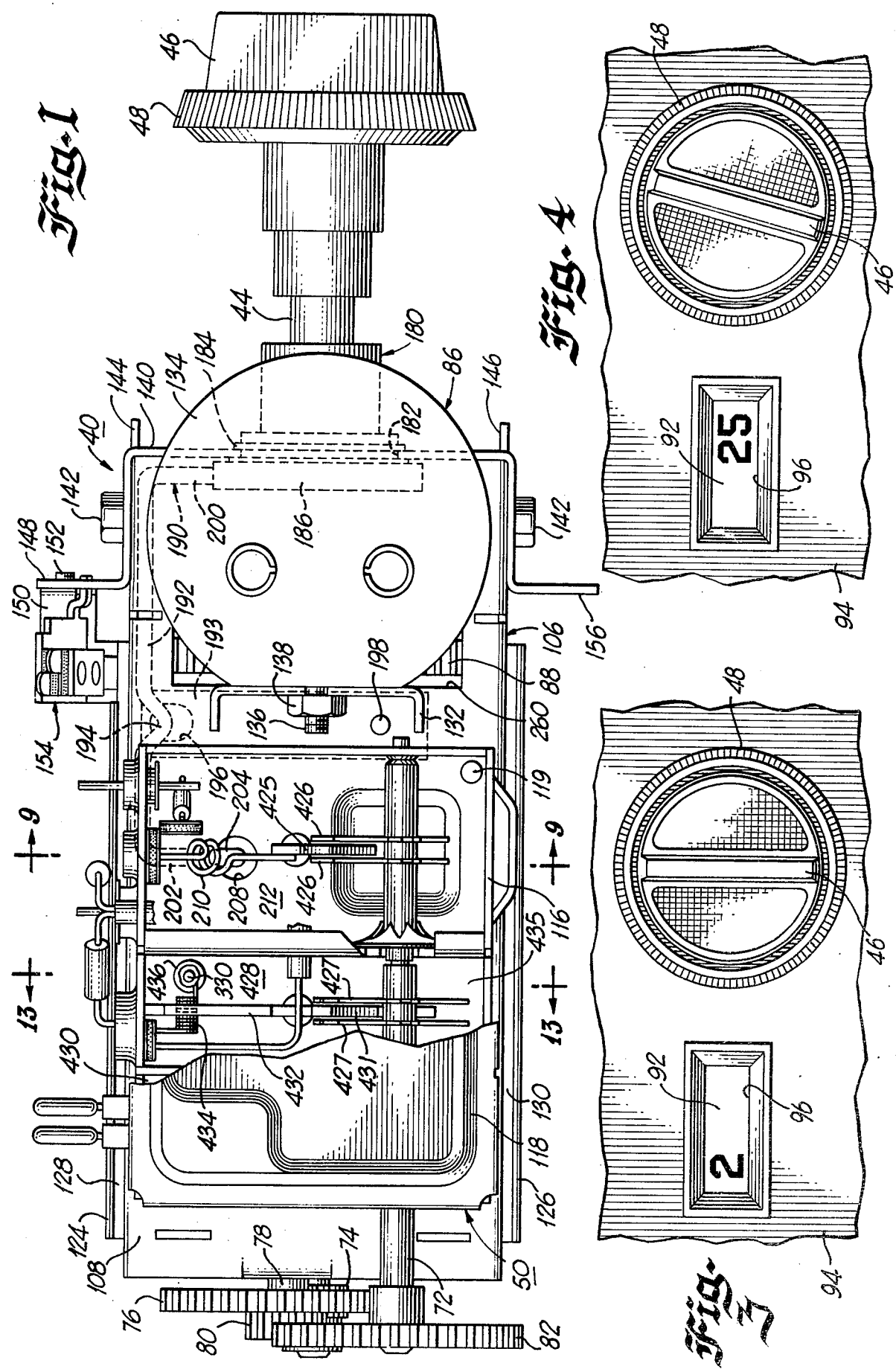

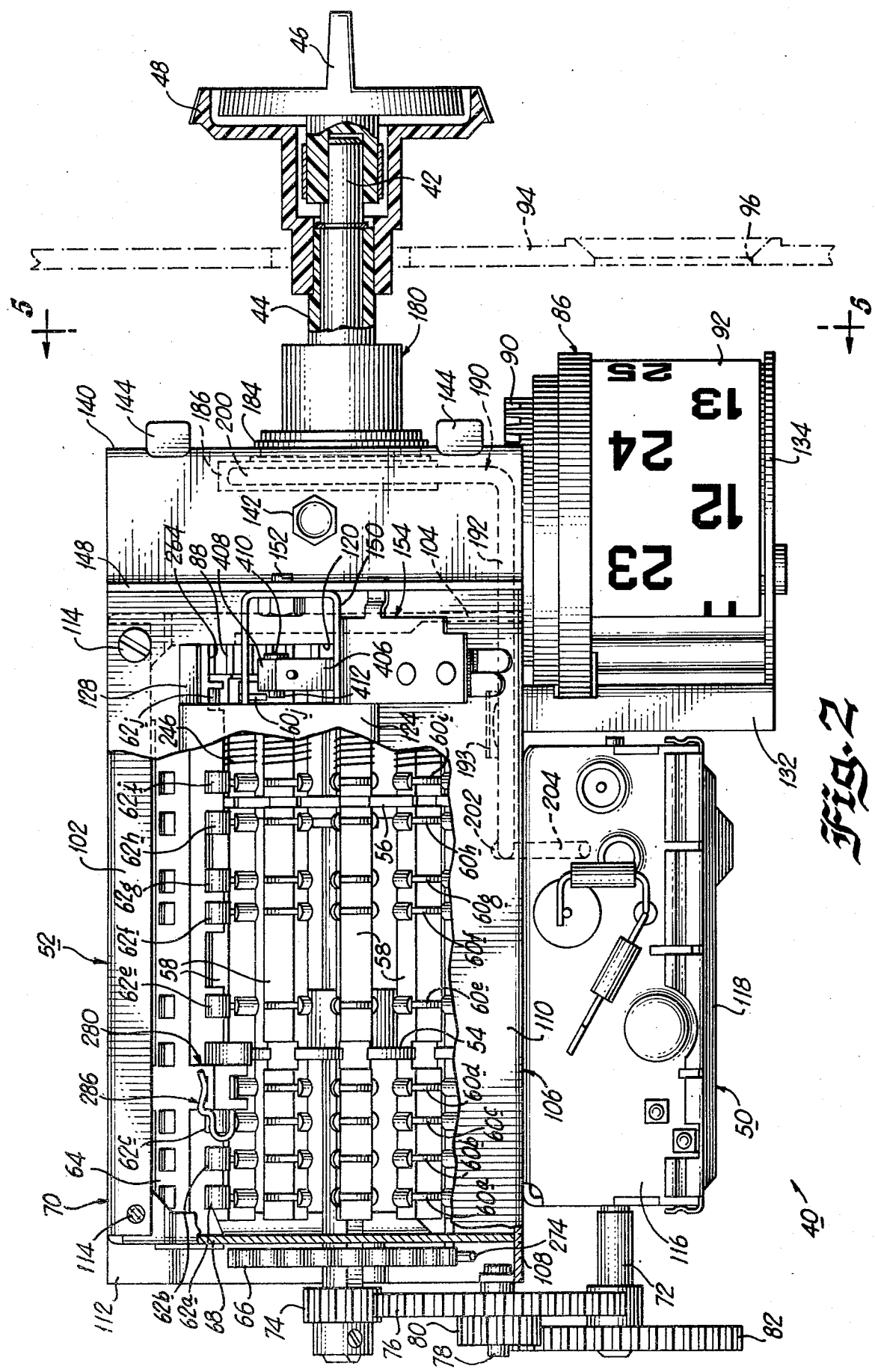

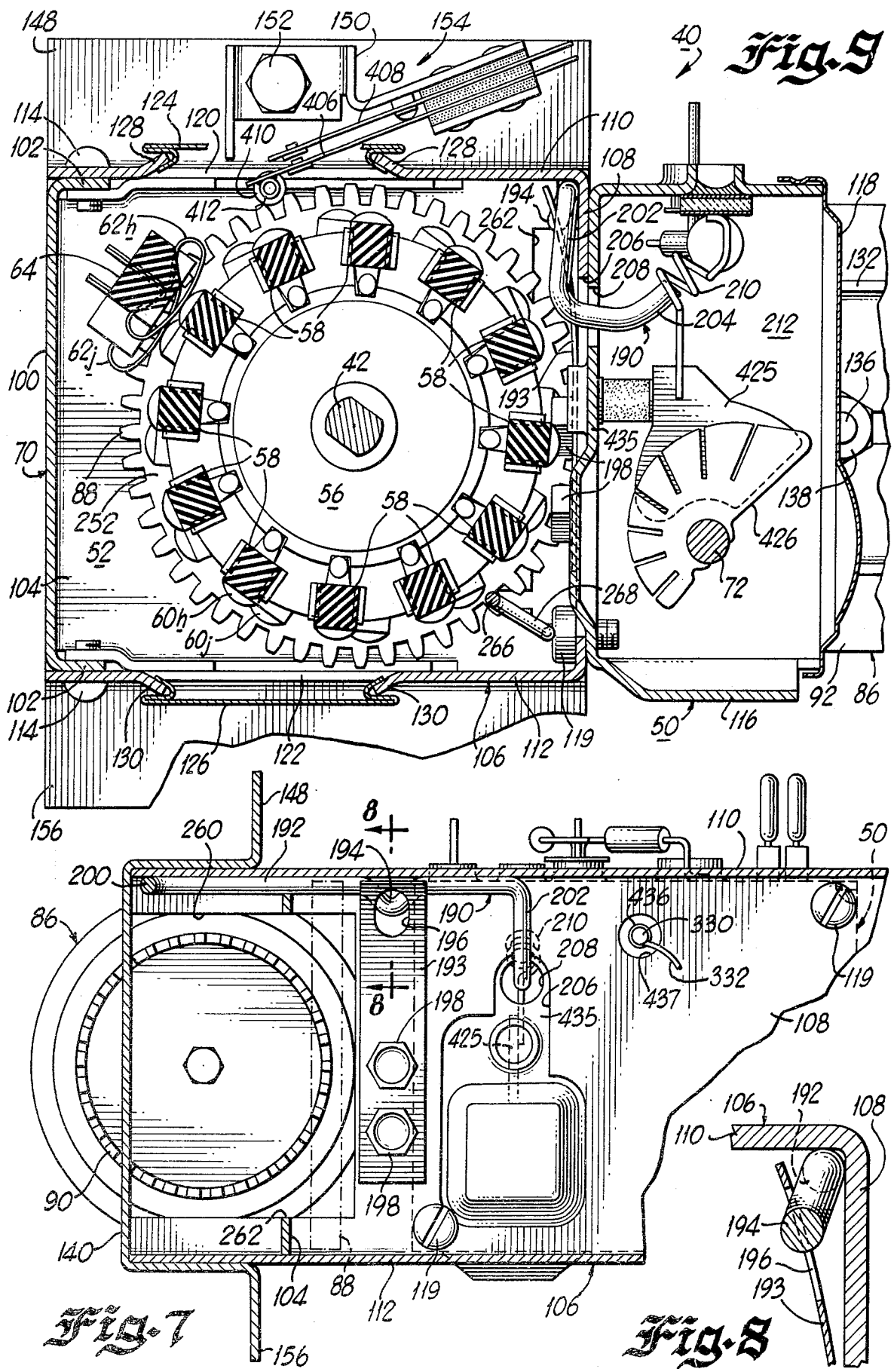

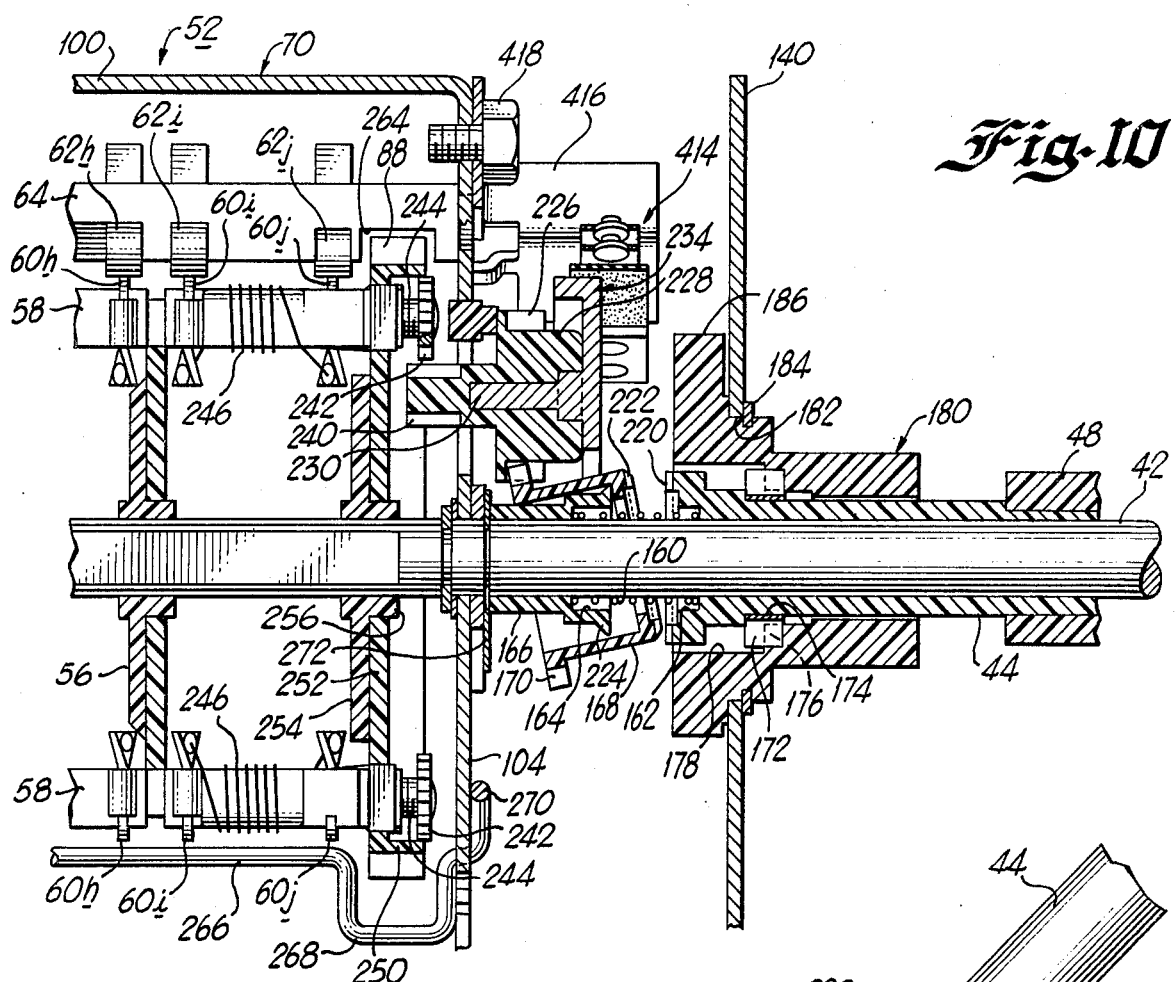
Fig. 10
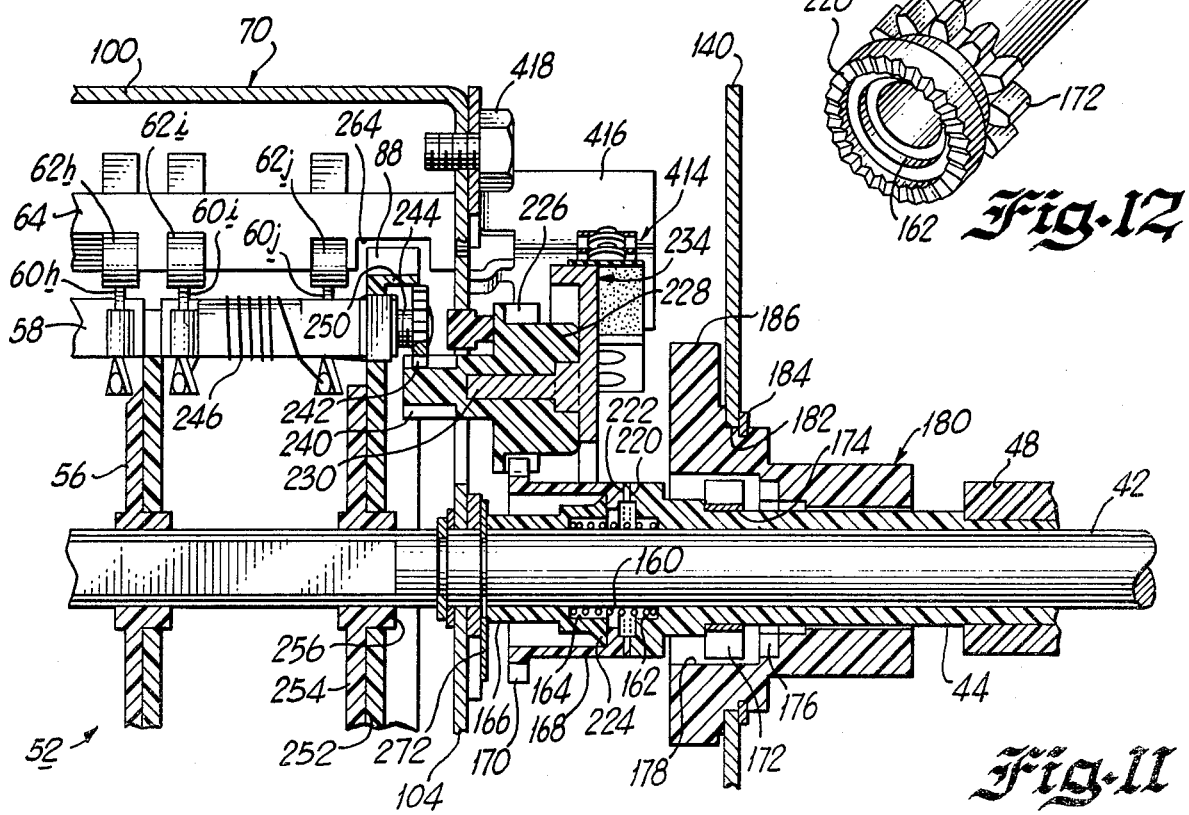
Fig. 12
Fig. 11

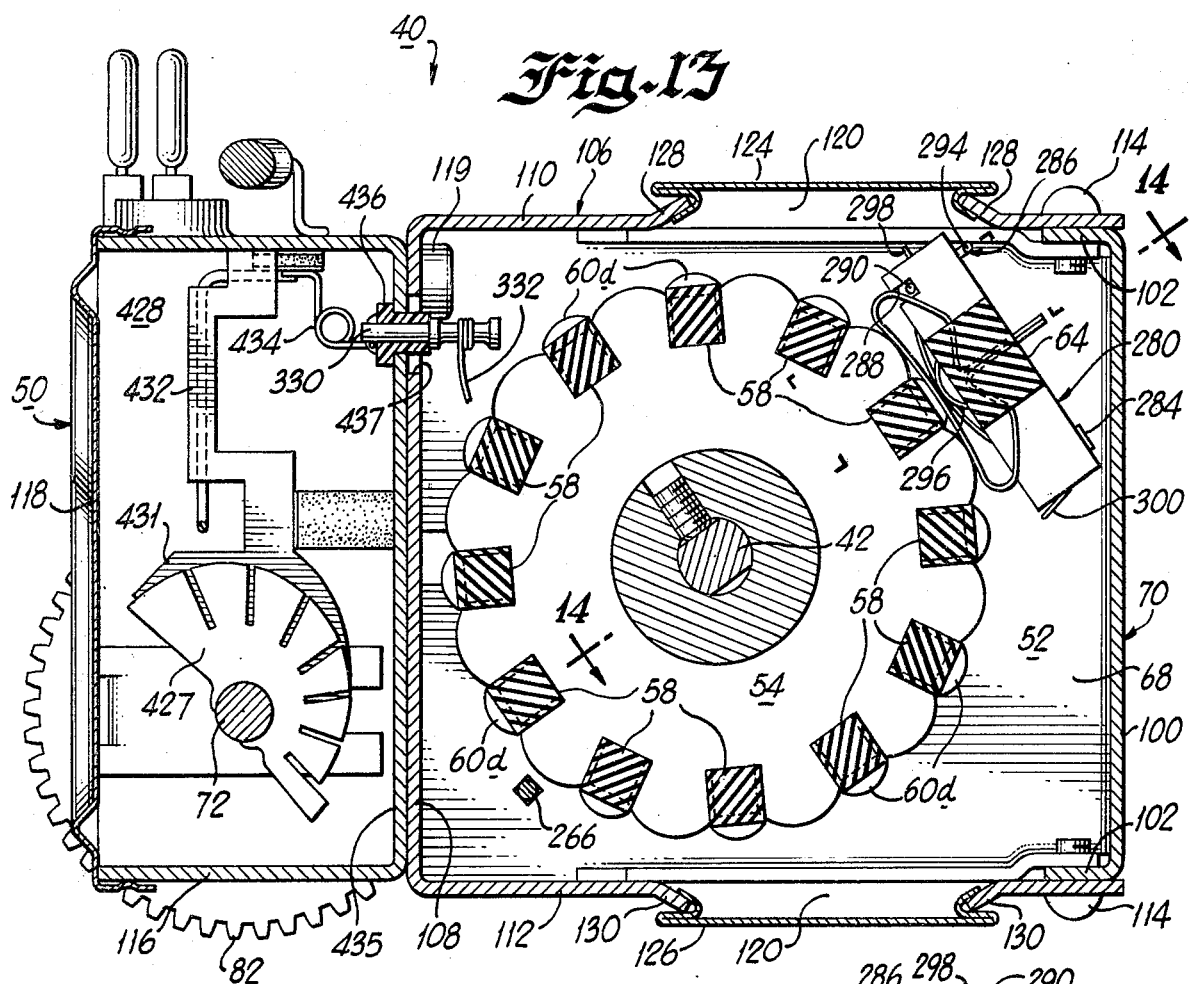
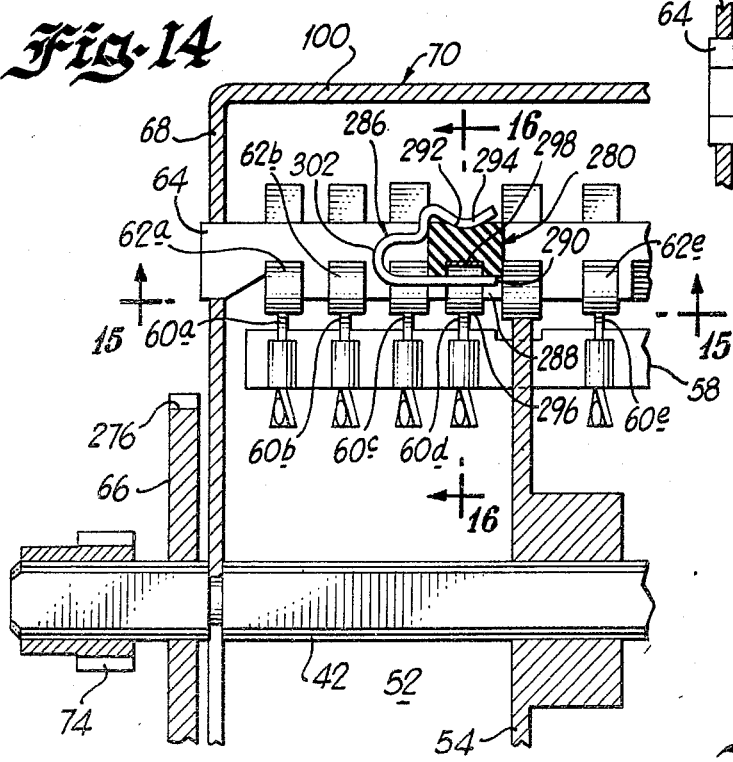
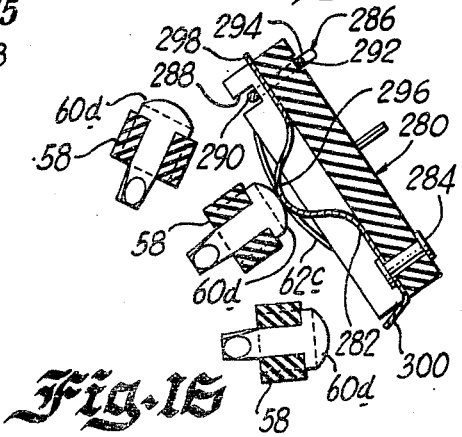

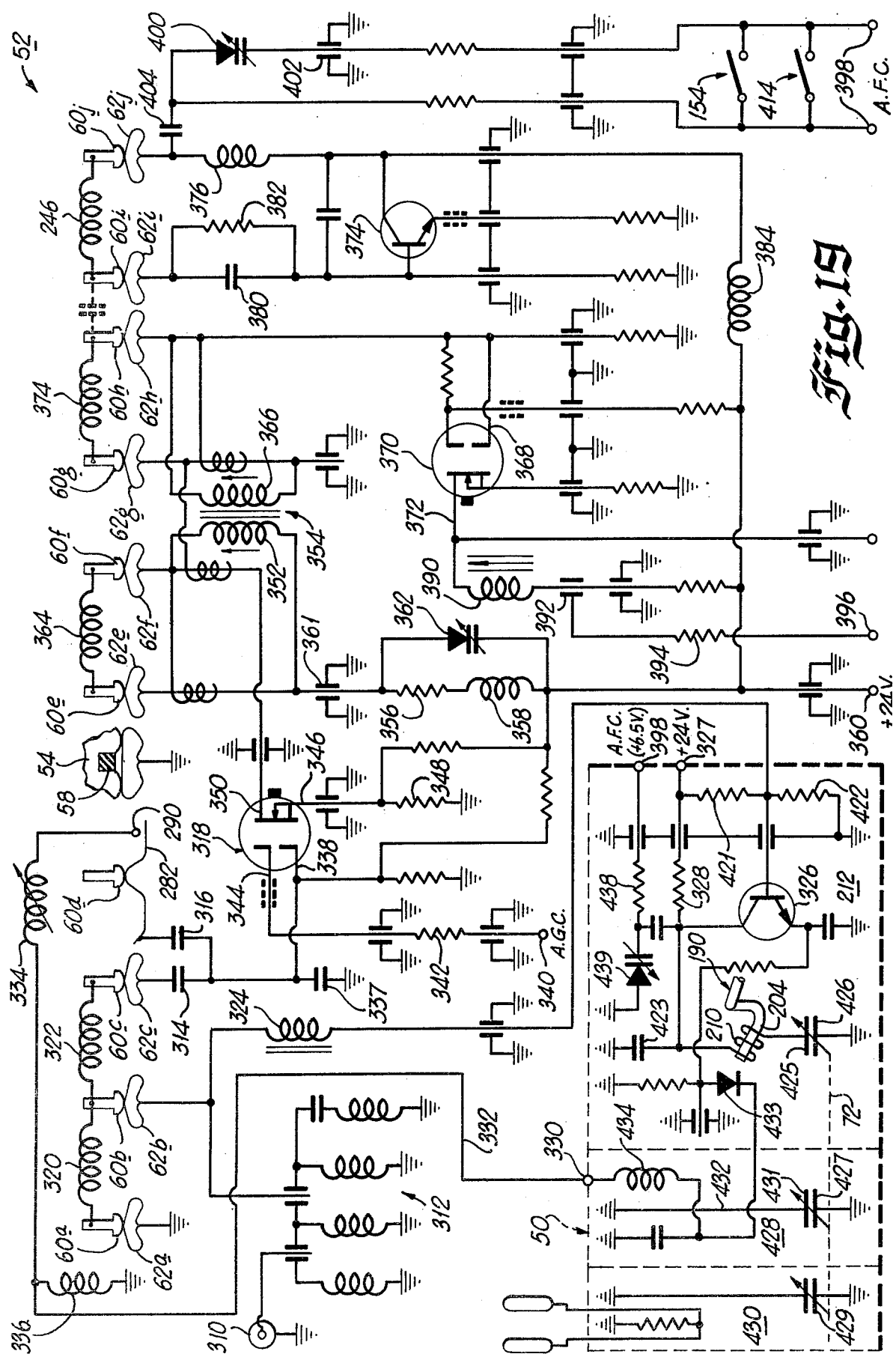

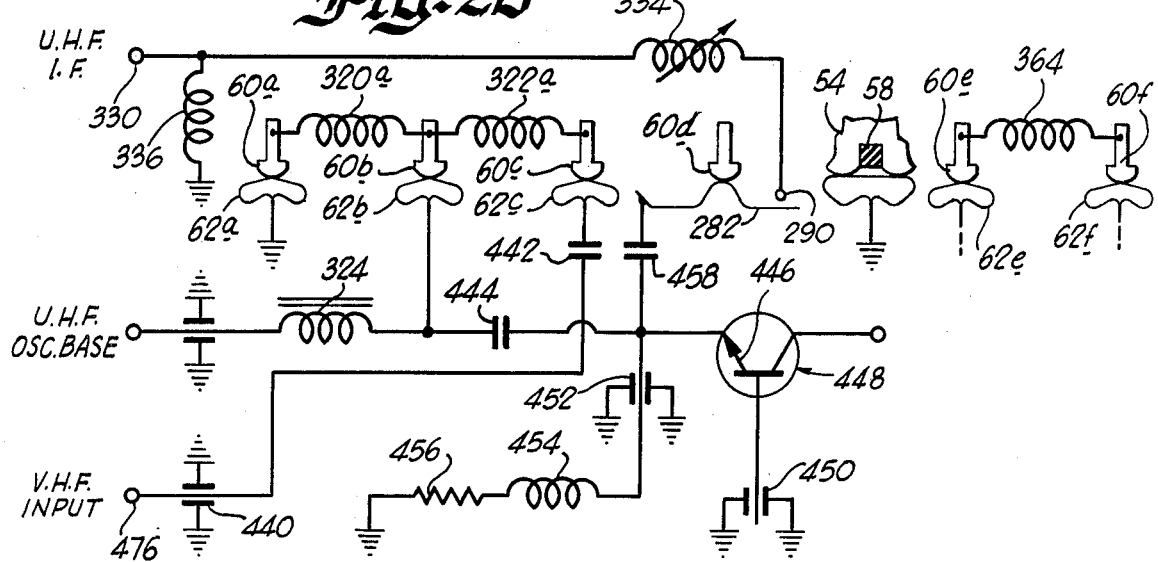
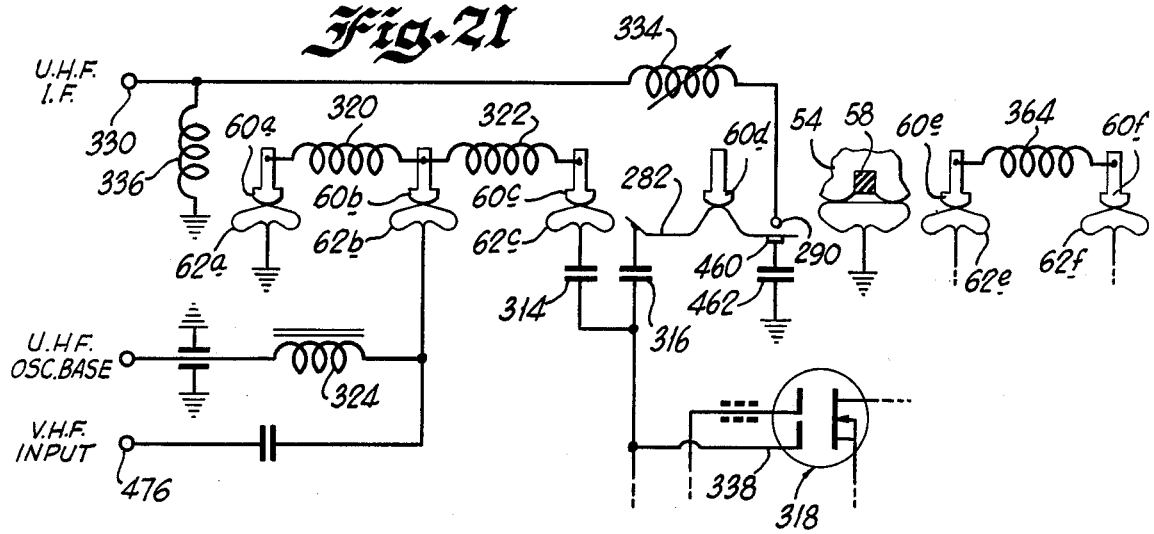
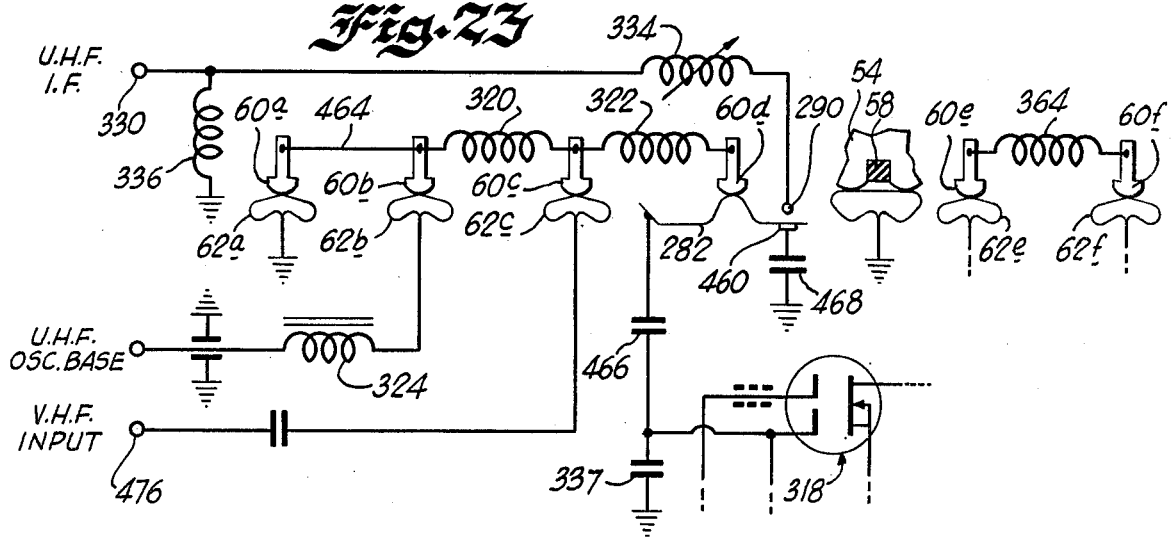

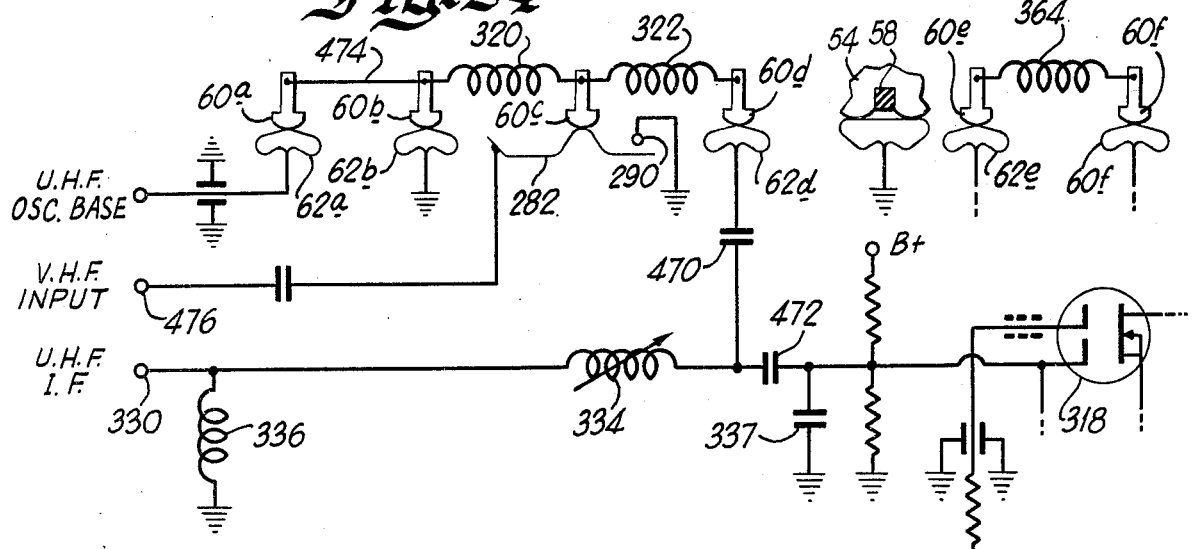
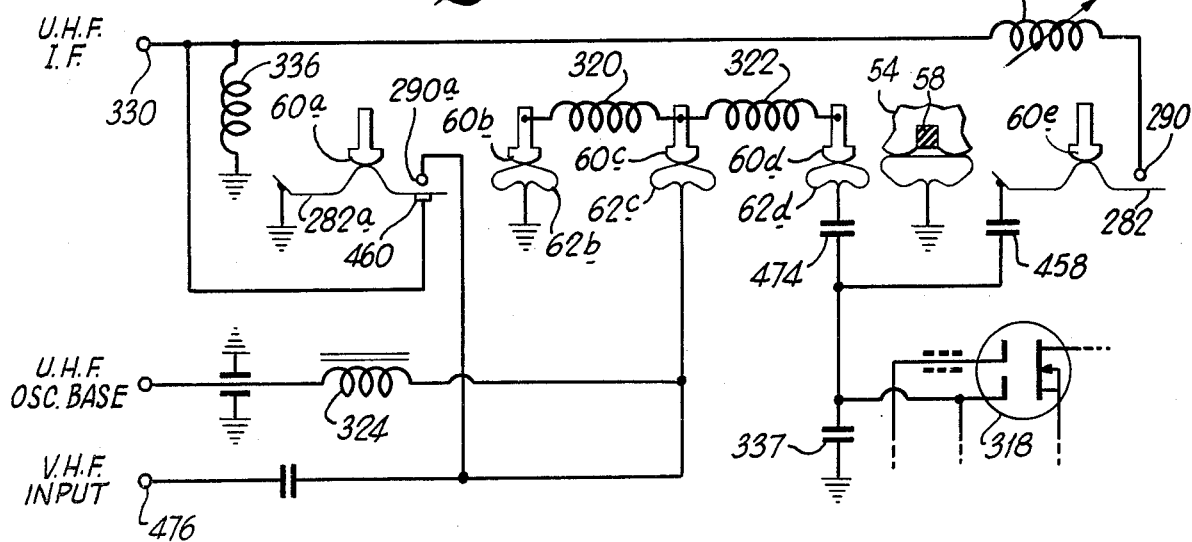
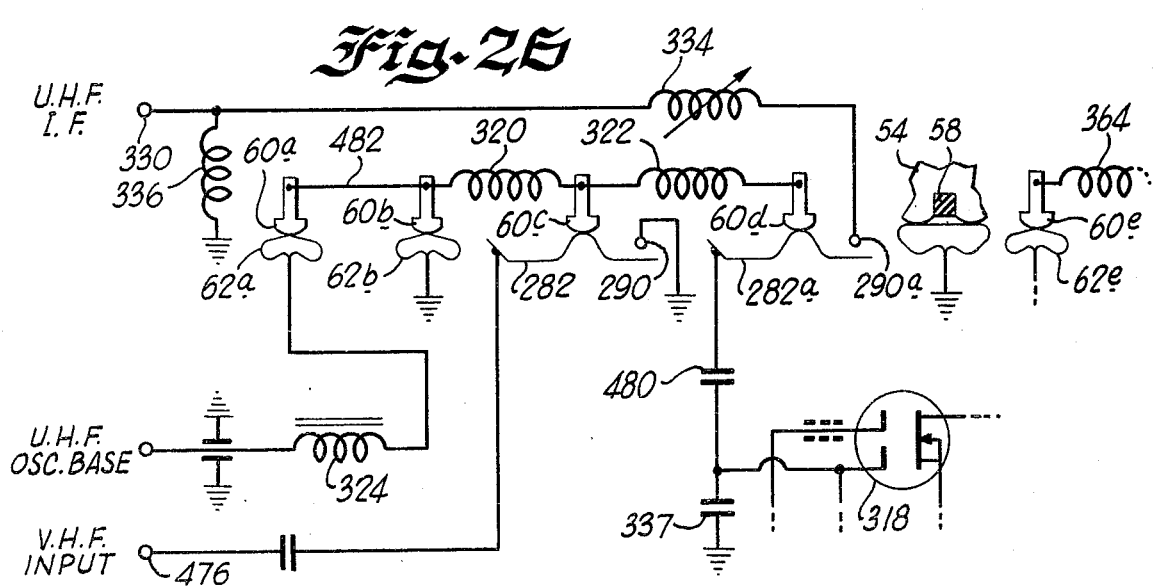

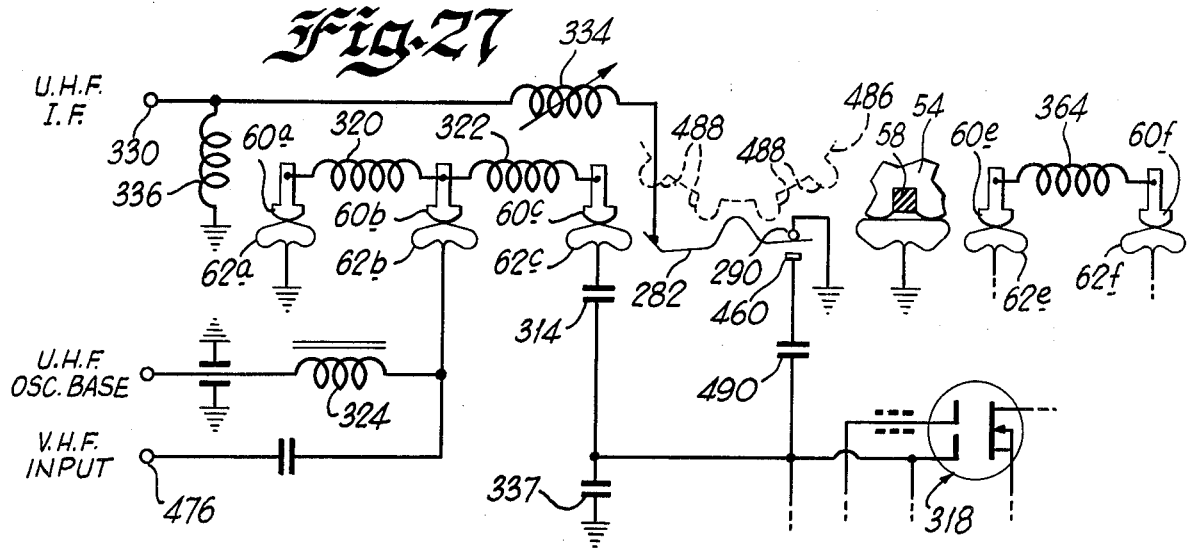
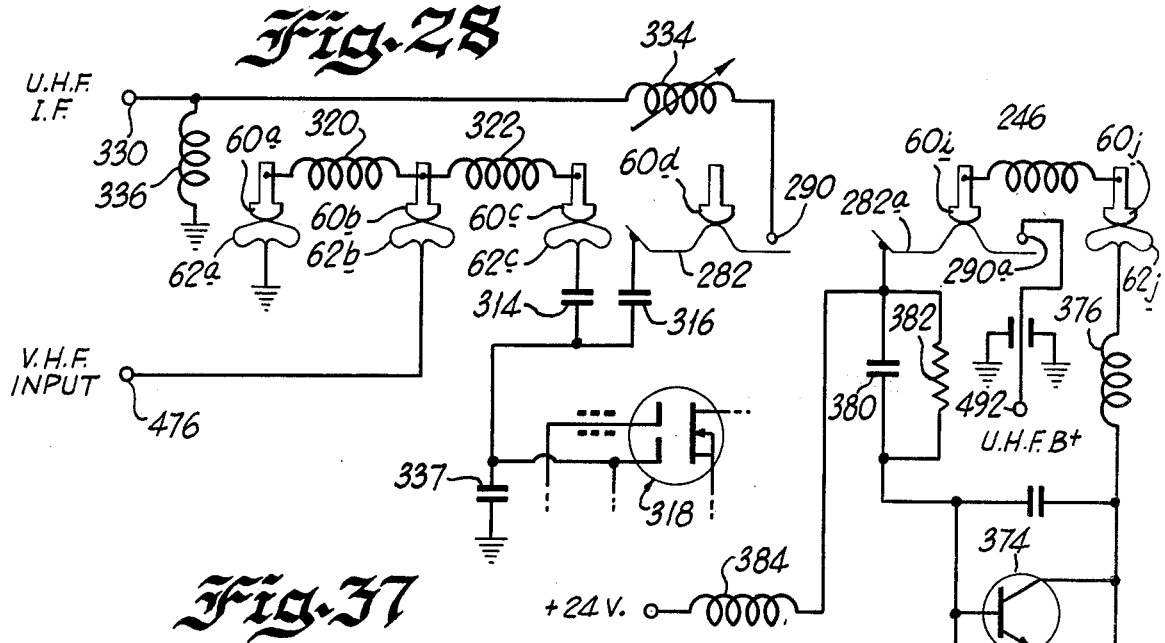
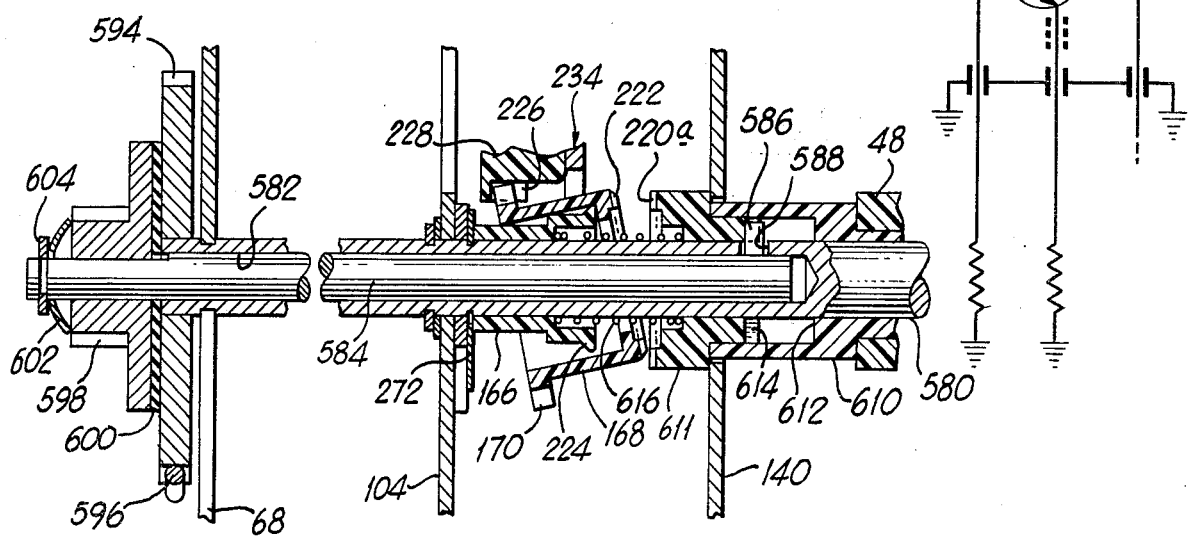

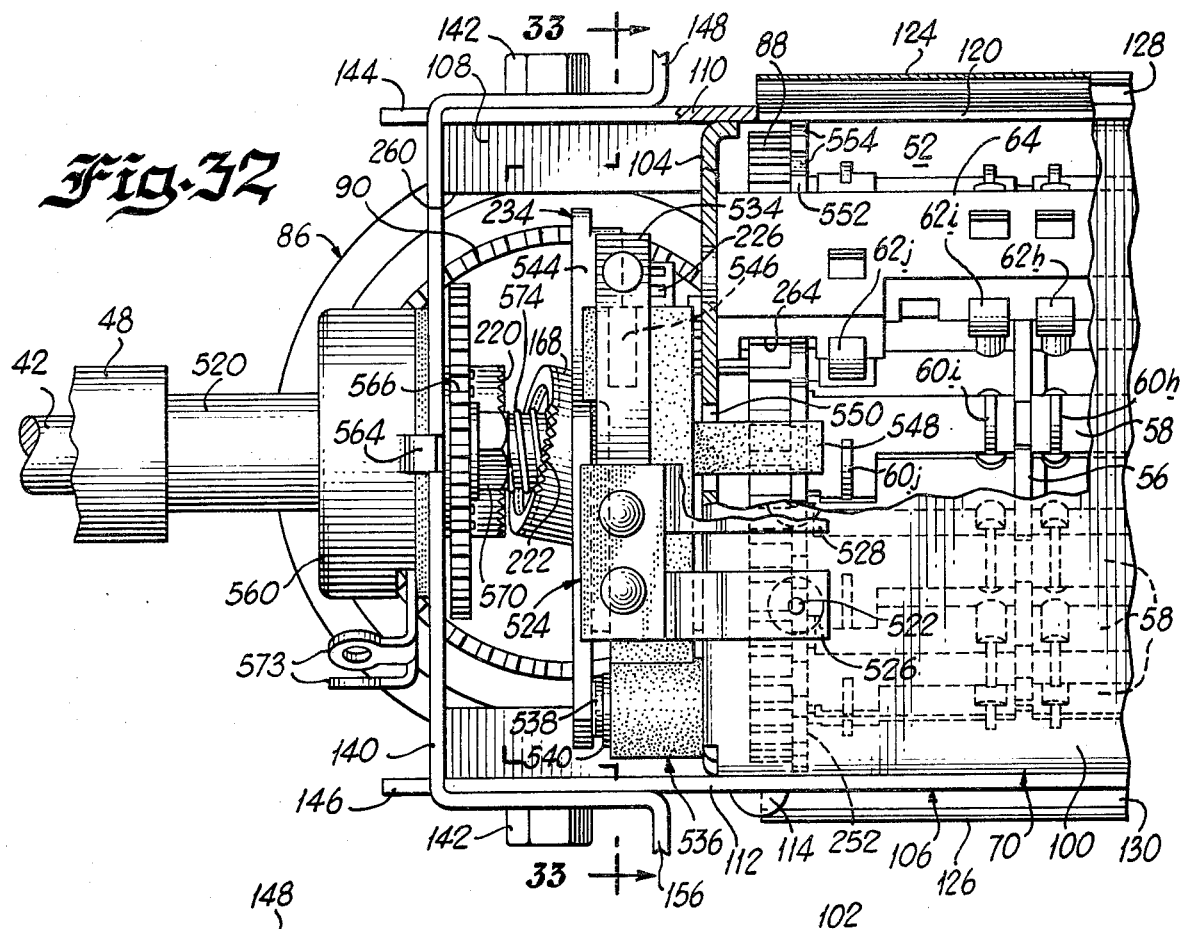
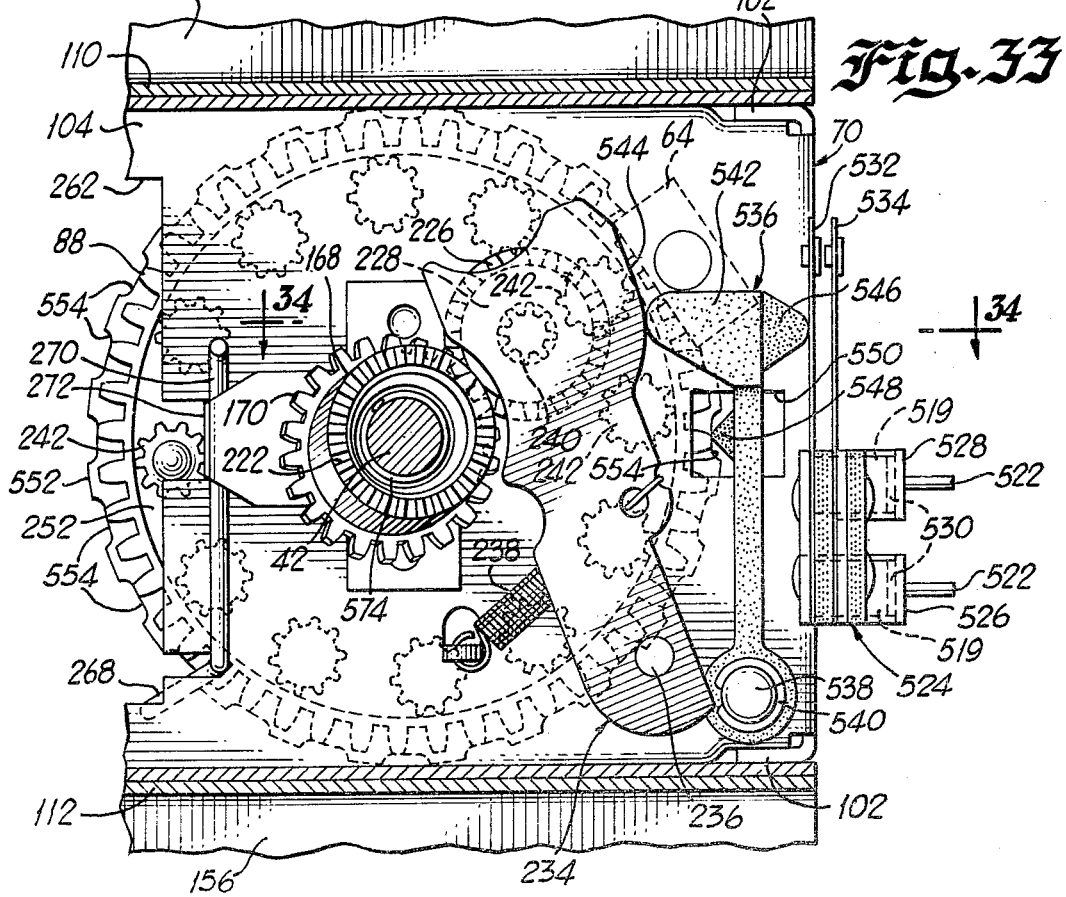

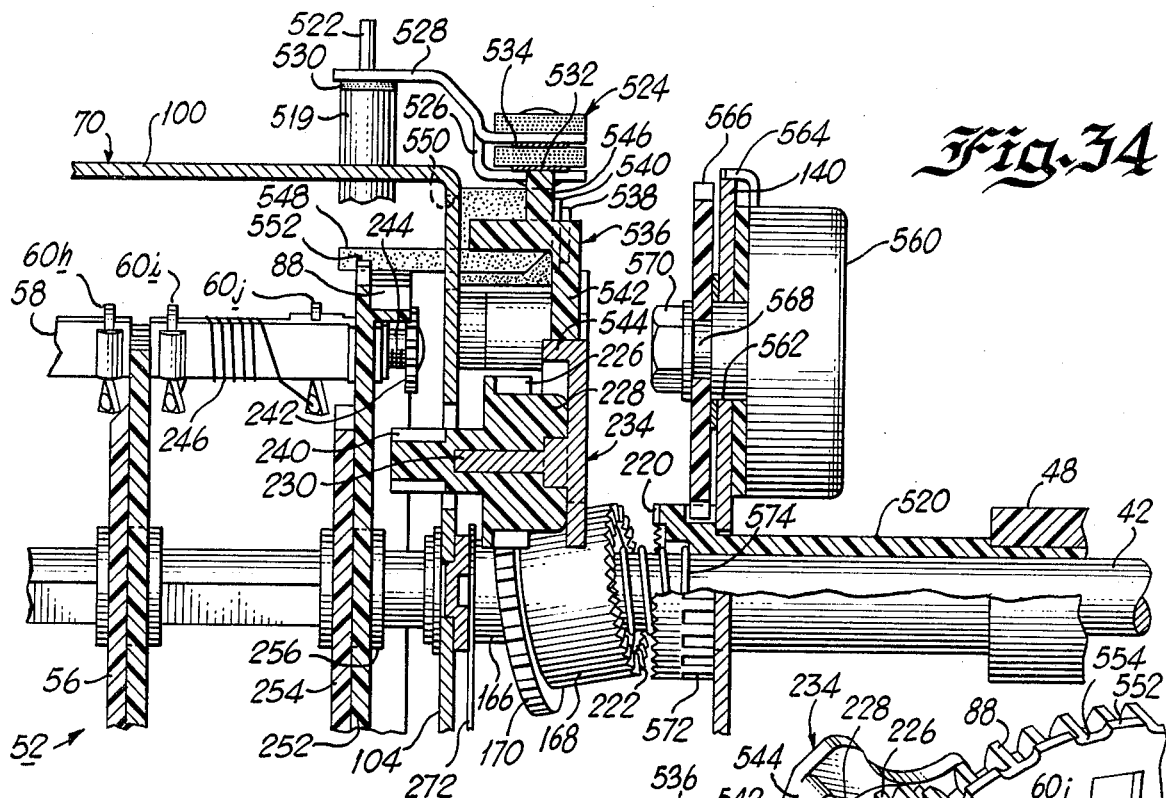
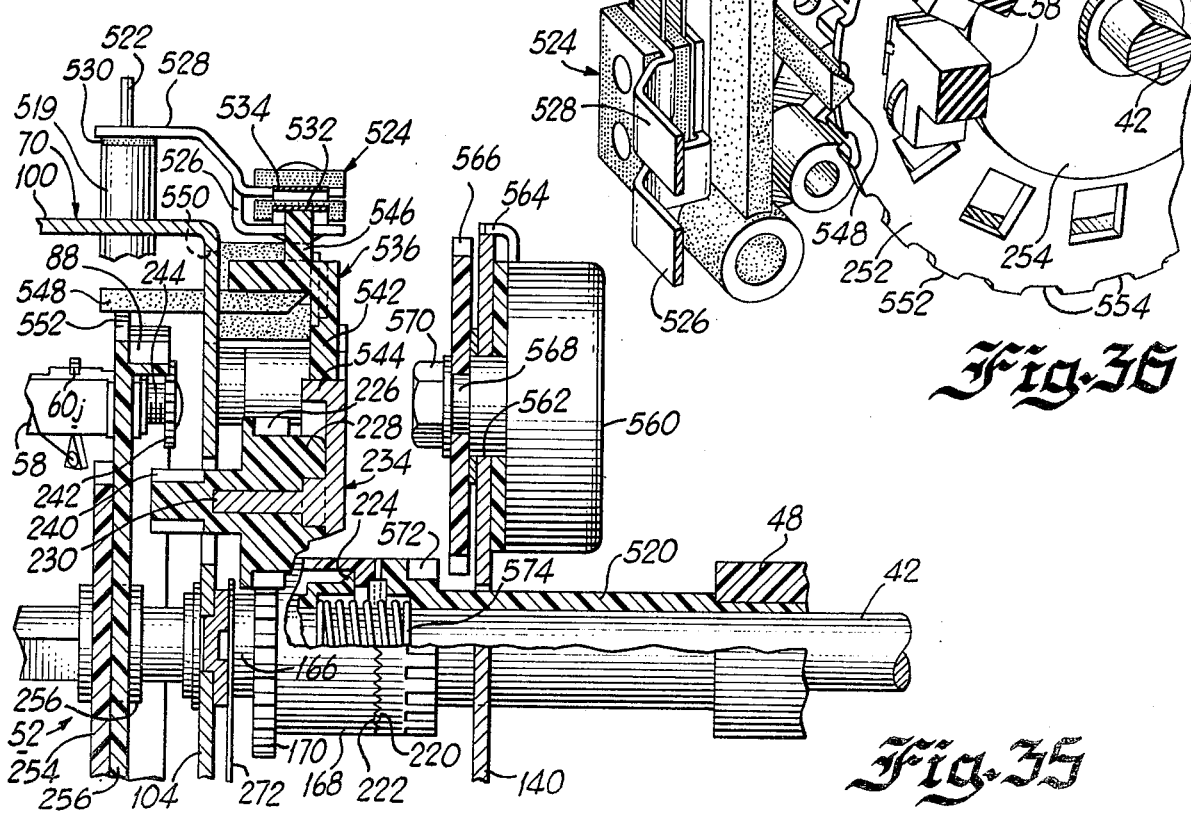

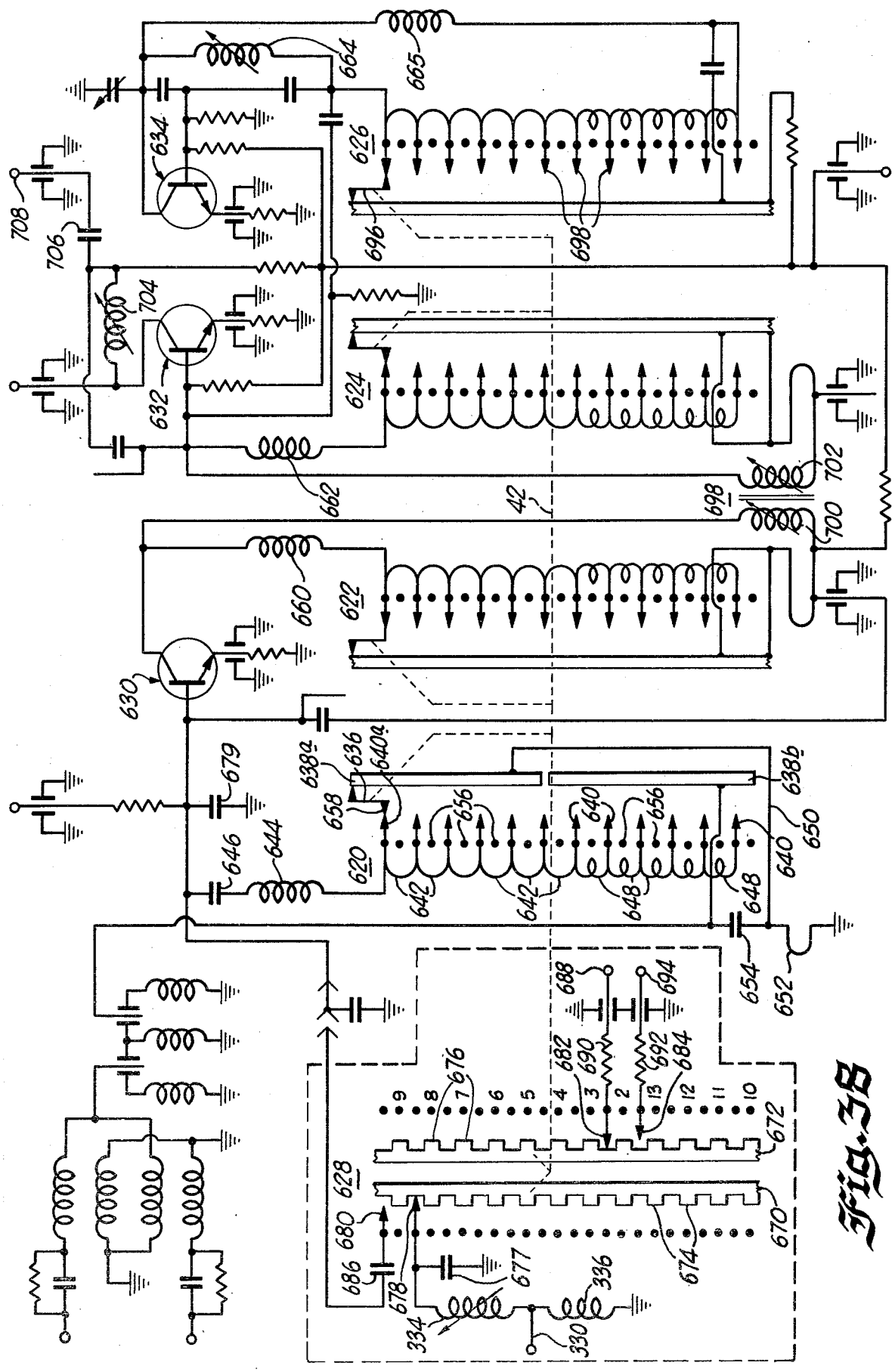

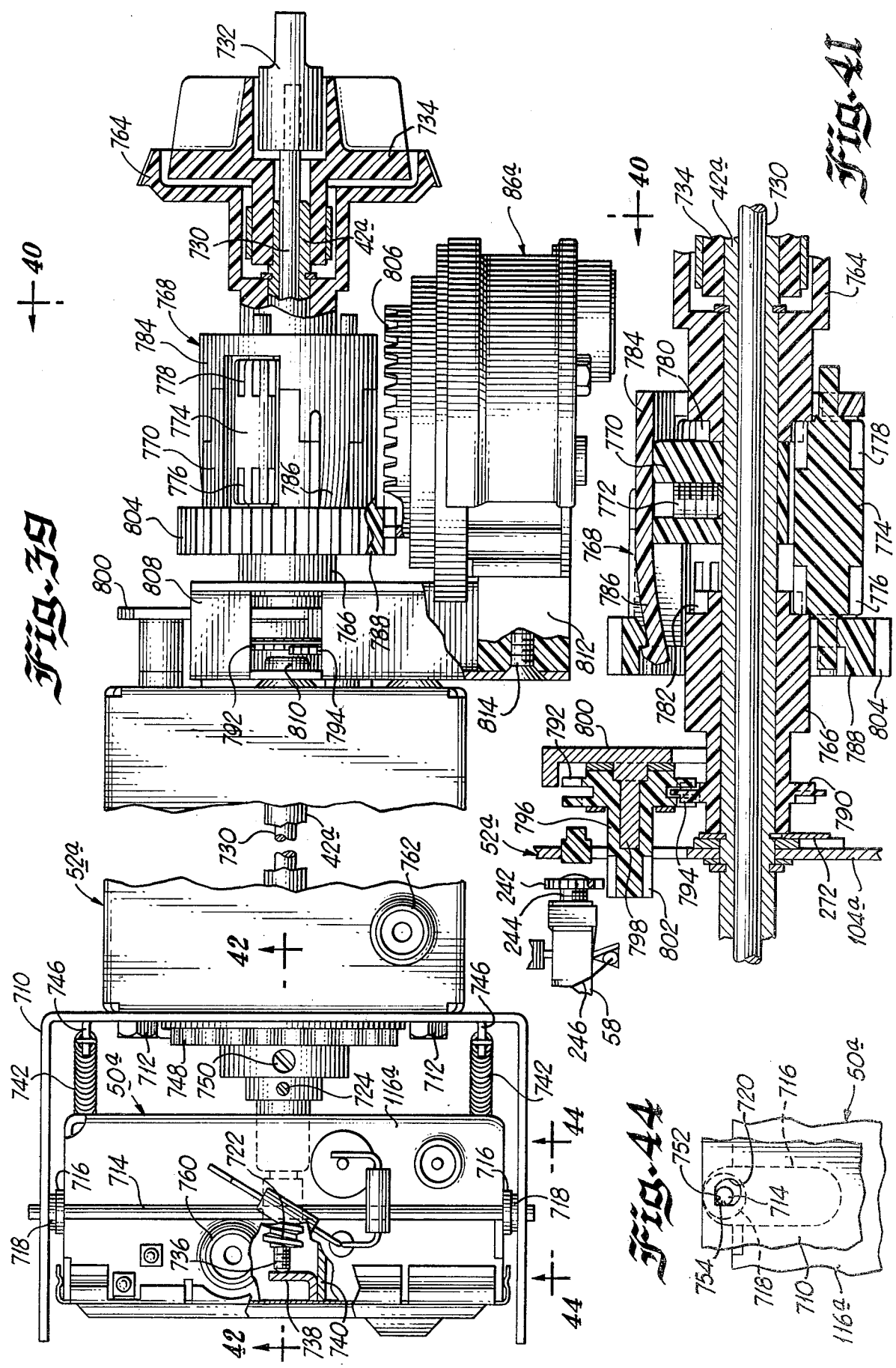

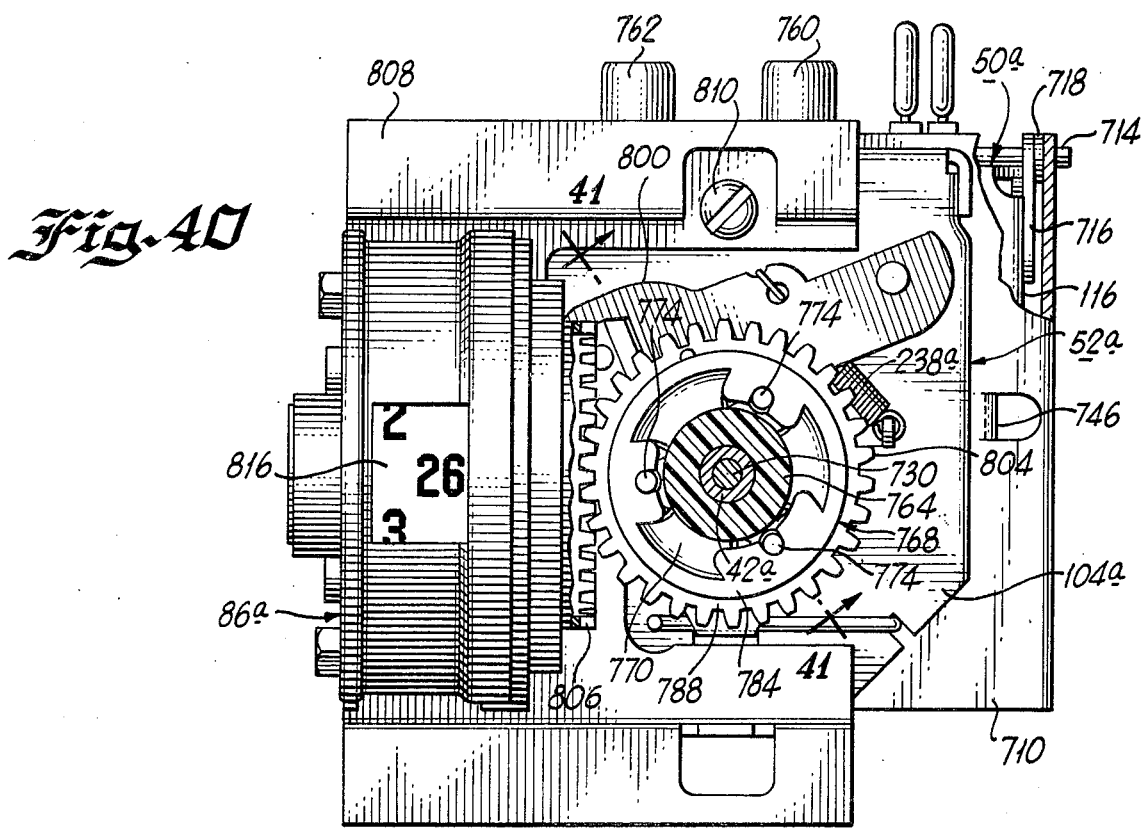
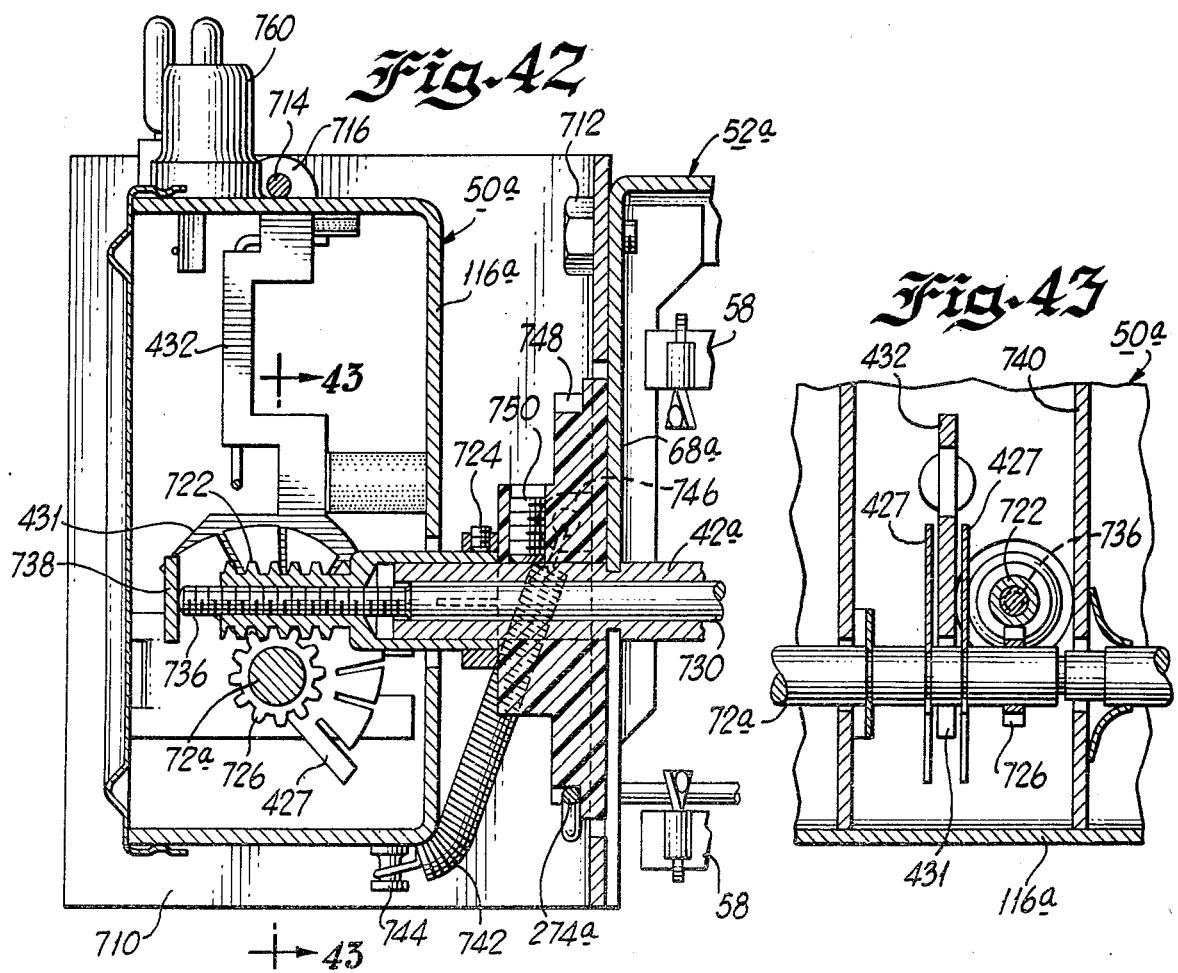

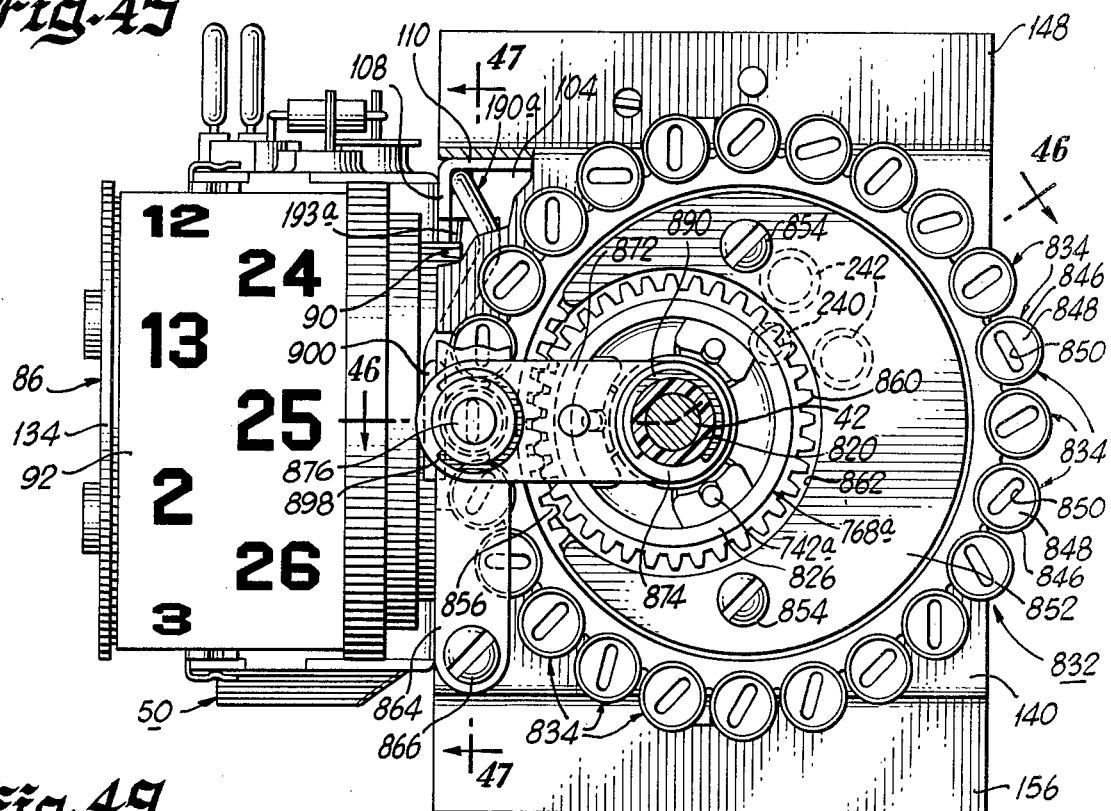
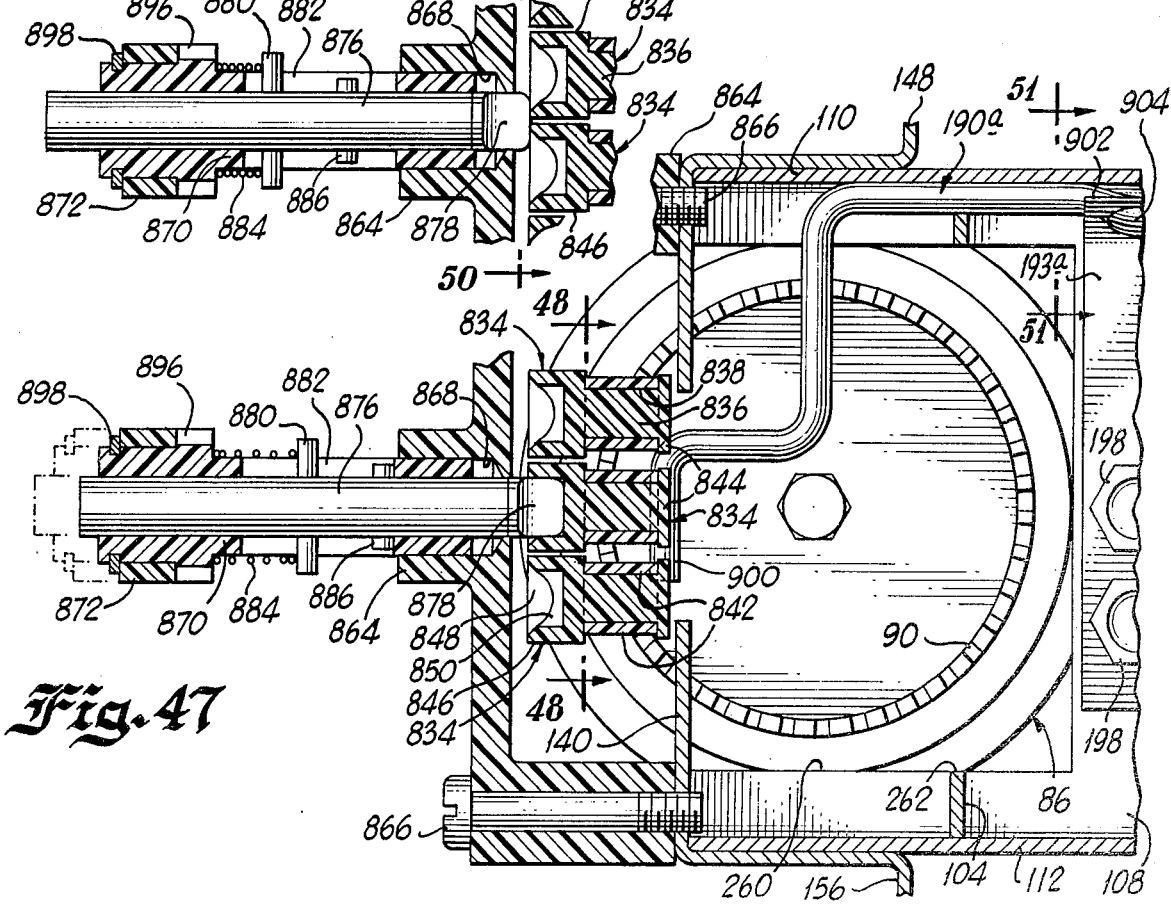

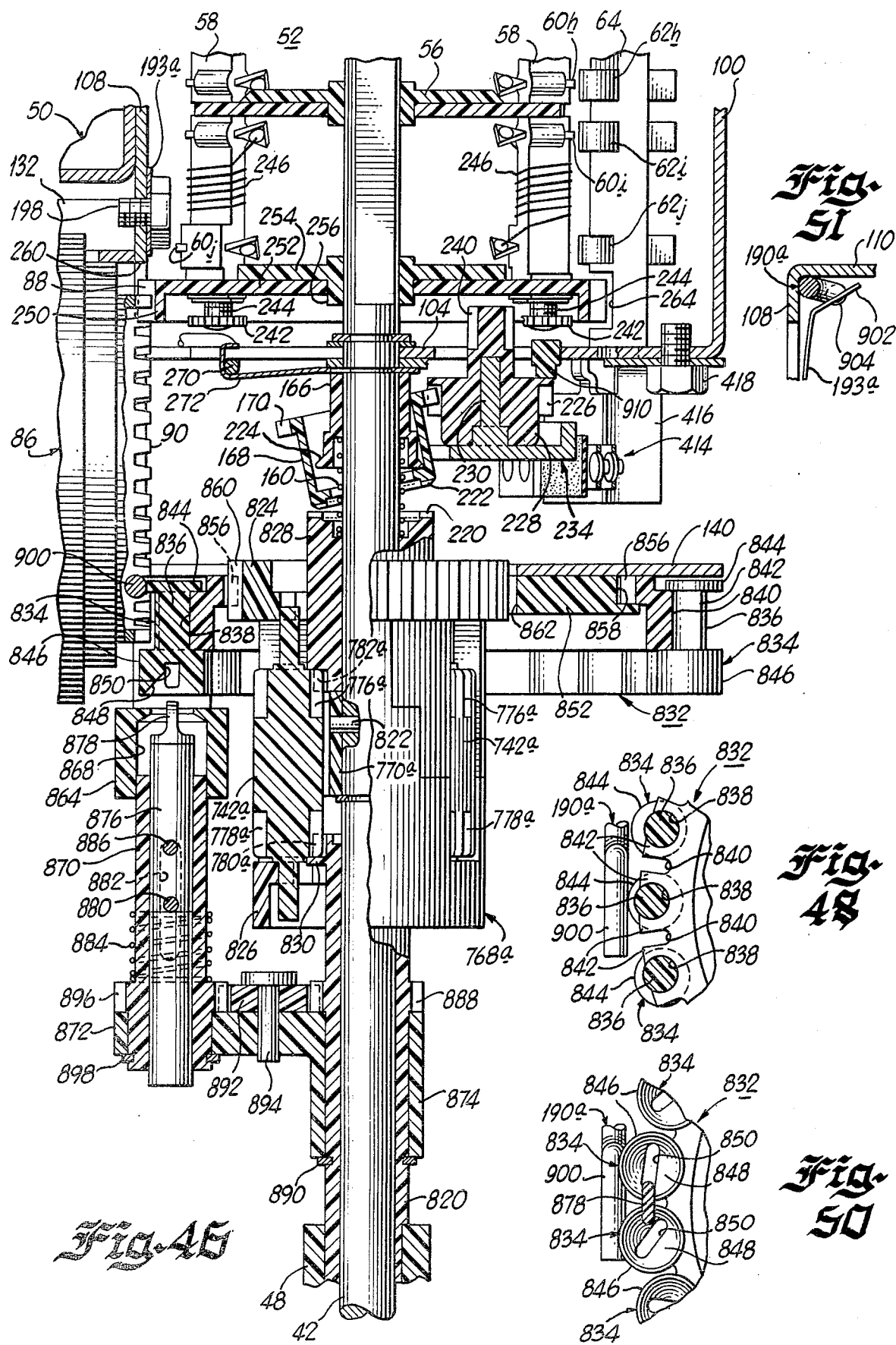

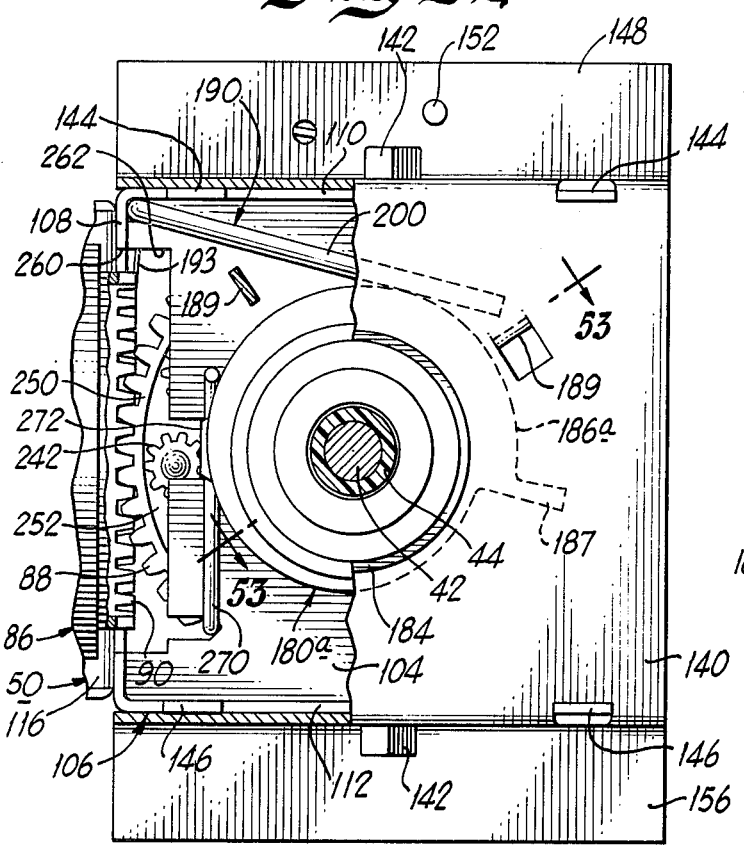
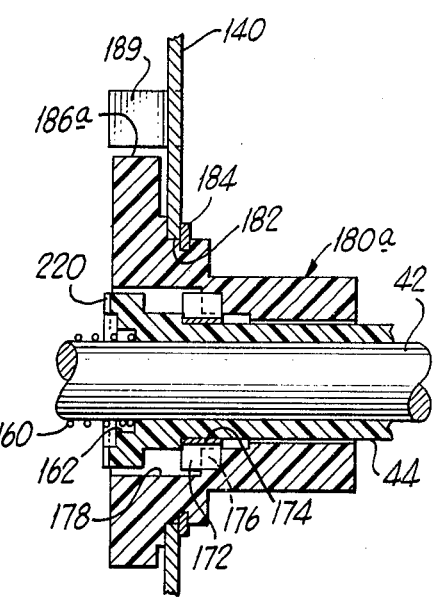
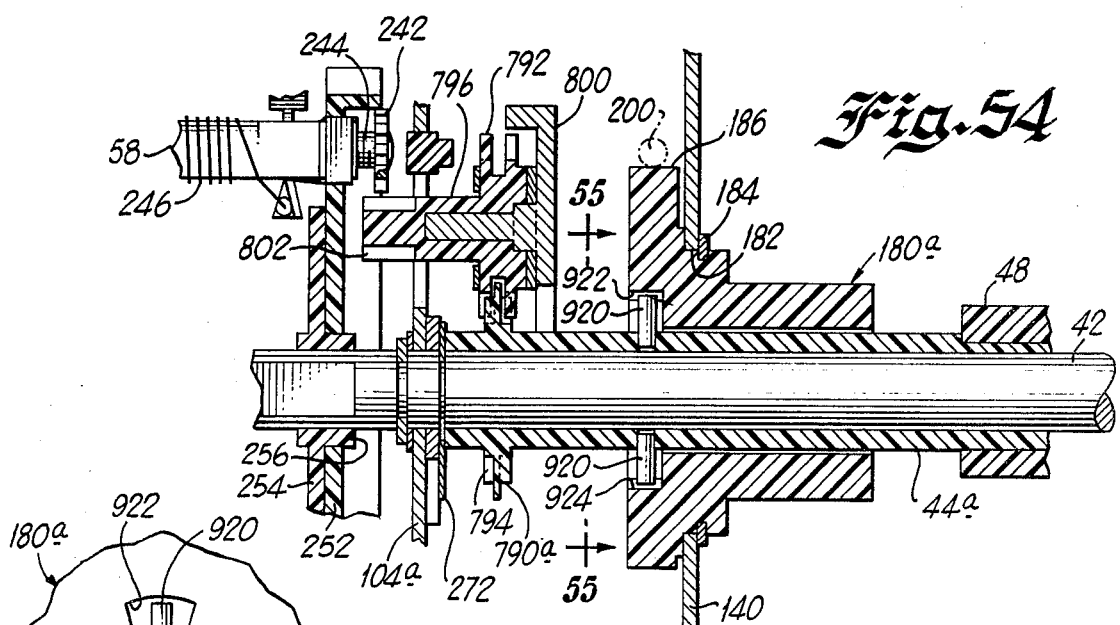
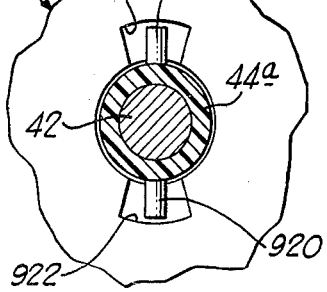

COMBINATION VHF AND UHF TUNER ARRANGEMENT

This is a continuation of application Ser. No. 776,890 filed Mar. 11, 1977, now abandoned.

The present invention relates to combination VHF and UHF tuner arrangements, and more particularly, to combination VHF and UHF tuner arrangements of the type which employ a common selector shaft for selection of both VHF and UHF stations.

In the early 1950's the FCC allocated the frequency band of 470 to 890 mc. to UHF television broadcasting. Shortly thereafter a tuner arrangement was disclosed in Krepps U.S. Pat. No. 2,665,377, which patent is assigned to the same assignee as the present invention, which provided for UHF reception in a so-called channel 1 or UHF position of a VHF tuner in which position an associated continuous UHF tuner was energized to receive UHF stations and the VHF tuner was used as an IF amplifier for the IF output of the UHF tuner.

While this arrangement permitted selection of any one of the seventy UHF stations it was necessary for the operator to first adjust the VHF tuner to the channel 1 position before a UHF station could be selected. Also, selection of a particular UHF station from amoung the seventy allocated stations was time consuming and tedious, particularly because the UHF dial was usually of the analog type in which all seventy stations were covered in one revolution of the dial and only every third or fifth UHF channel number was indicated on the dial. The net result of this additional burden in selecting UHF stations was to relegate the UHF broadcasting stations to an inferior and subservient status where they have remained to the present day. Further examples of VHF-UHF tuning systems which employ a continuous or non-detented type of UHF tuner are found in Sperber U.S. Pat. No. 2,756,599, Kostecki U.S. Pat. No. 2,886,700, Rieth U.S. Pat. No. 3,328,701, Silvey U.S. Pat. No. 2,997,582, Bidlack U.S. Pat. No. 3,364,753 and Badger et al U.S. Pat. No. 3,316,770.

During the next twenty years various arrangements were proposed to combine certain VHF and UHF functions in an effort to simplify the tuning operation and reduce the cost of the overall tuning system. One proposal was to incorporate in a turret type VHF tuner provision for receiving a few UHF stations by substituting so-calledl UHF tuning strips for several of the VHF tuning panels. An arrangement of this type is shown, for example, in Thias U.S. Pat. No. 2,975,276. This arrangement permitted reception of only a few UHF stations and required the set owner to purchase and install the correct UHF strips for his particular area of reception. Also, indication of the UHF stations selected had to be made by means of paste-on numbers, or the like, which were installed after the set was purchased. A somewhat similar arrangement is shown in Balash U.S. Pat. No. 2,798,955 in which a UHF turret, which surround the VHF tuner, was provided with twelve UHF strips to permit selection of twelve UHF stations, a thirteenth position on the UHF position being employed to control selection of VHF stations.

Another type of VHF-UHF tuning system was proposed in which selection of a UHF channel was made by manipulation of two concentric knobs in a decade type of channel selection. The associated VHF tuner was either employed during UHF reception in a double superheterodyne type of circuit or was disabled during UHF reception. Such decade arrangements are shown, for example, in Scandurra U.S. Pat. No. 2,785,297, Fisher Canadian Pat. No. 566,029, and Thias U.S. Pat. No. 2,773,988. While these decade arrangements permitted more rapid selection of UHF stations, the complex circuitry and tuning, as well as the switching required between UHF and VHF stations, made these arrangements unsatisfactory from a commercial standpoint.

With the advent of preset or memory type UHF tuners, a number of proposals were made to permit reception of a few selectable UHF stations which required no fine tuning in conjunction with an associated VHF tuner provided with a UHF position for enabling the preset UHF tuner. Examples of this type of VHF-UHF tuning system are shown in Brand et al U.S. Pat. No. 3,179,907, Dotto U.S. Pat. No. 3,196,695, Dickinson et al U.S. Pat. No. 3,234,490 and Schwartz U.S. Pat. No. 3,513,418. In Frey U.S. Pat. No. 2,922,881 a common input shaft is employed to select the twelve VHF stations and twelve UHF stations, the UHF stations being selected by first selecting a predetermined group of UHF stations by manipulation of one shaft and then selecting a desired UHF station within the selected group by manipulation of another shaft. In Weigel U.S. Pat. No. 3,757,227, also assigned to the same assignee as the present invention, a similar arrangement is employed but the twelve VHF positions are alternated with the twelve UHF positions and a preset memory arrangement is provided for the twelve selected UHF stations. In both the Frey and Weigel U.S. patents it is only possible to select a maximum of twelve UHF stations at any given time without adjustment of the memory screws.

In February of 1970 the FCC issued a ruling requiring that similar types of tuners be used to receive both UHF and VHF stations in a given television set. Since all of the VHF tuners then employed a detent position for each VHF station, this ruling meant that all subsequent UHF tuners be provided with a separate detent position for each of the seventy UHF stations. Following this ruling by the FCC a seventy position detented UHF tuner was disclosed in Valdettaro U.S. Pat. No. 3,842,683, which is assigned to the same assignee as the present invention. This Valdettaro patent provided a big step forward in meeting the FCC's requirements regarding comparability of VHF and UHF reception because it provided a UHF tuner with the feel and detent spacing comparable to a VHF tuner and a non-ambiguous digital readout in which the channel number of each UHF station was displayed. However, Valdettaro U.S. Pat. No. 3,842,683 makes no provision for VHF reception and subsequent VHF-UHF tuner arrangements which employ seventy position detent UHF tuners have in the main simply used separate tuners, control knobs and dial indicators for VHF and UHF reception. In these arrangements, the VHF knob must be turned to the channel 1 position in order to permit UHF reception and the master-slave subservient status of the UHF stations, which was introduced twenty-five years ago in Krepps U.S. Pat. No. 2,665,377 is maintained to this day.

In many of these present day arrangements separate dial lights are provided to indicate whether VHF or UHF stations are being received. These dial lights and attendant switching circuitry, together with the duplication in selector shafts, knobs and dial indicators, substantially increase the cost of VHF-UHF tuning systems in use today.

While some VHF-UHF arrangements have been proposed using varactor type UHF tuners and common channel number displays, these arrangements are in general considerably more expensive and are used only in higher priced television sets. The varactor diodes used to tune such UHF tuners have lower Q, poorer tuning selectivity and require the use of an RF amplifier in the UHF tuner which itself introduces undesirable nonlinearity and cross modulation effects. The varactor diodes are also more sensitive to temperature and voltage effects and require more closely controlled temperature compensation and well-regulated voltage supplies. Also, these varactor type VHF-UHF tuner arrangements generally permit the selection of only a few UHF stations at any given time, in contradistinction to the mechanically-driven seventy-position detent UHF tuner such as in Valdettaro U.S. Pat. No. 3,842,683. Examples of such varactor type VHF-UHF arrangements are shown in Ono U.S. Pat. No. 3,678,421, Schmidt U.S. Pat. No. 3,811,100 and Speer U.S. Pat. No. 3,824,507.

Only one prior art arrangement has attempted to simplify the VHF-UHF tuning combination while employing a seventy-position detent UHF tuner. This arrangement is shown in Weigel U.S. Pat. No. 3,973,229 which is also assigned to the same assignee as the present invention. In this patent an additional range of rotation is built into the tuning shaft of the UHF tuner, so as to permit a common selector shaft to be rotated an additional twelve detent positions to cover the twelve VHF stations. While this arrangement is suitable for its intended purpose, it is mechanically complex due to the fact that the common selector must be mechanically shifted from control of the VHF tuner to control of the UHF at the thirteenth detent position. This changeover involves critical timing of gears, expensive parts and more frequent inspection of parts in production. Furthermore, the torque and feel of the common selector shaft is different for VHF and UHF reception and the changeover from one band to the other is not smooth. Also, and most importantly, the tuning arrangement of Weigel U.S. Pat. No. 3,973,229 has the disadvantage that many turns of the common selector shaft may be required to change from a UHF station to a VHF or vice versa. If a high numbered UHF station is being received, for example channel 69, and it is desired to receive a VHF station, the common selector shaft must be rotated over six turns to receive one of the VHF stations.

It is, therefore, an object of the present invention to provide a new and improved VHF-UHF combination tuning system which avoids one or more of the above-discussed disadvantages of prior art arrangements.

It is another object of the present invention to provide a new and improved VHF-UHF tuning system wherein seventy detent positions are assigned to the seventy UHF stations and the twelve VHF statins are repeated in detent positions interspersed with the seventy UHF detent positions.

It is a further object of the present invention to provide a new and improved VHF-UHF tuning system wherein a common selector shaft is provided having individual detent positions for each of the seventy UHF stations in the UHF band and all of the twelve VHF stations may be selected by rotating said common selector shaft less than one revolution from any one of said seventy individual UHF detent positions.

It is another object of the present invention to provide a new and improved VHF-UHF tuning system wherein a common selector shaft is provided having individual detent positions for each of the seventy UHF stations in the UHF band and selection of all twelve VHF stations and two or more UHF stations which are spaced less than twelve UHF channels apart may be selected by rotating said common selector shaft one revolution.

It is a further object of the present invention to provide a new and improved VHF-UHF tuning system wherein individual detent positions are provided for each of the seventy UHF stations in the UHF band and detent positions for the twelve VHF stations are repeatedly interspersed with different groups of UHF stations within said UHF band.

It is another object of the present invention to provide a new and improved VHF-UHF tuning system wherein a common selector shaft is provided having twenty-four equally spaced detent positions, means operative in alternate ones of said detent positions to receive different ones of the twelve VHF stations, and means operative in the detent positions between said alternate positions to receive individual UHF stations, the groups of UHF stations received in said UHF detent positions being different for successive rotations of said common selector shaft.

It is still another object of the invention to provide a new and improved VHF-UHF tuning system wherein a common viewing station is provided for both VHF and UHF stations and facilities are provided for displaying at said common viewing station the channel number assigned to each of the seventy UHF stations in the UHF band in alternate detent positions and repeatedly displaying at said common viewing station the channel numbers assigned to the twelve VHF stations in the detent positions between said alternate positions.

It is another object of the present invention to provide a new and improved VHF-UHF tuning system wherein a common selector shaft is provided rotation of which is effective to receive VHF and UHF stations in a predetermined sequence in which the twelve VHF stations are repeatedly received and the seventy UHF stations are received only once, said sequence being carried out by rotating said selector shaft a plurality of revolutions.

It is another object of the present invention to provide a new and improved VHF-UHF tuning system wherein a common selector shaft is provided which is sequentially movable into one hundred forty detent positions, VHF tuner means operative in alternate ones of said detent positions repeatedly to receive the twelve VHF stations in the VHF band, and UHF tuner means operative in the detent positions between said alternate positions to receive in succession the seventy UHF stations in the UHF band.

It is a further object of the present invention to provide a new and improved VHF-UHF tuning system wherein a combined VHF-UHF channel indicator is provided which includes an elongated strip of material bearing channel numbers corresponding to each of the seventy UHF television stations and a plurality of groups of VHF channel numbers, the VHF channel numbers in each group corresponding to the twelve VHF television stations, and control means for moving said strip of material in relation to a fixed viewing area.

It is another object of the present invention to provide a new and improved VHF-UHF tuning system wherein said UHF channel numbers are positioned in one area extending along the length of said elongated strip and said groups of VHF channel numbers are positioned in a second area extending along the length of said elongated strip and laterally displaced from said first area.

It is a further object of the present invention to provide a new and improved VHF-UHF tuning system wherein a common selector shaft is provided having individual detent positions for each of the seventy UHF stations in the UHF band and detent positions for the twelve VHF stations which are repeatedly interspersed with different groups of UHF stations within said UHF band and wherein a common fine tuning shaft concentric with said selector shaft is provided for fine tuning either a VHF station or a UHF station.

It is a still further object of the present invention to provide a new and improved VHF-UHF tuning system wherein said common fine tuning shaft is arranged to fine tune a UHF station when in a forward position or a VHF station when in a rear position.

It is another object of the present invention to provide a new and improved VHF-UHF tuning system wherein said common fine tuning shaft is ineffective to tune VHF stations when in said forward position and is ineffective to tune UHF stations when in said rear position.

It is a further object of the present invention to provide a new and improved VHF-UHF tuning system wherein said UHF fine tuning function is accomplished by electronic means when said common fine tuning shaft is rotated while in said forward position.

It is another object of the present invention to provide a new and improved VHF-UHF tuning system wherein said common fine tuning shaft is ineffective to fine tune either a VHF station or a UHF station when in a forward position and is effective when in a rear position to fine tune either a VHF station or a UHF station depending upon the detent position of said common selector shaft.

It is a further object of the present invention to provide a new and improved VHF-UHF tuning system wherein a common selector shaft is provided having individual detent positions for each of the seventy UHF stations in the UHF band and detent positions for the twelve VHF stations which are repeatedly interspersed with different groups of UHF stations within said UHF band and wherein separate fine tuning shafts concentric with said selector shaft are provided for independently fine tuning either a VHF station or a UHF station as determined by the detent position of said common selector shaft.

It is another object of the present invention to provide a new and improved VHF-UHF tuning system wherein said separate fine tuning shafts comprise a UHF fine tuning shaft positioned inside said selector shaft and a VHF fine tuning shaft positioned outside said selector shaft.

It is a further object of the present invention to provide a new and improved VHF-UHF tuning system wherein a common selector shaft is provided having individual detent positions for each of the seventy UHF stations in the UHF band and detent positions for the twelve VHF stations which are repeatedly interspersed with different groups of UHF stations within said UHF band and wherein UHF memory fine tuning facilities are provided in the UHF detent positions of said selector shaft.

It is a still further object of the present invention to provide a new and improved VHF-UHF tuning system wherein said UHF memory fine tuning facilities include a plurality of individually adjustable members each of which is assigned to several widely spaced-apart UHF stations as said selector shaft is rotated to cover the entire UHF band.

Briefly, in accordance with the invention, a combination VHF and UHF tuner is provided in which a common station selector shaft may be rotated a number of revolutions to cover the seventy stations in the UHF band. The common selector shaft is provided with twenty-four detent positions per revolution and in alternate positions of the shaft the twelve VHF stations in the VHF band are received. As the common selector shaft is rotated through several revolutions the VHF stations are repeatedly received but are interspersed with different individual stations in the UHF band. Accordingly, no matter what UHF station is being received, all of the VHF stations are always within one turn of the common selector shaft. In many mixed UHF-VHF reception areas a single turn of the common selector shaft is sufficient to select all of the UHF stations as well as all of the VHF stations which are broadcasting in that area. Also, any UHF station anywhere in the UHF band is selected with the same ease of selection as the interspersed VHF stations so that true comparability between VHF and UHF reception is achieved.

A single readout window is provided which displays alternately and sequentially each individual channel number, whether UHF or VHF, in numerals of identical size and legibility. A common fine tuning shaft for both UHF and VHF is provided concentric with the common station selector shaft. VHF fine tuning may be either of the memory or nonmemory type. UHF fine tuning is accomplished with smooth and vernier feel and gradual picture control. Also, the UHF fine tuning function is separated from the common selector shaft so that problems of "creep" in clutch type 70 detent UHF tuners are eliminated.

The invention, both as to its organization and method of operation, together with further objects and advantages thereof, will best be understood by reference to the following specification taken in connection with the accompanying drawings in which:

FIG. 1 is a side elevational view of a combination VHF-UHF tuning system embodying the features of the present invention with a portion of the cover of the UHF tuner portion thereof broken away;

FIG. 2 is a plan view of the combination tuner of FIG. 1 with a portion of one wall of the VHF tuner thereof broken away;

FIG. 3 is a sectional view taken along the line 3—3 of FIG. 2 and illustrating the display of a VHF channel number in a common viewing area;

FIG. 4 is a view similar to FIG. 3 but illustrating the display of a UHF channel number in the common viewing position;

FIG. 7 is a sectional view taken along the line 7—7 of FIG. 5;

FIG. 8 is a fragmentary sectional view taken along the line 8—8 of FIG. 7;

FIG. 9 is a sectional view taken along the line 9—9 of FIG. 1;

FIG. 10 is a sectional view taken along the line 10—10 of FIG. 2;

FIG. 11 is a view similar to FIG. 10 but showing the VHF fine tuning mechanism in a VHF fine tuning adjustment position;

FIG. 12 is a perspective view of the common fine tuning shaft of the tuner of FIG. 1;

FIG. 13 is a sectional view taken along the lines 13—13 of FIG. 1;

FIG. 14 is a fragmentary sectional view taken along the line 14—14 of FIG. 13;

FIG. 15 is a fragmentary sectional view taken along the line 15—15 of FIG. 14;

FIG. 16 is a sectional view taken along the line 16—16 of FIG. 14;

FIG. 18 is a front elevational view of the indicator strip employed in the tuner of FIG. 1;

FIG. 19 is a schematic diagram showing the electronic circuitry of the VHF and UHF tuner portions of the tuner of FIG. 1;

FIG. 20 is a schematic diagram of an alternative VHF-UHF switching arrangement for the tuner of FIG. 1;

FIG. 21 is a schematic diagram of a further alternative VHF-UHF switching arrangement for the tuner of FIG. 1;

Figure 29:
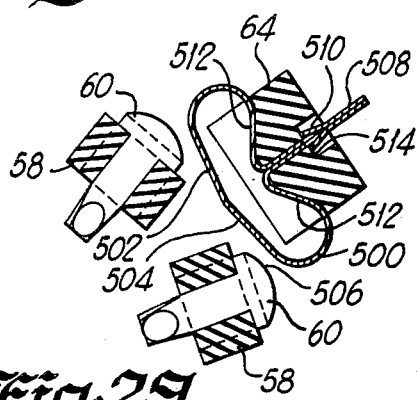
Figure 30:
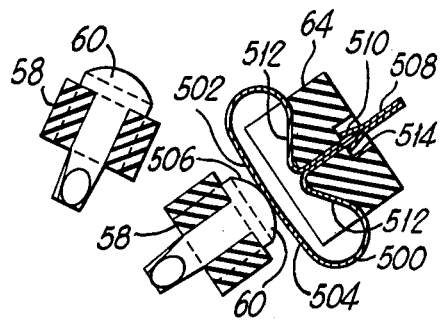
Figure 31:
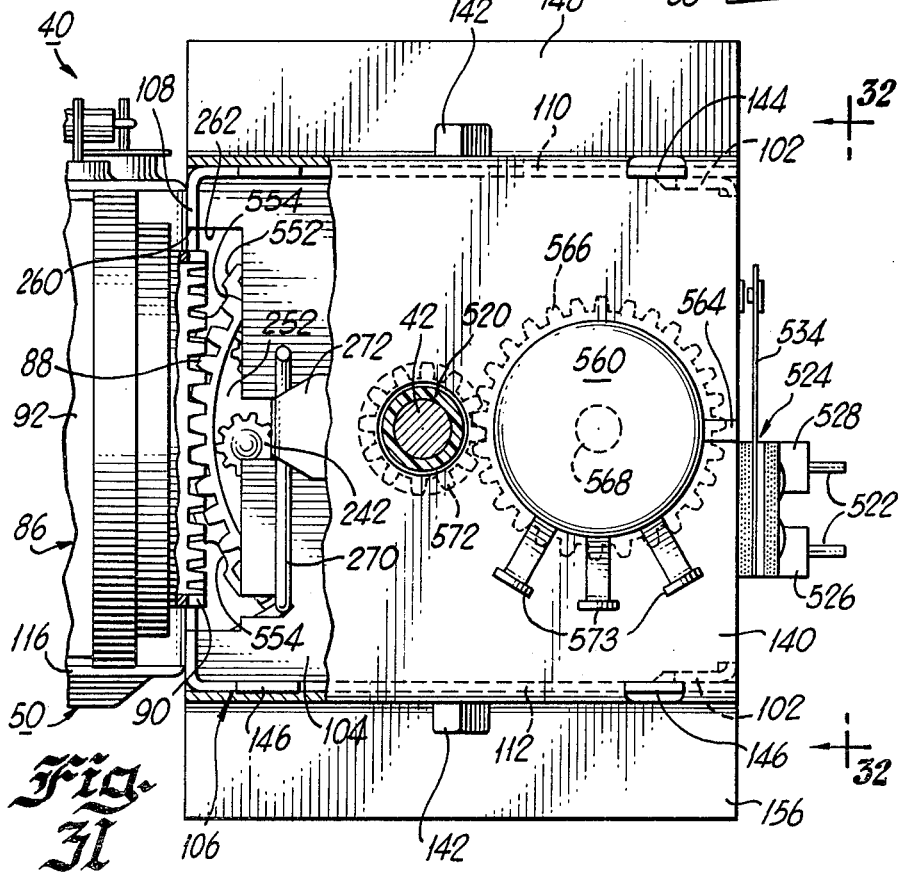

FIGS. 23 to 28, inclusive, are schematic diagrams of other alternative VHF-UHF switching arrangements for the tuner of FIG. 1;

FIG. 29 is a fragmentary sectional view of an alternative stator contact arrangement shown with the turret in a UHF position;

FIG. 30 is a view similar to FIG. 29 but with the turret in a VHF position;

FIG. 31 is a front elevational view of an alternative embodiment of the invention which employs electronic fine tuning for UHF reception;

FIG. 32 is a sectional view taken along the line 32—32 of FIG. 31;

FIG. 33 is a sectional view taken along the line 33—33 of FIG. 32;

FIG. 34 is a sectional view taken along the line 34—34 of FIG. 33;

FIG. 35 is a view similar to FIG. 34 but with the fine tuning member shown in a VHF fine tuning position;

FIG. 36 is a perspective view of the dual function AFC defeat switch arrangement of the embodiment of FIG. 31;

FIG. 37 is a fragmentary sectional view taken along the center line of the common selector shaft, of a further alternative embodiment of the invention wherein UHF fine tuning is effected by rotation of the main tuning shaft of the UHF tuner;

FIG. 38 is a schematic diagram of an alternative VHF tuner arrangement which may be used in the system of FIG. 1;

FIG. 39 is a top plan view of an alternative embodiment of the VHF-UHF tuning system of the present invention wherein a separate centrally located fine tuning shaft for UHF is provided;

FIG. 40 is a sectional view taken along the line 40—40 of FIG. 39;

FIG. 41 is a sectional view taken along the line 41—41 of FIG. 40;

FIG. 42 is a sectional view taken along the line 42—42 of FIG. 39;

FIG. 43 is a sectional view taken along the line 43—43 of FIG. 42;

FIG. 44 is a fragmentary sectional view taken along the line 44—44 of FIG. 39; FIG. 45 is a front elevational view of an alternative VHF-UHF tuning system of the present invention which is similar to the embodiment of FIGS. 1 to 19, inclusive, but wherein a memory fine tuning arrangement is provided for UHF stations;

FIG. 46 is a sectional view taken along the line 46—46 of FIG. 45;

FIG. 47 is a sectional view taken along the lines 47—47 of FIG. 45;

FIG. 48 is a fragmentary sectional view taken along the line 48—48 of FIG. 47;

FIG. 49 is a fragmentary sectional view similar to FIG. 47 but showing the memory wheel in a VHF position of the common selector shaft;

FIG. 50 is a fragmentary sectional view taken along the line 50—50 of FIG. 49;

FIG. 51 is a fragmentary sectional view taken along the line 51—51 of FIG. 47;

FIG. 52 is a front elevational view of a modification of the embodiment of FIGS. 1 to 19, inclusive, wherein the UHF cam member is provided with stops;

FIG. 53 is a sectional view taken along the line 53—53 of FIGS. 52;

FIG. 54 is a sectional view similar to FIG. 10 of an alternative embodiment of the invention wherein a fine tuning operation is performed solely in response to rotation of a common fine tuning knob for both VHF and UHF stations; and FIG. 55 is a sectional view taken along the line 55—55 of FIG. 54.

Referring now to the drawings, and more particularly to FIGS. 1 to 19 thereof, inclusive, the present invention is therein illustrated as comprising a unified, combination VHF-UHF tuning system indicated generally at 40, this tuning system having a common main selector shaft 42 and a concentric outer fine tuning sleeve 44 which may be employed for both VHF and UHF fine tuning operations. A combined VHF-UHF station selector knob 46 is secured to the flattened end portion of the selector shaft 42 and a concentric outer fine tuning knob 48 is secured to the flattened end portion of the fine tuning sleeve 44.

The tuning system 40 includes a UHF tuner portion indicated generally at 50 and a VHF tuner portion indicated generally at 52. The VHF tuner 52 is of the turret type and includes a pair of transverse supporting discs 54 and 56 which are secured to the selector shaft 42 and support a plurality of individual tuning panels or sticks 58 about the periphery thereof. As the selector shaft 42 is rotated the contact members 60 of a particular one of the tuning sticks 58 are moved into engagement with corresponding stator contacts 62 provided on a stationary stator bar indicated generally at 64 so as to connect tuning coils, which are wound about the periphery of the tuning stick 58 and connected to the contact members 60, into operative engagement with the various tuning circuits such as the RF amplifier, mixer and oscillator circuits of the VHF tuner, as will be readily understood by those skilled in the art.

In general, the VHF tuner portion 52 is similar to the turret type tuner shown in Krepps, Jr. et al U.S. Pat. No. 3,227,981 which is assigned to the same assignee as the present invention, and reference may be had to said Krepps, Jr. et al patent for a detailed description of a turret tuner of this general type. However, the VHF tuner portion 52 includes certain features necessary to the VHF-UHF tuning system of the present invention, as will be described in more detail hereinafter.

In accordance with an important aspect of the present invention, the selector shaft 42, which acts as the conventional VHF tuning selector shaft, is also employed as the input shaft for 70-position detent operation of the associated UHF tuner 50. To this end the selector shaft 42 is provided with twenty-four equally-spaced detent positions by means of the detent wheel 66 which is secured to the shaft 42 behind the rear wall 68 of the VHF tuner chassis 70. The shaft 42 is interconnected with the main tuning shaft 72 of the UHF tuner portion by means of a high step-down ratio gear train. More particularly, a small spur gear 74 is secured to the end of the shaft 42 and engages a gear 76 which is rotatably mounted on a fixed post 78. A small-diameter gear 80, formed integrally with the gear 76, engages a large-diameter gear 82 which is secured to the main tuning shaft 72 of the UHF tuner 50.

Since only twelve tuning sticks 58 are provided on the VHF turret corresponding to the twelve VHF stations, in alternate ones of the twenty-four detent positions established by the detent wheel 66 the VHF tuning sticks 58 are selectively connected to the stator contacts of the stator 64, so as to permit reception of VHF stations in these alternate detent positions, and all of the tuning sticks 58 are disconnected from the stator contacts in the twelve intermediate positions between said alternate positions. In these twelve intermediate positions the UHF tuner 50 is energized to receive a UHF station, by means to be described in more detail hereinafter, and the I.F. output signal developed by the UHF tuner 50 is amplified in the VHF tuner portion 52 which is operated as an I.F. amplifier for UHF reception. However, if only a single revolution of the common selector shaft were employed for VHF-UHF reception, only twelve UHF stations could be selected. In accordance with an important aspect of the invention the UHF band is covered by rotating the selector shaft 42 a plurality of revolutions and during each of these revolutions the VHF stations are repeatedly received in sequence as the shaft 42 is rotated. Also, a strip type dial indicator indicated generally at 86 is directly connected to the common selector shaft 42, by means of a gear 88 which is carried by and secured to the selector shaft 42 and engages a crown gear 90 on the strip type dial indicator 86, so that the indicator strip 92 of the indicator 86 is advanced one increment for each detent position of the selector shaft 42. In the embodiment illustrated in FIGS. 1 to 19, inclusive, the UHF channel numbers are provided in one area extending along the length of the strip 92 (FIG. 18) and the VHF channel numbers are repeated in sequence in an area extending along the length of the strip 92 and spaced laterally from the UHF channel numbers. As best illustrated in FIG. 18, the VHF and UHF channel numbers are staggered along the length of the tape so that only one channel number, either a VHF channel number or a UHF channel number, can be viewed at a time. More particularly, the front panel 94 of the television cabinet is provided with a viewing window 96 within which the VHF and UHF channel numbers on the strip 92 are alternately displayed. When the common selector shaft 42 is in one of the twelve alternate detent positions assigned to VHF stations the corresponding VHF channel number appears in the left-hand portion of the viewing area 96, as shown in FIG. 3. When the selector shaft 42 is in the positions between the alternate VHF positions the UHF channel number assigned to the UHF station being received by the tuner 50 is displayed in the right-hand portion of the viewing window 96, as shown in FIG. 4.

Since the twelve VHF channels are repeatedly interspersed with different groups of the seventy UHF channels and the corresponding sequence of VHF and UHF channel numbers is displayed in the common viewing area 96, the operator may tune the combined VHF-UHF tuning system of the present invention to a particular UHF station which is receivable in his area and may then select any one of the twelve VHF stations by rotating the common selector knob 46 less than one revolution. This is because the VHF stations are repeatedly interspersed with different groups of twlve UHF stations throughout the UHF band. Also, in many reception areas where the receivable UHF stations are within twelve UHF channels of each other, all of the VHF and UHF channels receivable in that area may be selected by rotating the selector knob 46 only one revolution because full coverage of the VHF band is repeated for each revolution of the common selector shaft 42. Furthermore, the changeover from VHF to UHF reception is entirely automatic and is accomplished without requiring the operator to adjust any auxiliary shafts to accomplish the VHF-UHF changeover. Accordingly, the same ease of operation long enjoyed by VHF channel viewers is made possible for UHF channel viewers as well, in accordance with the present invention. In this connection it will be understood that while the tuning system 40 of the present invention is arranged to receive VHF and UHF channels in alternate detent positions, if no UHF channels are viewable in a particular area the operator simply ignores the UHF channel numbers in the viewing area 96 and selects successive VHF channels which are each two detent positions apart. Since these VHF detent positions are spaced thirty degrees apart, selection of VHF channels is quite comparable to the selection of VHF channels with a conventional VHF only tuner and selection of all twelve VHF channels is accomplished during any one revolution of the selector knob 46. This VHF only type of operation is facilitated by providing the VHF channel numbers within one area of the viewing window 96 and the UHF channel numbers in a different area of this window as shown in FIGS. 3 and 4 and described heretofore. However, it will be understood that the VHF channel numbers may be positioned in line with the UHF channel numbers and interspersed therebetween, if desired. This latter arrangement has the advantage that the film strip 92 is of somewhat smaller width for the same size channel numbers. However, with this alternative arrangement the VHF and UHF channel numbers serially appear in the same viewing area as the knob 46 is rotated. It will be understood that various other display arrangements may be provided in accordance with the present invention. For example, the filmstrip 92 may have a black background with transparent numbers for both VHF and UHF channels. If a relatively wide filmstrip 92 is employed, as shown in FIG. 18, and the VHF and UHF numbers are transparent with a suitably contrasting film background around the numbers, the two viewing areas for VHF and UHF channels may then be of different colors, by using different background colors in these areas or by other suitable multicolor lighting arrangements, the VHF channel numbers appear in red and the UHF channel numbers appear in green; for example, a further distinction between VHF and UHF reception is provided for the operator. In the alternative, the VHF channel numbers can be printed on the filmstrip in a different color from the UHF channel numbers to provide the same effect.

When a relatively narrow filmstrip is employed and the VHF and UHF channel numbers are positioned in line along the length of the strip, as described above, it is even more important to have the VHF channel numbers of a different color than the UHF channel numbers to facilitate distinction between the two types of reception since these numbers are successively viewed in the same viewing area. However, transparent numbers and different-colored backgrounds cannot be used because the numbers are successively viewed in the same area. With a narrow filmstrip colored VHF and UHF channel numbers may be printed or otherwise provided on the strip with a suitable background, such as white or black on the strip. In the alternative, any suitable lighting arrangement may be employed to provide the best contrast for both colors of channel numbers when these colors are viewed in the same viewing area.

As a further alternative, the narrow strip may comprise a length of film in which differently-colored VHF and UHF channel numbers are provided by photographically exposing the film to a suitably colored master print or film and then developing the film. The colored numbers on the developed film may then be illuminated by means of a suitable light source within the indicator 86, as described in detail in Valdettaro U.S. Pat. No. 3,916,820. In such an arrangement the differently colored VHF and UHF channel numbers are viewed in the same manner as conventional slides which are adapted for direct viewing, i.e. Kodachrome ® film slides, or the like, or transparencies, the different colors again promoting distinction between VHF and UHF channel numbers. In such a developed filmstrip arrangement the background may be either light or dark, depending on the best contrast ratio which is obtainable when the film is viewed as a transparent slide, as will be readily understood by those skilled in the art.

Considering now in more detail the mechanical aspects of the VHF-UHF tuning system of the present invention, the VHF tuner chassis 70 comprises a top deck portion 100, having the depending side flanges 102 associated therewith, a front wall 104 and the rear wall 68 described heretofore. A U-shaped main frame indicated generally at 106, which includes a side wall portion 108, top wall 110 and bottom wall 112 cooperates with the U-shaped VHF tuner chassis 70 provide a housing for the VHF turret which is mounted on the selector shaft 42 and includes the tuning sticks 58.

More particularly the flange portions 102 of the chassis 70 are secured to the top and bottom walls 110 and 112 of the U-shaped main frame 106 by means of the bolts 114 to provide a rugged box-like construction which houses the VHF turret.

The UHF tuning portion 50 includes a cup-shaped main housing 116 and a cooperating sheet metal cover 118 which is secured over the opening of the housing 116 to provide a shielded enclosure for the UHF tuning components. The housing 116 is secured to the wall 108 of the U-shaped main frame 106 by means of the bolts 119 so that the main rotor shaft 72 of the UHF tuner is accurately registered with respect to the common selector shaft 42 through the main frame 110 to which the VHF tuner chassis 70 is connected.

In order to permit servicing and repair of parts within the VHF tuner portion 52, the top and bottom walls 110 and 112 are provided with openings 120 and 122 respectively which are normally closed by means of sliding covers 124 and 126 which ride on flanges 128 and 130 formed out of the top and bottom walls 110 and 112 respectively. The covers 124 and 126 may be removed by sliding them off of the flanges 128, 130, i.e. by movements of the rear of the tuner, to permit access to the interior of the VHF tuner portion 52.

In order to mount the strip dial indicator 86 in proper relation to the driving gear 88 on the selector shaft 42, a bracket 132 is secured to the wall 108 of the U-shaped main frame 106 by any suitable means such as welding, brazing or the like, and the circular housing 134 (FIG. 1) of the strip type dial indicator 86 is secured to the bracket 132 by means of the screw 136 and nut 138. In this connection it is pointed out that the strip type dial indicator 86 may be of the type shown and described in Valdettaro U.S. Pat. No. 3,916,820 and hence a detailed description thereof in connection with the present invention is considered unnecessary herein, it being pointed out that the strip type dial indicator 86 is of substantially greater width when employing combined VHF and UHF channel numbers in the manner described in detail heretofore in connection with FIGS. 2, 3, 4 and 18.

As best illustrated in FIG. 1, a generally U-shaped front bracket 140 is secured to the top and bottom walls 110, 112 of the U-shaped main frame 106 by means of the screws 142, the walls 110, 112 being provided with forwardly extending lug portions 144 and 146, respectively, which extend through openings in the U-shaped bracket 140 and locate the same relative to the main frame 106. An outwardly extending flange portion 148 of the bracket 140 is also employed to mount a bracket 150, which is secured to the flange 148 by means of the screw 152, the bracket 150 supporting an AFC interchannel defeat switch assembly indicated generally at 154 which will be described in more detail hereinafter.

The flange 148 and an outwardly extending flange 156 on the other side of the bracket 140 may be used to mount the tuning assembly 40 on the main television receiver chassis so that the numbers on the strip dial indicator 86 are suitably registered with the viewing window 96 in the front panel 94 of the television cabinet. In the alternative, any other suitable means may be employed to mount the tuning system 40 on the main television receiver chassis, as will be readily understood by those skilled in the art.

In order to provide an arrangement whereby the fine tuning sleeve 44 may be used for both VHF and UHF fine tuning operations, the sleeve 44 is slidably mounted on the selector shaft 42 and is biased to a forward position by means of a coil spring 160 one end of which is positioned in a recess 162 formed in the rear end of the sleeve 44. The other end of the coil spring 160 is seated in a forwardly opening recess 164 provided in a sleeve 166 which is also mounted on the shaft 42 and acts as a fulcrum for a pivotally mounted cupshaped fine tuning member 168 provided with gear teeth 170 about the periphery of the open rearward end of the cup 168. When the sleeve 44 is biased to the forward position by the coil spring 160, as shown in FIG. 10, gear teeth 172 on the sleeve 44 engage a series of gear teeth 176 which are formed in the bottom of a rearwardly opening recess 178 in a UHF fine tuning cam member 180 which is journaled within an opening 182 in the front bracket 140 by means of a C washer 184. The gear teeth 172 may be formed integrally with the sleeve 44 or as in the illustrated embodiment may comprise a metal sleeve 174 which is secured to the sleeve 44. When the fine tuning knob 48 is in its outermost position with the gear teeth 172 in engagement with the gear teeth 176, rotation of this knob causes rotation of the UHF cam member 180.

Figure 5:
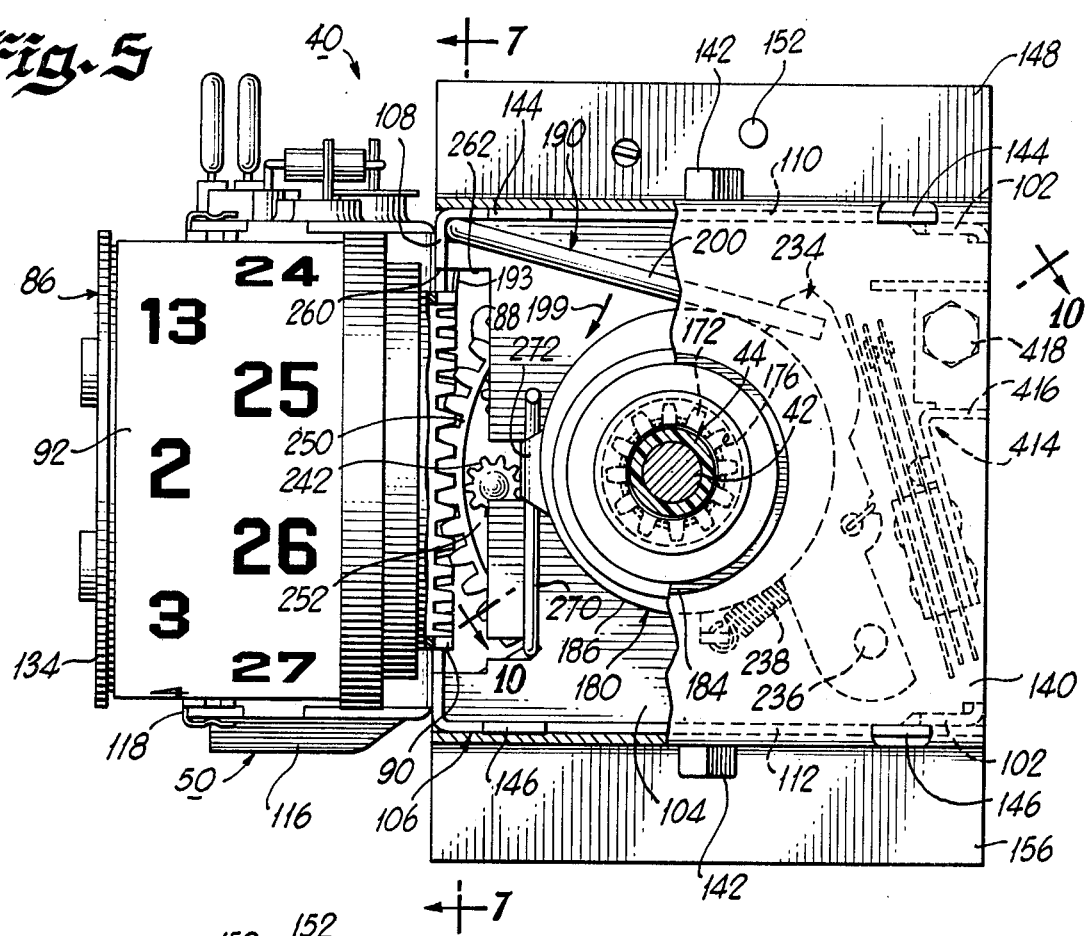
FIG. 5 is a front view of the combination tuner of FIG. 1 with a portion of the front wall thereof broken away.

The UHF fine tuning cam member 180 is provided with a peripheral cam surface 186 which is eccentric with respect to the axis of the common selector shaft 42. A UHF fine tuning member in the form of a brass rod indicated generally at 190 in FIG. 5, is provided with an intermediate portion 192 (FIG. 2) which is held against the corner or trough formed by the walls 108 and 110 of the main U-shaped frame 106 by means of a flat spring 193. More particularly and as best illustrated in FIGS. 7 and 8, the intermediate portion 192 of the tuning rod 190 is provided with a V-shaped projecting portion 194 and the flat spring 193 is provided with an elongated opening 196 therein the edges of which bear upon the outer sloping edges of the V-shaped portion 194. The spring 193 is secured to the wall 108 of the frame 106 by means of the screws 198.

The forward end of the UHF fine tuning rod 190 terminates in a right-angle end portion 200 which rides upon the peripheral cam surface 186 of the UHF fine tuning cam member 180, as best illustrated in FIGS. 1 and 2. The rod 190 is also provided with a right-angle portion 202 at the other end of the intermediate portion 192 which terminates in a hook-shaped end portion 204 which extends at right angles to the portion 202, as best illustrated in FIG. 9. The hook-shaped end portion 204 extends through an opening 206 in the wall 108 of the U-shaped main frame 106 and through an opening 208 in the UHF tuner housing 116 so that the free end portion of the hook 204 may be moved into and withdrawn from an oscillator coil 210 in the oscillator compartment 212 of the UHF tuner 50. Since the flat spring 193 engages the V-shaped portion 194 of the tuning rod 190 at a point offset from the axis of the longitudinally extending intermediate portion 192 of the rod 190, a biasing force is exerted on the right-angle end portion 200 so that this end portion is urged in the direction of the arrow 199 in FIG. 5 and is held against the peripheral cam surface 186 of the UHF fine tuning cam member 180. Accordingly, when the common fine tuning knob 48 is positioned in its outermost position and is rotated, the fine tuning cam 180 is rotated so that the tuning rod 190 is pivoted about the axis of the longitudinally extending intermediate portion 192 thereof with the result that the end portion 204 thereof is moved with respect to the oscillator tuning coil 210. Since the rod 190 is made of brass a UHF fine tuning function in connection with the UHF station being received is performed. The electrical details of the UHF oscillator circuit will be described hereinafter.

It will be noted that the tuning rod 190 is made of heavy stock as shown in the drawings, and is accurately located both longitudinally and radially by engagement of the edges of the opening 196 in the spring 193 with the portion 194 of the rod 190. Accordingly, the position of the rod 190 is determined by rotation of the cam member 180, is maintained between fine tuning operations and is unaffected by rotation of the common selector shaft 42 during VHF and UHF channel selection. Also, since the tuning rod 190 is used as a vernier adjustment the end 204 thereof may be arranged to effect a change of approximately 6 MHz for a travel of about 0.150 inches. With such an arrangement vibration and microphonics, which cause much smaller vibrations in the position of the end 204, do not deteriorate the operation of the UHF tuner 50.

Considering now the manner in which a VHF fine tuning function is performed by the common fine tuning knob 48, when this knob is moved rearwardly against the force of the coil spring 160 a VHF memory fine tuning operation is effected on the active one of the tuning sticks 58. In general, this VHF memory fine tuning operation is accomplished by an arrangement similar to that shown in Badger et al U.S. Pat. No. 3,316,770 and reference may be had to said Badger et al patent for a detailed description of such memory fine tuning mechanism. However, for the purposes of the present invention, it may be stated that when the tuning knob 48 is moved rearwardly against the force of the coil spring 160 an annular series of rearwardly projecting teeth 220 on the sleeve 44 are moved into engagement with a corresponding series of teeth 222 on the forward end of the cup-shaped member 168 as this member is tilted about the fulcrum 224 formed in the sleeve 166. As a result, the member 168 is moved to the position shown in FIG. 11 as the sleeve 44 is moved rearwardly and the teeth 220 engage with the teeth 222. As the member 168 is moved to the horizontal position shown in FIG. 11 the gear teeth 170 thereof are moved into engagement with gear teeth 226 which are formed in a pinion member 228 which is rotatably mounted on a post portion 230 formed in a pivotally mounted member 234 which is pivotally mounted on the post 236 (FIG. 5) mounted on the front wall 104 of the VHF tuner chassis 70. As the member 168 was pivoted to the position shown in FIG. 11 it moves the member 228 outwardly against the force of the coil spring 238 (FIG. 5) so that the gear teeth 240 formed in the pinion 228 but offset from the teeth 226 are moved into engagement with corresponding gear teeth 242 formed in the head of each tuning screw 244 which projects from the forward end of each tuning stick 58. Accordingly, when the fine tuning shaft is rotated while in its rearward position, the members 168 and 228 are also rotated so that the tuning screw 244 is moved with respect to the oscillator tuning coil 246 wound about the periphery of the tuning stick 58.

It will be noted that when the tuning sleeve 44 is moved to its rearward position during a VHF fine tuning operation the teeth 172 are moved out of engagement with the teeth 176 in the UHF cam member 180 so that the UHF fine tuning adjustment is not disturbed during the VHF fine tuning operation. However, as soon as pressure is removed from the fine tuning knob 48, coil spring 160 causes the sleeve 44 to move to its outward position shown in FIG. 10 in which position the teeth 220 are disengaged from the teeth 222 and the sleeve 44 is connected to the UHF fine tuning cam member 180.

The gear 88 which drives the dial indicator 86, is formed in the outer flange portion 250 of a disc 252 which is mounted on and is rotatable with the selector shaft 42. In the illustrated embodiment the disc 252 is secured to a second disc member 254 having a hub portion 256 which is formed with a double D opening to cooperate with the double D cross section of the selector shaft 24. If desired, the flange portion 250 of the disc 252 may be dimensioned to engage the gear teeth 242 of each tuning screw 244 so as to hold the tuning screws in their adjusted positions after a memory fine tuning operation has been made. In the alternative a conventional spring clip may be provided on each stick to hold the tuning screw 244 in adjusted position.

In order to permit engagement of the gear 88 with the crown gear 90 on the strip type dial indicator 86, the sidewall 108 of the main U-shaped frame 106 is provided with an opening 260 (FIG. 1) which provides clearance for the teeth of the crown gear 90. Also, the front wall 104 of the VHF tuner chassis 52 is provided with the opening 262 (FIG. 5) to provide clearance for the crown gear 90. It will be noted that by providing the above described clearance opening 260, 262 and employing a gear 88 of relatively large diameter which will mesh with the crown gear 90 of the dial indicator 86 which is external to the VHF chassis 70, an arrangement is provided whereby the dial indicator may be driven directly from the selector shaft 42 at a point behind the fine tuning mechanisms for effecting both UHF and VHF fine tuning, thereby substantially simplifying the dial indication of both VHF and UHF channels over prior arrangements wherein dial information is obtained through shafts which are concentric with the selector and fine tuning shafts.

Figure 6:
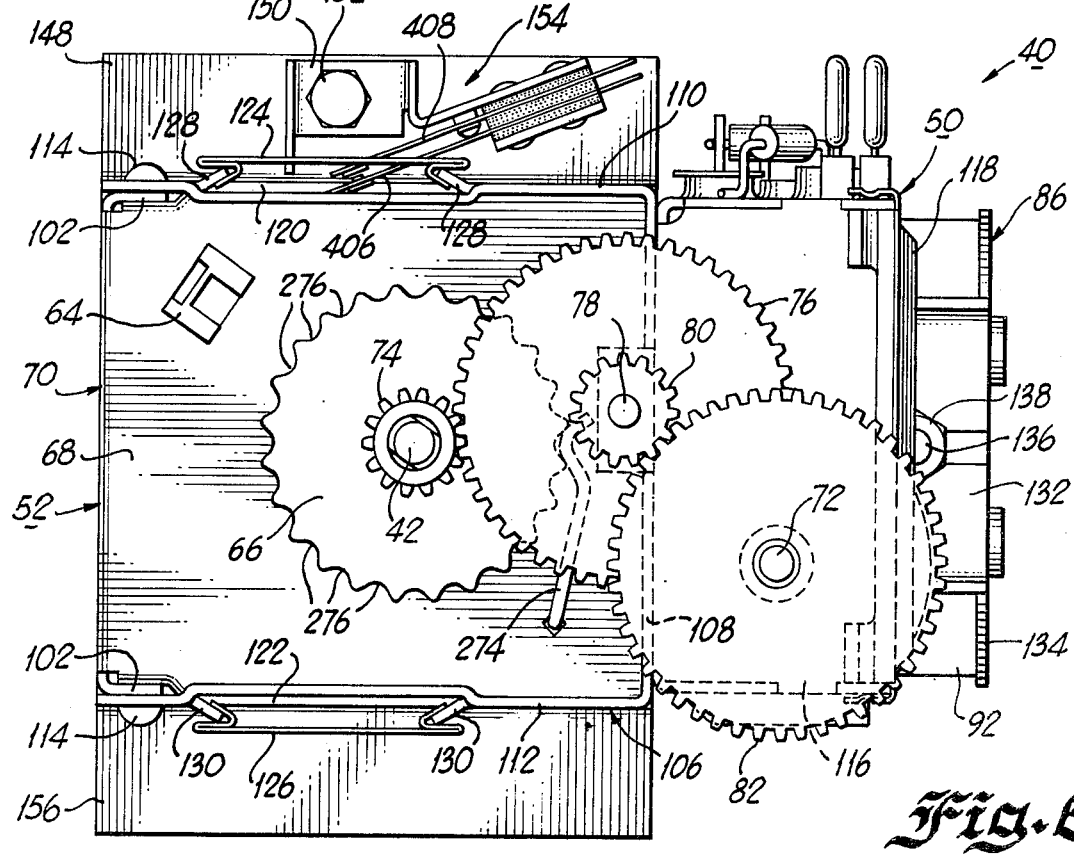
FIG. 6 is a rear elevational view of the combination tuner of FIG. 1.

In order to permit the use of a relatively large-diameter gear 88 within the VHF tuner chassis 70, the stator bar 64 is provided with a clearance opening 264 (FIG. 10) which permits the bar 64 to be mounted in the end wall 104 of the VHF tuner chassis 70 while permitting rotation of the gear 88 without interfering with the stator bar 64. Also, the torsion wire detent spring 266 which extends from the front wall 104 of the VHF tuner chassis to the rear wall 68 thereof is provided with an offset portion 268 (FIG. 10) to provide clearance for the gear 88. The torsion wire spring 266 is of the same general type shown and described in Valdettaro et al U.S. Pat. No. 3,234,801 assigned to the same assignee as the present invention, and reference may be had to said Valdettaro et al U.S. patent for a detailed description of such a torsion detent spring. However, for the purposes of the present invention it may be stated that the spring 266 is provided with a front right-angle end portion (FIG. 5) which exerts a side thrust on the shaft 42 through the intermediate member 272 (FIG. 5) and holds the shaft against suitable bearing surfaces in the front wall 104. Also, the spring 266 is provided with a rear right-angle end portion 274 (FIG. 6) which is provided with a V-shaped end adapted to seat in one of the detent valleys 276 of the detent wheel 66, as best illustrated in FIG. 6. The right-angle arm portion 274 thus provides detent action for the twenty-four detent positions of the shaft 42 and also urges the rear end of the shaft 42 against suitable bearing surfaces provided in the rear wall 68 of the VHF tuner chassis 70. In this connection, it is pointed out that because the selector shaft 42 is used as the input shaft for the UHF tuner 50 in the arrangement of the present invention, the provision of widely spaced bearing surfaces on the walls 68 and 104 of the VHF tuner chassis is particularly advantageous in assuring accurate channel selection and repeatability of channel position for the reception of UHF stations.

Furthermore, this accuracy and resettability is provided without substantially increasing the mechanical complexity of the VHF-UHF tuning arrangement since the shaft which is normally used only as the VHF selector shaft is, in accordance with the present invention also used as the input shaft for the UHF tuner 50.

While the positioning of the gear 88 within the VHF tuner chassis 70 has certain advantages, as discussed heretofore, the inclusion of this relatively large-diameter gear within the VHF tuner chassis limits the number of contacts which can be positioned on the stator bar 64 since the clearance opening 264 is needed to permit rotation of the gear 88. In accordance with a further aspect of the invention, the switching between VHF and UHF channels in alternate positions of the twenty-four position detent wheel 66 is automatically provided by means carried by each of the tuning sticks 58 so that no additional stator bars or auxiliary switches are required, in contradistinction to combination VHF-UHF tuner arrangements such as shown in Weigel U.S. Pat. No. 3,757,227 assigned to the same assignee as the present invention. More particularly the stator bar 64 is provided with a cross bar portion 280 (FIG. 15) to which a flexible spring contact member 282 is secured by means of the rivet 284 (FIG. 16). A generally U-shaped wire clip 286 is positioned transversely of the other end of the cross bar 280, the bar 280 being provided with a relatively deep recess 288 (FIG. 14) which receives one arm portion 290 of the U-shaped clip 286 and a top opening recess 292 which receives the curved upper end portion 294 of the clip 286. In the alternate VHF positions of the selector shaft 42 a contact 60d on one of the tuning sticks 58 engages an upwardly bowed intermediate portion 296 of the spring contact 282, as shown in FIG. 16, and moves the flat end portion 298 of the spring 282 away from the arm 290 of the clip 286. However, when the selector shaft 42 is detented in one of the UHF positions between the alternately spaced VHF positions, the tuning sticks 58 occupy the position shown in FIG. 17 wherein none of these sticks contact the spring member 282 and hence the flat end portion 298 thereof is permitted to engage the arm 290 of the spring clip 286. Accordingly, in the UHF positions of the shaft 42 the spring contact 282 is connected to the U-shaped clip 286 and in the VHF positions of the shaft 42 these members are disconnected. Connection may conveniently be made to the spring contact member 282 by means of a tab 300 provided thereon and connection to the clip 286 may conveniently be made by soldering a wire to the bight portion 302 of the clip 286. In this connection it will be understood that the clip 286 is made of sufficiently large diameter wire that the arm 290 thereof does not flex but instead acts as a fixed contact against which the blade portion 298 of the spring contact 282 may be held in the UHF positions by the resiliency of the spring member 282.

Considering now the manner in which closure of the contacts 282 and 286 is employed to effect automatic changeover fromm VHF to UHF operation, reference may be had to the schematic diagram shown in FIG. 19. In this figure the VHF antenna input is supplied through the 72-ohm connection 310, and through a suitable filter network indicated generally at 312 to the stator contact 62b, the stator contact 62a being connected to ground and the stator contact 62c being connected through a capacitor 314 to the input gate No. 1 of a MOSFET 318 of the insulated gate type. When one of the tuning sticks 58 is contacting the stator contacts 62a, 62b and 62c as shown in FIG. 15, the coils 320 and 322 which are wound about the stick, form a tapped input coil for VHF reception. Also, when a stick is connected to the stator contacts 62a, 62b, 62c, etc. a d.c. ground connection is supplied through the contact 62a, the coil 320, the stator contact 62b and a choke coil 324 to the base of the UHF transistor oscillator 326 located in the UHF tuner portion 50 so that this base is grounded through the above-described circuit. In the circuit of FIG. 19, an energizing B plus voltage is supplied to the UHF oscillator 326 at all times from the terminal 327 and through the collector resistor 328. However, in alternate VHF positions of the shaft 42 the base of the oscillator 326 is grounded through the above-described circuit to the ground stator contact 62a so that the UHF oscillator 326 is prevented from oscillating when the shaft 42 is in its alternate VHF positions. Accordingly, in VHF positions, when a tuning stick is in contact with the stator contacts 62A, 62B and 62C, the VHF signal is appropriately matched by the input tuning coil 320, 322 and is supplied through the capacitor 314 to the input of the MOSFET 318.

When the shaft 42 is in a UHF position none of the tuning sticks contact the stator contacts 62A, 62B and 62C. Accordingly, the base of the UHF oscillator 326 is no longer grounded by the stator contact 62A and hence the UHF oscillator is permitted to oscillate for reception of UHF signals. More particularly, when ground is removed from the base of the oscillator 326 during UHF reception, the proper bias for this base is established by the resistors 421, 422. The oscillator tank circuit includes the capacitor 423 connected between the collector of the transistor 326 and ground, the oscillator coil 210 which carries a fixed capacitor plate 425 on one end thereof and the variable capacitor plates 426 which are carried by the main UHF tuning shaft 72. The shaft 72 also carries the capacitor plates 427 which are positioned in the mixer compartment 428 of the UHF tuner 50, and the plates 429 in the RF input compartment 430. The plates 427 cooperate with the fixed plate 431 to vary the tuning of the mixer section of the UHF tuner 50, a fixed inductance 432 forming the other primary tuning element of the mixer section 428. A crystal mixer 433 is employed to develop a 40 MHz IF signal by mixing the RF input from the section 430 with an oscillator signal from the oscillator 326, as will be readily understood by those skilled in the art. Accordingly, as the shaft 72 is rotated, the tuning elements 426, 427 and 429 are moved so as to select a different UHF television station. Since the capacitor plates on the shaft 72 are movable only through an arc of about 180 degrees to cover the entire UHF band the common selector shaft 42 is rotated through almost six revolutions to cover the entire UHF band, it will be evident that a substantial step-down ratio is provided between the detented input shaft 42 and the shaft 72 through the gearing 74, 76, 80, 82. The advantages of such a large step-down ratio are described in detail in Valdettaro U.S. Pat. No. 3,842,683 referred to previously. In this connection, it will be noted that in the arrangement of the present invention the shaft 72 is also detented, during VHF reception, at positions which are half-way between the UHF tuning detent positions of the shaft 72. Since the base of the UHF oscillator 326 is grounded during VHF reception, the UHF tuner 50 is not functioning in these half-way detent positions. Also, by positioning the UHF tuning elements at points half-way between adjacent UHF stations during VHF reception, stray pick up and interference from these passive tuning elements is minimized during VHF reception.

The 40 Mhz IF output signal developed by the UHF tuner 50 during UHF reception is coupled through a coil 434 to a terminal pin 330 (FIG. 13), which is insulatingly mounted in the bottom wall 435 of the UHF tuner housing 116 by means of the bushing 436. The pin 330 extends into the VHF tuner 52 through a clearance opening 437 in the wall 108 of the main U-shaped framed 106. By mounting the UHF tuner housing 116 on the wall 108 of the main frame 106 which forms a part of the housing for the VHF tuner 52, the IF connection between the UHF tuner 50 and the VHF tuner 52 may simply comprise the unshielded conductor 332. Such an arrangement has the advantage that the shielded coaxial cable which is normally employed to interconnect separated VHF and UHF tuners is eliminated, as well as the matching transformation networks which are required at the end of such a cable and the plug and socket hardware which is required in conjunction with such a cable. As a result, the total cost of the improved VHF-UHF tuning system of the present invention is substantially reduced by employing the above-described IF connection. In addition, this simplified IF connection results in a maximum noise limit improvement of 2 db as compared with the performance of separate tuners of identical capabilities but interconnected in the conventional manner.

The forty-Mhz IF output signal which is connected to the output terminal 330 of the UHF tuner 50 is supplied by way of the unshielded conductor 332 and a matching coil 334 to the arm 290 of the clip 286. Since the spring contact 282 is in engagement with the arm 290 in the UHF positions of the shaft 42 the UHF IF signal is supplied through the switch contact 282 and a capacitor 316 to the input of the MOSFET 318 in place of the VHF input signal. However, when the shaft 42 is turned to the next detent position, i.e. a VHF station, a contact 60d on that tuning stick will engage the intermediate portion 296 of the switch contact 282 and depress it to the position shown in FIG. 16 so that no contact is made between the arm 290 and the contact 282. The IF input connection from the UHF tuner 50 is thus disconnected in the VHF positions of the shaft 42.

In the alternate VHF positions of the common selector shaft 42, i.e. when one of the tuning sticks is connected to the stator contacts 62, the MOSFET 318 is operated as an RF amplifier for the VHF signal supplied to the input electrode 338, which is gate No. 1 of the MOSFET 318. An AGC signal is supplied from the main television receiver by way of the input terminal 340 and a resistor 342 to the gate No. 2 electrode 344 of the MOSFET 318. The source electrode 346 thereof is connected to ground through a bias resistor 348 and an amplified VHF signal is developed at the drain electrode 350 of the MOSFET 318 which is connected to the primary winding 352 of a 40-Mhz IF transformer indicated generally at 354. The other end of the winding 352 is connected through the dropping resistor 356 and a choke coil 358 to the 24 volt B plus input terminal 360, a variable capacity diode 362 being connected across the series combination of the resistor 356 and coil 358. In the VHF positions of the shaft 42 an RF output tuning coil 364, which is wound about the tuning stick 58 and connected to the contacts 60e and 60f thereof, is connected in shunt with the primary winding 352 through the stator contacts 62e and 62f so that the output circuit of the MOSFET 318 is tuned to the desired VHF signal frequency. When an AGC bias is applied to the terminal 340, the output capacity of the MOSFET 318 diminishes which would normally result in detuning of the circuit 352, 364. However, since the current drawn by the drain electrode 350 also diminishes under these conditions the bias across the variable capacity diode 362 also decreases thereby minimizing the detuning effect produced by the AGC voltage, it being noted that the diode 362 is effectively in parallel with a feedthrough capacitor 361.

The secondary winding 366 of the transformer 354 is supplied to the input electrode 368 (Gate No. 1) of an insulated gate MOSFET 370 which acts as a mixer and develops a suitable 40-Mhz IF signal at the drain electrode 372 thereof. When the shaft 42 is in the alternate VHF positions the other RF tuning coil 374a, which is wound about the stick 58 is connected in shunt with the secondary winding 366 through the stator contacts 62g and 62h so that the input circuit of the MOSFET 370 is tuned to the desired VHF signal frequency. A transistor 374 is operated as the VHF oscillator, the tank circuit for this oscillator including the fixed coil 376 and the tuning coil 246 which is wound about the tuning stick 58 and connected to the contacts 60i and 60j. When the shaft 42 is in the alternate VHF positions the coil 246 is connected through the stator contact 62i and a biasing network including the capacitor 380 and shunt resistor 382 to the base of the transistor 374 to provide sustained oscillations in the oscillator tank circuit. B plus for the collector of the transistor 374 is supplied through the choke coil 384 from the B plus terminal 360.

As discussed generally heretofore, when the shaft 42 is in the UHF positions, none of the tuning sticks 58 are connected to the stator contacts 62 and a UHF IF signal is supplied through the interconnected members 282, 290 and the capacitor 316 to the input of the RF amplifier 318. Under these conditions the output circuit of the amplifier 318 and the input circuit of the mixer 370 are tuned to the 40-Mhz IF frequency by means of the transformer 354 and hence the UHF IF signal receives additional amplification in both of the MOSFETS 318 and 370. During UHF operation the oscillator 374 is not oscillating since the bias voltage normally supplied to the base of the transistor 374 is removed when no tuning coil 246 is connected to the stator contacts 62i, 62j. The output of the mixer-amplifier 370 is supplied to a tuning coil 390 which is tuned to 40 Mhz by the circuit capacitances associated therewith, a capacitor 392 being employed to couple the 40-Mhz output signal through the resistor 394 to the VHF IF output cable 396.

In order to provide automatic frequency control for the VHF oscillator 374, an AFC control voltage from the television receiver is supplied through the terminals 398 to a voltage variable diode 400. One side of the diode 400 is connected to ground through the feedthrough capacitor 402 and the other side of the capacitor is coupled through the series capacitor 404 to the stator contacts 62j and the upper end of the coil 376. As described generally heretofore, an AFC interchannel defeat switch assembly 154 is provided to disable the AFC control voltage during periods when a new channel is being selected so that the AFC control voltage will not interfere with the selection of a signal from a different VHF channel. More particularly, the AFC defeat switch 154, which is mounted on the bracket 150, comprises a pair of flexible switch-blades 406 and 408 (FIG. 9) which carry contacts which may be closed to disable the AFC control voltage. A tubular pin 410 is soldered to the blade 406 and is provided with a circular head portion 412 which rides on the periphery of the gear teeth 88. As the shaft 42 is rotated the blade 406 is flexed upwardly so that the contacts carried by the blades 406, 408 close and short the AFC control voltage applied to the terminals 398. The control voltage applied to the terminals 398 is normally balanced with respect to ground when no error signal is provided. Accordingly, when the contacts of the switch 154 are closed, a condition similar to no error from the AFC circuit is provided so that the oscillator 374 may be switched to a new VHF channel. Preferably the cover 124 is provided with a small slot in the end thereof to accommodate the blades 406, 408 of the switch 154 while providing a substantially totally shielded enclosure for the VHF tuner portion 52.

Since the AFC control voltage may interfere with a fine tuning operation on the VHF oscillator 374 it is also desirable to defeat the AFC ontrol voltage when a VHF fine tuning operation is performed. To this end, an AFC defeat switch indicated generally at 414 is mounted on a bracket 416 (FIG. 5) which is secured to the front wall 104 of the VHF chassis 70 by means of the screw 418. The defeat switch 414 includes a pair of flexible blade members carrying contacts at the free ends thereof which are closed when a fine tuning operation is effected. More particularly, when the tuning sleeve 44 is moved to the rearward position to effect a VHF tuning operation the member 234 is pivoted outwardly about the post 236 and closes the switch contacts of the defeat switch 414 at the same time that the gear 240 is moved into engagement with the fine tuning screw gear 242, as shown in FIG. 11. Accordingly, during periods when the frequency of the VHF oscillator 374 is being varied by adjustment of the tuning screw within the oscillator coil 246, the AFC control voltage is disabled by closure of the contacts of the switch 414.

The UHF tuner 50 is also controlled by an AFC control voltage from the associated television receiver. However, since the UHF tuner 50 does not need as great a range as the VHF tuner 52, only one of the AFC terminals 398 is connected to the UHF tuner 50, as will be readily understood by those skilled in the art. This AFC voltage is supplied through the resistor 438 on an AFC diode 439 so as to control the frequency of the oscillator 326. When either of the switches 154 or 414 is closed, the AFC voltage at the terminal 398 returns to its no error value so that the AFC circuitry does not interfere with channel selection.

In FIGS. 20, 21 and 23 to 28, inclusive, a number of alternative arrangements are disclosed for automatically switching between VHF and UHF stations in alternate positions of the common selector shaft 42. Referring first to FIG. 20 a switching arrangement is shown therein which is particularly suitable for operation with a transistor RF amplifier of the common base type which has a low input impedance. More particularly in the embodiment of FIG. 20 the VHF input from the filter 312 is supplied through a feedthrough capacitor 440 and a series capacitor 442 to the stator contact 62c, so that the VHF input signal is applied across both of the input coils 320a, 322a to ground through the stator contacts 62a. The stator contact 62b which is connected to the junction of these two coils is then connected through a capacitor 444 to the emitter 446 of a transistor 448 which is operated in the common base configuration in which the base thereof is grounded through the feedthrough capacitor 450. The emitter 446 is connected through the feedthrough capacitor 452, a coil 454 and resistor 456 to ground. In VHF detent positions of the shaft 42 a ground is supplied from the stator contact 62a through the coil 320a, the stator contact 62b and the coil 324 to the base of the UHF oscillator, as described in detail heretofore in connection with the embodiment of FIG. 19 so that the UHF oscillator is prevented from oscillating during VHF reception. Also, the contact 60d on the tuning stick 58 depresses the switch contact 282 so that the member 282 and 290 are not connected together and no UHF IF signal path is provided to the input of the transistor 448. The capacitors 440, 442 and 452 in conjunction with the coils 320a, 322a function to tune the input of the transistor 448 to the desired VHF station.

When the shaft 42 is in a UHF detent position the UHF oscillator base is no longer grounded through the stator contact 62a and the members 282 and 290 are connected together so that an IF signal from the UHF tuner is supplied through a capacitor 458 to the emitter of the transistor 448, it being understood that this transistor is now operated as a 40-Mhz amplifier for UHF reception, as described in detail heretofore in connection with the embodiment of FIG. 19. In this respect the transistor 448 replaces the MOSFET 318 of FIG. 19. Preferably, transistor 448 is a bipolar transistor type BF 200, the capacitor 440 has a value of 20 picofarads, the capacitor 442 a value of 6 picofarads, the capacitor 452 a value of 3 picofarads and the capacitor 450 a value of 1,000 picofarads in the embodiment of FIG. 20.

Figure 22:
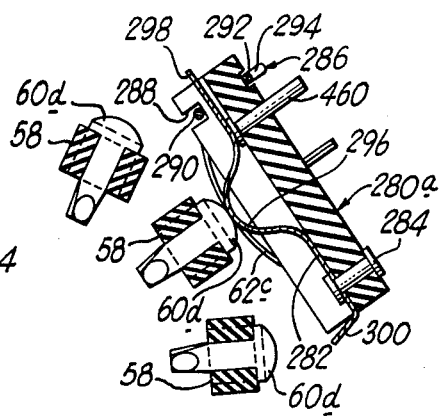
FIG. 22 is a sectional view similar to FIG. 16 of an alternative switching arrangement used in the circuit of FIG. 21.

In FIG. 21 an alternative arrangement is employed wherein a different cross bar structure is employed on the stator 64. This cross bar structure is shown in FIG. 22. In this figure the cross bar 280a is generally similar to the cross bar 280 but includes a tubular headed conductive member 460 which is mounted in the cross bar 280a adjacent the flat end portion 298 of the spring contact 282 in such manner that the member 460 is engaged by the end portion 298 when the spring 282 is depressed by engagement with one of the stick contacts 60d. In other respects the stator bar 280a of FIG. 22 is similar to that described in detail hereintofore in connection with the FIGS. 15, 16 and 17.

Referring now to FIG. 21, the VHF input signal from the filter 312 is connected to the stator contacts 62b and the UHF oscillator base is grounded through the coil 324, as in the embodiment described in detail heretofore in connection with FIG. 19. However, an additional capacitor 462 is connected from the input electrode 338 of the MOSFET 318 to ground only during VHF reception. During VHF operation the RF device 318 must perform over a wide frequency range, this resulting in a variation of its input resistance which in turn affects the selectivity of the tuned circuit connected to it. By connecting the fixed capacitor 462 to the input of the device 318 during VHF reception the selectivity variation can be held to acceptable limits. This capacitor also stabilizes the circuit resonant frequency when the input capacity of the device 318 changes as when its gain is altered by application of AGC.

During UHF IF amplification, the selectivity and resonance of the input circuit of the device 318 is of secondary importance as the UHF tuner selectivity and the selectivity of transformer 354 combine to provide adequate overall RF/IF selectivity. At the same time the noise figure of the UHF tuner is appreciably influenced by the effectiveness of the IF signal transfer between the UHF diode mixer and the IF amplifier device 318. By disconnecting the capacitor 462 during UHF reception it is possible to secure an increase in the impedance of the input resonant circuit and consequently an increase in gain and decrease in noise figure by the use of large inductances.

When one of the tuning sticks 58 is connected to the stator contacts 62 the empty stick contact 60d depresses the spring member 282 so that it contacts the conductive stud 460 which is in turn connected to the capacitor 462. Accordingly, the capacitor 462, during VHF reception, is connected through the stud 460, the blade 282 and the capacitor 316 to the input of the MOSFET 318. However, during UHF reception the switch contact 282 is disconnected from the stud 460 so that the shunt capacitor 462 is no longer in the circuit while at the same time the UHF IF signal is connected from the member 290 through the blade 282 and the capacitor 316 to the input of the MOSFET 318 as described in detail heretofore in connection with FIG. 19. In other respects the operation of the embodiment of FIG. 21 is identical to that described in detail heretofore in connection with FIG. 19.

In the embodiment of FIG. 23, a cross bar 280a of the type shown in FIG. 22 is used. In this embodiment the VHF coil 320 is connected between the stick contacts 60b and 60c and the coil 322 is connected between the stator contacts 60c and 60d so that the stick contact 60d is no longer an empty contact but establishes electrical contact with the switch contact member 282 when a VHF tuning stick 58 is in operative position, as well as depressing the member 282 so that it contacts the conductive study 460.

In the embodiment of FIG. 23 the VHF input is again connected to the junction of the coils 320 and 322 through the stator contact 62c as in the embodiment of FIG. 19. However, in order to provide a ground connection for the UHF oscillator base, a wire 464 is provided on the tuning stick 58 connecting the stick contacts 60a and 60b. Accordingly, when the tuning stick is in operative position oscillator base is grounded through the coil 324 and the wire 464 to the grounded stator contact 62a.

During VHF reception the stick contact 60d establishes electrical connection with the switch blade 282 and supplies the VHF signal appearing at the upper end of the coil 322 through the capacitor 466 to the input electrode of the MOSFET 318. Also, in this position the blade 282 is physically depressed by engagement of the stick contact 60d therewith so that it is electrically connected to the conductive stud 460. A capacitor 468 is connected between the stud 460 and ground and hence the capacitor 468 is also connected in circuit with the input of the MOSFET 318 during VHF reception. By adding capacity to the input gate of the MOSFET 318 during VHF operation the performance can be improved as described heretofore in connection with FIG. 21.

However, during UHF reception when a tuning stick is no longer contacting the stator contacts 62 the blade 282 is removed from engagement with the stud 460 and is connected to the member 290 so that the capacitor 468 is out of the circuit when a UHF IF signal is applied through the members 290, 282 and the capacitor 466 to the input of the MOSFET 318. Removal of the capacitor 468 during UHF reception also improves operation as described heretofore.

Referring now to the embodiment of FIG. 24, in this embodiment the physical positions of the cross bar 280 and the stick contact 60c are interchanged on the stator bar 64, as indicated diagrammatically in FIG. 24. Accordingly, in this embodiment the stick contact 60c depresses the blade 282 during VHF reception and disconnects this blade from the contact 290. The VHF input from the filter 312 is electrically connected to the blade 282 which is in turn connected through the stick contact 60c to the junction of the coils 320 and 322 for that particular VHF station. The stick contact 60b is connected through the stator contact 62b to ground and the upper end of the coil 322 is connected through the stator contact 62d and capacitors 470 and 472 to the input of the MOSFET 318. In the embodiment of FIG. 24 the UHF IF signal is not switched off during VHF reception but instead is directly connected through the matching coil 334 and the capacitor 472 to the input of the MOSFET 318. However, when the shaft 42 is in the alternate VHF detent positions the base of the UHF oscillator is grounded to the stator contact 62b through a wire 474 which is connected between the stick contacts 60a and 60b, so that the UHF oscillator is prevented from oscillating during VHF reception. In the embodiment of FIG. 24 some difficulty may be experienced by virtue of the fact that the VHF signal can be transmitted back through the coil 334 to the crystal mixer in the UHF tuner 50 and produce cross modulation effects. In other respects the embodiment of FIG. 24 operate similarly to that described in detail heretofore in connection with FIG. 19.

In the embodiment of FIG. 25 a stator cross bar similar to the cross bar 280a shown in FIG. 22 is provided on the stator 64 in place of the first stator contact 62a and a second cross bar similar to the cross bar 280 is provided on the stator 64 after the next three stator contacts 62b, 62c and 62d. In the embodiment of FIG. 25 the VHF signal is supplied to the stator contacts 62c and the stator contact 62b is grounded so that the VHF input signal is applied across the coil 320 and the stepped up VHF signal appearing at the stator contact 62d is supplied to the capacitor 474 to the input of the MOSFET 318 during VHF reception. Also, during VHF reception the base of the UHF oscillator is grounded through the coil 324, the coil 320 and the stator contact 62b.

In the embodiment of FIG. 25 a further feature is provided whereby either the UHF IF signal, which is supplied to the terminal 330, or the VHF input signal which is applied to the terminal 476, is shorted to ground when the opposite type of signal is being received. Thus, during VHF reception the UHF IF signal applied to the terminal 330 is connected by way of the stud 460 and the flexible blade 282 to ground because the blade 282a is depressed by means of the empty rotor contact 60a, provided on the tuning stick 58 in the embodiment of FIG. 25. During UHF reception none of the tuning sticks 58 is in engagement with the spring members 282 and 282a or the stator contacts 62, and hence the VHF signal is connected to ground through the member 290a and the flexible blade 282a. Also, the UHF IF signal is supplied through the terminal 290, the flexible blade 282 and the capacitor 458 to the input of the MOSFET 318. In the embodiment of FIG. 25 the UHF oscillator base is also grounded through the coil 324, the stator contact 62c, the coil 320 and the stator contact 62b, as described in detail heretofore. By directly shorting the UHF input or the VHF input, pickup from the opposite tuner, such as through the contacts 290, 282, is avoided.

Figure 17:
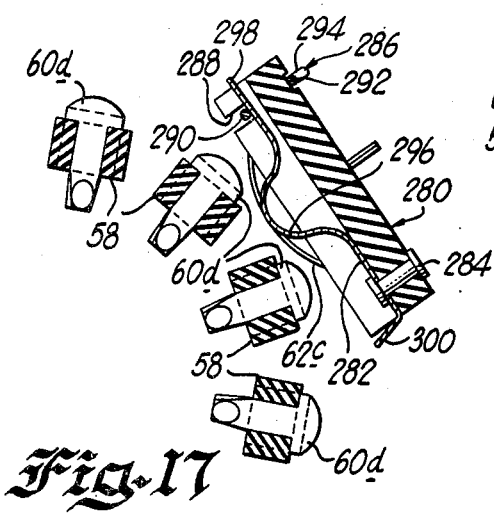
FIG. 17 is a sectional view similar to FIG. 16 but showing the common selector shaft in a UHF position.

In FIG. 26 a further alternative embodiment is disclosed wherein a pair of cross bars similar to the cross bar 280 described in detail heretofore in connection with FIGS. 15 to 17, are provided in place of the third and fourth stator contacts, the flexible blades 282 and 282a thereof being engaged by the rotor contacts 60c and 60d, respectively on the tuning sticks 58. In the embodiment of FIG. 26 the VHF tuning coil 320 is connected between the rotor contacts 60b and 60c and the coil 322 is connected between the rotor contacts 60c and 60d. Accordingly, during VHF reception the VHF signal is connected through the blade 282 and the rotor contact 60c to the junction of the coils 320, 322. The bottom end of the coil 320 is connected to ground through the stator contact 62b and the top end of the coil 322 is connected through the rotor contact 60d, the blade 282a and a capacitor 480 to the input of the MOSFET 318. Also, during UHF reception the UHF oscillator base is grounded through the coil 324 which is connected to the stator contacts 62a, through the rotor contact 60a and a wire 482 on the tuning stick, to the rotor contact 60b and through the stator contact 62b to ground. An independent ground connection for the UHF oscillator base is thus provided as in the embodiment of FIG. 23. However, during UHF reception, in the embodiment of FIG. 26 the VHF input is shorted to ground through the blade 282 and the terminal 290. At the same time the UHF IF signal is supplied through the coil 334, through the closed contacts 290a and 282a and through the capacitor 480 to the input of the MOSFET 318.

In the embodiment of FIG. 27 a stator crossbar 280a, as described in detail heretofore in connection with FIG. 22, is provided in place of the 4th stator contact. However, unlike the previously described embodiments the flexible blade 282 thereof, is not depressed during VHF reception because no empty rotor contact 60d is provided on the tuning sticks 58 in the embodiment of FIG. 27. Accordingly, during VHF reception the flexible blade 282 is connected through the terminal 290 to ground so as to ground the IF output of the UHF tuner during VHF reception. Also, during VHF reception the VHF input signal is applied to the input of the MOSFET 318 and the UHF oscillator base is grounded in a manner substantially identical to that described in detail heretofore in connection with FIG. 19. However, in the embodiment of FIG. 27 an insulated disc 486 is mounted on the selector shaft 42 and is provided with a series of twelve projections 488 which are arranged to engage the blade 282 and depress it so that it is connected to the stud 460 in the twelve alternate UHF positions of the shaft 42. Thus, during UHF reception one of the projections 488 depresses the blade 282 so that it is connected to the contact 460 and the UHF IF signal is supplied through a capacitor 490 to the input of the MOSFET 318. In the intermediate VHF positions the projections 488 do not contact the switch blade 282 and hence the IF output from the UHF tuner 50 is connected to ground. It will be appreciated that the insulated disc 486 may be supported in any suitable manner for rotation with the shaft 42. For example, the disc 486 may be secured to the supporting disc 54 with the projections 488 thereof in alignment with the blade 282 on the cross bar 280.

In FIG. 28 an alternative embodiment is disclosed wherein the UHF oscillator is not prevented from oscillating by grounding the oscillator base but instead a B plus voltage for the UHF oscillator is selectively applied to this oscillator only during UHF positions of the shaft 42. Also, B plus is removed from the VHF oscillator in the UHF positions of the shaft 42. More particularly in the embodiment of FIG. 28 a cross bar 280 is arranged on the stator 64 so that the blade 282 thereof will be engaged by an empty rotor contact 60d on the tuning stick 58. During VHF reception the VHF input signal is applied from the terminal 476 to the junction of the coils 320 and 322 so that a VHF input signal is applied through the capacitor 314 to the input of the MOSFET 318. However, in the embodiment of FIG. 28 the UHF oscillator base is not grounded during VHF reception and the coil 324 is eliminated. During UHF reception the UHF IF signal is supplied by way of the terminal 290, the blade 282, and the capacitor 316 to the input of the MOSFET 318, as described in detail heretofore in connection with FIG. 19.

In the embodiment of FIG. 28 a cross bar similar to the cross bar 280 is provided in place of the stator contact 62i described heretofore in connection with FIG. 19, the blade 282a of this cross bar being depressed by the rotor contact 60i in the VHF positions of the shaft 42. Accordingly, during VHF reception a B plus voltage is supplied through the coil 384, the blade 282a, the rotor contact 60i, the oscillator tuning coil 246 on the tuning stick, the rotor contact 60j and the stator contact 62j to the oscillator tuning coil 376 so that B plus voltage is supplied to the collector of the oscillator transistor 374. During these periods of VHF reception the blade 282a is not connected to the terminal 290 a because it is depressed by the rotor contact 60i during VHF reception. During UHF reception no rotor contact 60i is depressing the blade 282a, and this blade is connected through the terminal 290a to a UHF B plus output terminal 492 so that a B plus voltage is supplied to the UHF tuner 50 during periods of UHF reception. It will be noted that in the UHF positions of shaft 42 no B plus voltage is supplied to the collector of the VHF oscillator 374 since no connection is established to the stator contact 62j in these UHF positions.

In FIGS. 29 and 30 an alternative stator contact arrangement is disclosed which is preferably employed in the embodiment of FIGS. 1 to 19 described previously. Referring to FIGS. 29 and 30, the stator contacts 500, which are positioned along the length of the stator bar 64, are provided with slightly inclined straight portions 502 and 504 in the outwardly bowed portion thereof, the portions 502 and 504 providing clearance from the stick contacts 60 in the UHF position shown in FIG. 29 while also providing a smooth surface which can be contacted by the curved surface 506 of the stick contacts 60 as the turret is moved to a VHF position, shown in FIG. 30. Such a stator contact shape arrangement has an advantage over the VHF-UHF switching arrangement shown in Weigel U.S. Pat. No. 3,757,227 in that it avoids an abrupt bump or sharp shoulder portion in the area where the stator contact is engaged by the stick contacts 60 so that wear and breakage of the stator contacts is minimized with the arrangement shown in FIGS. 29 and 30. Preferably, the portions 502 and 504 are each inclined at an angle of about ten degrees with respect to a perpendicular to the center line of the shaft portion 508 of the stator contact 500.

The shaft portion 508 is provided with portions 510 which hold the reversely bowed portions 512 of the contact 500 against the cooperatively shaped portion of the stator bar 64 by engagement with the bottom of the recess 514 formed in the stator bar 64. With this arrangement the stator contacts 500 are securely registered with respect to the stator bar 64 so that they cannot be accidently displaced and contact one of the stick contacts 60 in the UHF position shown in FIG. 29.

Referring now to FIGS. 31 to 36, inclusive, an alternative embodiment of the present invention is disclosed therein which possesses certain advantages over the embodiment of FIGS. 1 to 19, inclusive. Briefly considered, the embodiment of FIGS. 31 to 36, inclusive, provides a common AFC defeat switch which is actuated in response either to movement of the common selector shaft 42 to a different VHF or UHF channel position, or movement of a fine tuning sleeve 520 to the VHF fine tuning position. Also, in the embodiment of FIGS. 31 to 36, an electronic fine tuning arrangement is employed for UHF fine tuning in place of the cam member 180 and tuning rod 190 in the embodiment of FIGS. 1 to 19, inclusive.

Considering first the AFC defeat arrangement of the embodiment of FIGS. 31 to 36, a pair of feedthrough capacitors 519 are mounted on the wall 100 of the VHF tuner chassis 70, the AFC voltage from the associated television receiver being connected to the center conductors 522 of the feedthrough capacitors 519. An AFC defeat switch indicated generally at 524 is supported on the upper ends of the feedthrough capacitors 519 by means of a pair of strap-like members 526 and 528 which are mounted on the upper ends of the feedthrough capacitors 519 and electrically connected to the center conductors 522 thereof by any suitable means such as soldering or the like. The straps 526, 528 are insulated from the grounded conductive housings of the feedthrough capacitors 519 by means of the insulating spacers 530.

The blades 532 and 534 of the defeat switch 524, which are electrically connected to the straps 526 and 528, respectively, carry contacts at the outer free ends thereof which are closed under the control of an actuating member indicated generally at 536. The member 536 is pivotally mounted on a post 538 (FIG. 33) which is in turn mounted on the front wall 104 of the VHF tuner chassis 70. The member 536 is secured on the post 538 by means of the C washer 540. The actuating member 536 is provided with a downwardly extending tab portion 542 at the outer end thereof which is adapted to engage the curved surface 544 of the VHF fine tuning member 236 described in detail heretofore in connection with the embodiment of FIGS. 1 to 19, inclusive. The member 536 is also provided with an outwardly extending tab portion 546 which is adapted to engage the underside of the blade contact 532. The actuating member 536 is also provided with a side extension portion 548 which extends through an opening 550 (FIG. 33) in the front wall 104 of the VHF tuner chassis 70. The side projection 548 is adapted to ride on the periphery of an outwardly extending flange portion 552 formed in the disc 252, which carries the gear teeth 88, as described in detail heretofore. The flange portion 552 is provided with a series of notches 554, one for each of the gear teeth 88. The side extension 548 is provided with a V-shaped cross section which permits the actuating member 536 to follow the contour of the flange portion 552. Accordingly, as the common selector shaft 42 is rotated to different VHF and UHF positions, the side extension 548 which is normally positioned in one of the notches 554 when the shaft 42 is detented, is moved into engagement with the outer periphery of the flange 552, thus causing outward movement of the actuating member 536 and closure of the contacts carried by the blades 532 and 534 of the defeat switch 524. Accordingly, during inter-channel movement of the selector shaft 42, to both VHF and UHF positions, the AFC control voltage is removed from both the UHF tuner portion 50 and the VHF tuner portion 52 to prevent the AFC control voltage from interfering with selection of the new channel, irrespective of whether or not this channel is a VHF channel or a UHF channel.

When the fine tuning sleeve 520 is moved to the rearward position for a VHF fine tuning operation, the member 234 is moved outwardly, as the member 168 is moved from the position shown in FIG. 34 to the position shown in FIG. 35, this outward movement of the member 234 also acting to close the switch contacts 532, 534 and consequent removal of the AFC control voltage for VHF fine tuning. It will be noted that in the embodiment of FIGS. 31 to 36 the AFC defeat switch is actuated by movement of the side extension 548 which gains access to the inside of the VHF tuner 50 through the small opening 550. Accordingly, in the embodiment of FIGS. 31 to 36 the cover 124 on the top wall 110 of the U-shaped main frame 106 can provide more complete shielding than in the embodiment of FIGS. 1 to 19, wherein the switch 154 extends through a portion of the cover 124 and the top wall 110.

Considering now the manner in which an electronic UHF fine tuning operation is provided in the embodiment of FIGS. 31 to 36, it is pointed out that this electronic UHF fine tuning arrangement is in general similar to that disclosed in Tarr et al United States application Ser. No. 685,153 filed May 11, 1976, now U.S. Pat. No. 4,054,853 and reference may be had to said copending application for a detailed description of such a system. In the VHF-UHF arrangement of the present arrangement, a UHF fine tuning potentiometer 560 is mounted in an aperture 562 in the front wall of the bracket 140, a locating tab 564 being employed to prevent the potentiometer 560 from rotating. A gear 566 is mounted on the control shaft 568 of the potentiometer 560 by means of the nut 570, so that rotation of the gear 566 causes rotation of the wiper arm of the potentiometer 560 while the case thereof remains stationary, as will be readily understood by those skilled in the art.

The fine tuning sleeve 520 is provided with external gear teeth 572 which are adapted to engage with the teeth of the gear 566 when the sleeve 520 is in its outermost or UHF fine tuning position. The sleeve 520 is urged to this outer UHF fine tuning position by means of the coil spring 574 which corresponds to the spring 160 in the embodiment of FIGS. 1 to 19, inclusive. In other respects the fine tuning sleeve 520 is similar to the sleeve 44 and includes gear teeth 220 on the end thereof which are adapted to engage with the teeth 222 on the member 168 in the embodiment of FIGS. 1 to 19, inclusive. When the sleeve 520 is in the outermost UHF fine tuning position, the gears 572 and 566 are in engagement and rotation of the sleeve 520 rotates the wiper arm of the potentiometer 560. The terminals 573 of the potentiometer 560 is connected to vary the bias voltage applied to a suitable varactor diode in the UHF tuner 50 so as to perform an electronic UHF fine tuning operation, as described in detail in said copending Tarr et al application. When the sleeve 520 is depressed by the operator so that the member 168 is moved to the position shown in FIG. 35, the gears 572 and 566 are moved out of engagement, as shown in FIG. 35, and the gear 240 is moved into engagement with the gear 242 on the tuning stick 58 so as to effect a VHF fine tuning operation as described in detail heretofore in connection with the embodiment of FIGS. 1 to 19, inclusive. At the same time the switch contacts of the switch 524 are closed, as described in detail heretofore, to short circuit the AFC control voltage which is connected to the terminals 522.

In connection with the embodiment of FIGS. 31 to 36, it should be noted that either the AFC defeat arrangement wherein the single AFC defeat switch 524 is used, or the UHF electronic fine tuning involving the potentiometer 560, may be incorporated independently in the embodiment of FIGS. 1 to 19, inclusive. Thus, the AFC defeat switch 524 may be employed in the embodiment of FIGS. 1 to 19 and the UHF fine tuning arrangement with the tuning rod 190 retained. In the alternative, the UHF electronic fine tuning involving the potentiometer 560 may be employed in the embodiment of FIGS. 1 to 19 and separate AFC switches 154, 414 employed if desired.

Referring now to FIG. 37, a further alternative embodiment of the present invention is disclosed wherein a mechanical fine tuning arrangement is disclosed wherein a mechanical fine tuning arrangement is provided for rotating the main rotor shaft of the UHF tuner 50 when the common fine tuning knob 48 is in its outermost position. In general this mechanical fine tuning arrangement is similar to that disclosed in Valdettaro U.S. Pat. No. 3,842,683 and reference may be had to this Valdettaro patent for a detailed description of such a UHF fine tuning arrangement. However, in the VHF-UHF combination tuning system of the present invention, the common selector shaft 580, which corresponds to the selector shaft 42 in the previously described embodiments, is provided with a rearwardly opening recess 582 which is adapted to receive an inner UHF fine tuning shaft 584. A pin 586 is secured to the forward end of the shaft 584 and extends radially outwardly through an arcuately-shaped window 588 formed in the hollow wall of the shaft 580 near the forward end thereof. The shaft 580 is detented to twenty-four equally spaced detent positions by means of the detent wheel 594 which is secured to the shaft 580 and is held in detented position by means of the detent spring 596, the members 594 and 596 corresponding to the members 66 and 274 in the embodiment of FIGS. 1 to 19, inclusive.

An output pinion gear 598 is mounted on the end of the shaft 584 and is interconnected with the face of the detent wheel 594 through a clutch pad 600 against which it is urged by means of a bowed spring 602 positioned between the end of the pinion 598 and a C washer 604 on the end of the shaft 594.

A dual function fine tuning sleeve 610 is rotatably mounted on the common selector shaft 580 and is adapted to have the fine tuning knob 48 positioned on the front end thereof. The sleeve 610 is provided with an annular recess 612 and a series of radially extending gear teeth 614 are provided in the forward face of a member 611 which is secured to the sleeve 610 and closes the rear end of the recess 612. The teeth 614 are adapted to cooperate with the radially extending outer portion of the pin 586, which projects into the recess 612, when the member 611 and sleeve 610 are urged to the forward or UHF tuning position by means of the coil spring 616. The rear end of the member 611 is provided with an annular series of gear teeth 220*a*, which correspond to the teeth 220 in the embodiment of FIGS. 1 to 19, inclusive, and are adapted to engage with the teeth 222 on the VHF fine tuning member 168 when the sleeve 610 is moved to the rearward or VHF fine tuning position against the force of the spring 616.

In the embodiment of FIG. 37 the VHF fine tuning arrangement is substantially identical to that described in detail heretofore in connection with the embodiment of FIGS. 1 to 19, inclusive. When the knob 48 is moved rearwardly the member 168 is moved to the horizontal position shown in FIG. 11 and rotation of the knob 48 while in the rear position causes rotation of the selected tuning screw 242.

When the knob 48 is in the forward position shown in FIG. 37 a UHF fine tuning operation may be carried out by rotating this knob when the common selector shaft 580 is in one of the alternate UHF positions. In the embodiment of FIG. 37 the UHF fine tuning rod 190 and the UHF cam member 180 of the embodiment of FIGS. 1 to 19, inclusive, are eliminated. The output pinion 598 corresponds to the gear 74 in the embodiment of FIGS. 1 to 19, inclusive, and the pinion gear 598 is interconnected with the main tuning shaft 72 of the UHF tuner 50 through suitable gearing such as the gears 76, 80 and 82 in the embodiment of FIGS. 1 to 19, inclusive. When the tuning sleeve 610 is in the forward UHF fine tuning position, the teeth 614 on the member 611 are held in engagement with the pin 586 on the inner fine tuning shaft 584, it being noted that the shaft 584 is prevented from moving longitudinally within the opening 582 in the shaft 580 by engagement of the pin 586 with a forward edge of the corresponding window 588. Accordingly, when the knob 48 is rotated the inner fine tuning shaft 584 is correspondingly rotated and the pinion gear 598 carried thereby also rotates while the pinion slips with respect to the stationary detent wheel 594 by virtue of the clutch pad 600. Accordingly, the main tuning shaft 72 of the UHF tuner 50 is rotated in response to rotation of the fine tuning knob 48. During this UHF fine tuning operation the detent wheel 594 remains in detented position and the pinion gear 598 is rotated independently of the selector shaft 580. However, when the pin 586 engages either end of the arcuate window 588 formed in the shaft 580 the inner fine tuning shaft 584 becomes engaged with the shaft 580 and further rotation of the fine tuning knob 48 will also move the selector shaft 580 to the next detented position. Accordingly, the extent of the arcuate window 588 in the shaft 580 determines the UHF fine tuning range which may be covered by rotation of the knob 48.

When the common fine tuning knob 48 is moved rearwardly against the force of the coil spring 616, the tuning sleeve 610 is moved so that the teeth 614 thereof are no longer in engagement with the pin 586 so that the inner fine tuning shaft 584 is now disengaged from the sleeve 610. This rearward movement of the sleeve 610 moves the teeth 220a into engagement with the teeth 222 and the member 168 is moved to a horizontal position in which a VHF fine tuning operation can be performed in a manner described in detail heretofore in connection with the embodiment of FIGS. 1 to 19, inclusive.

In FIG. 38 of the drawings there is shown in schematic diagram form a switch type VHF tuner which may be employed in the tuning system of FIGS. 1 to 19, inclusive, in place of the VHF tuner 52 which is of the turret or individual tuning panel type.

Referring to FIG. 38 the VHF tuner shown therein comprises a series of switch wafer sections 620, 622, 624 and 626 and a VHF-UHF switching wafer 628. The switch wafer 620 acts as the input tuning section for a transistor type RF amplifier 630 and the switch section 622 acts as the output tuning means for the amplifier 630. A transistor 632 acts as the mixer of the VHF tuner of FIG. 38 and the switch wafer 624 tunes the input of this mixer circuit to the individual VHF channels. A transistor 634 is operated as the VHF oscillator and the switch wafer section 626 incrementally tunes the oscillator 634 to the individual VHF channels.

Each of the switch wafers 620, 622, 624 and 626 is of the double-contact rotor type shown in Valdettaro et al U.S. Pat. No. 3,407,669 wherein individual inductance coils are incrementally added in each switch wafer tuning circuit as the selector shaft 42 is rotated to different VHF detent positions. More particularly, referring to the switch wafer section 620, a double contact rotor section 636 is arranged to rotate with the common selector shaft 42. The rotor 636 moves between a segmented stator ring comprising the segments 638a and 638b, and a series of individual stator contacts 640 corresponding to the twelve VHF channels. The incremental tuning coils 642 corresponding to VHF channels 7 to 12 are connected between the stator contacts 640 and an inductance coil 644 for VHF channel No. 13 is connected between the upper stator contact 640 and a capacitor 646 which is connected to the base or input electrode of the RF amplifier 630. The low frequency VHF channels Nos. 2 to 6 are tuned by means of the incremental inductance coils 648 which are connected between the lower set of five stator contacts 640.

In the channel 13 position shown in FIG. 38, the tuning coil 644 is connected through the stator contact 640a, the rotor 636 and the upper stator segment 638a, the conductor 650 and a matching coil 652 to ground. As the shaft is rotated to different lower frequency VHF channels the rotor 636 is progressively moved to different ones of the stator contacts 640. When the channel 6 coil 648 is connected to the rotor 636, this rotor is also connected to the stator segment 638b which is connected through a capacitor 654 to the upper side of the matching coil 652 so as to provide additional tuning impedance for the lower frequency VHF channels, as will be readily understood by those skilled in the art.

In the system of the present invention the common selector shaft 42 is provided with twenty-four detent positions and none of the incremental VHF tuning coils 642, 648, etc. should be connected to the input of the RF amplifier 630 in the UHF detent positions of the shaft 42. The UHF detent positions of the shaft 42 are indicated in FIG. 38 by the dots 656 and it will be seen that the rotor 636 is not connected to any of the stator contacts 640 when the shaft 42 is in these UHF positions. However, it is important that the contacts 658 carried by the rotor 636 and the stator contacts 640 are of the break-before-make type so that when the rotor 636 is detented at a UHF position 656 the contacts 658 carried thereby will not contact any of the stator contacts 640.

The output of the RF amplifier 630 is tuned by means of the switch section 622, the coil 660 acting as the channel 13 tuning coil for the output of the RF amplifier 630. The switch section 622 is similar in construction to the section 620 described in detail heretofore. In a similar manner, the input of the mixer 632 is tuned by the switch section 624, the coil 662 acting as the channel 13 coil for this mixer input.

The oscillator 634 is provided with a fine tuning inductance 664 which may be adjusted by any suitable means, such as a brass slug within the coil, or the like. In the event that memory fine tuning is provided for VHF reception, as described in detail heretofore in connection with the embodiment of FIGS. 1 to 19, inclusive, a memory wheel may be mounted on the selector shaft 42, this wheel being provided with a series of adjustment screws corresponding to the screws 242 of the individual tuning panels in the embodiment of FIGS. 1 to 19, inclusive. A pivotally mounted camming plate is arranged to adjust the core of the fine tuning inductance 664 in accordance with the adjusted position of each screw on the memory wheel. Such a VHF memory fine tuning arrangement is shown, for example, in Badger U.S. Pat. No. 3,218,588. In this Badger patent the individual adjustment screws on the memory wheel are adjusted by means of a pull-down fine tuning mechanism. However, it will be understood that the memory fine tuning arrangement of FIGS. 1 to 19, inclusive, wherein the elements 168, 228 and 234 are employed in a push-to-engage arrangement to adjust the individual adjustment screws may equally well be employed to adjust the inductance of the coil 664 in each of the VHF positions of the shaft 42. In the alternative, a separating gear type memory fine tuning arrangement, such as shown in Badger U.S. Pat. No. 3,183,726, may equally well be employed to adjust the individual adjustment screws on the memory wheel in the embodiment of FIG. 38 of the present invention, as will be readily understood by those skilled in the art.

The VHF-UHF switch section 628 is of standard wafer switch construction wherein the rotor sections 670, 672, which are positioned on the selector shaft 42, are provided with twelve equally spaced radially outwardly extending fingers 674, 676, respectively, which cooperate with fixed stator contacts to provide the necessary IF and B plus switching. More particularly, when the switch section 628 is in a VHF detent position, as shown in FIG. 38, the rotor ring 670 is connected to a long stator contact 678 but is not connected to a short stator contact 680 which is arranged to be connected to one of the fingers 674 in the UHF positions. Accordingly, in the alternate detent positions assigned to VHF, no UHF signal is applied to the input of the amplifier 630. In a similar manner, the rotor ring 672 is connected to a long stator contact 682 at all times but this ring is not connected to a short stator contact 684 in the alternate detent positions assigned to VHF (as shown in FIG. 38) so that no B plus voltage is supplied to the terminal 327 of the UHF tuner 50 in these detent positions.

When the shaft 42 is moved to one of the detent positions assigned to UHF, the stator contact 678 is connected to the stator contact 680 through one of the fingers 674 so that the UHF IF signal is supplied by way of the conductor 330, the matching coil 334, the stator contacts 678, 680 and a capacitor 686 to the base of the transistor 630. In a UHF position of the shaft 42 no VHF tuning coils are connected to the input of the amplifier 630 because the rotor section 636 is not connected to any of the stator contacts 640 in the UHF detent positions 656 of the switch section 620. The VHF tuning coils are also removed in the switch sections 622, 624 and 626 in the UHF detent positions of the shaft 42.

The amplifier 630 is operated as a forty-Mhz amplifier for the UHF tuner IF output signal in the UHF detent positions of the shaft 42, a capacitor 677 connected from the stator contact 678 to ground and a capacitor 679 connected from the base of the transistor 630 to ground cooperating with the coil 334 to tune the input of the amplifier 630 to forty Mhz.

When the shaft 42 is in a UHF detent position the stator contact 682 is connected to the stator contact 684 through one of the fingers 676 on the rotor 672 and supplies a B plus energizing potential from the terminal 688 and through the resistors 690 and 692 to the UHF B plus output terminal 694. In this connection it will be understood that in the embodiment of FIG. 38 the associated UHF tuner 50 is selectively energized and de-energized by supplying a B plus voltage to the collector of the transistor oscillator 326 in the UHF tuner rather than by grounding the base of the transistor 326 as described in previous embodiments.

In the UHF positions of the shaft 42, the VHF oscillator 634 is de-energized since the double contact rotor element 696 of the oscillator switch section 626 is not then connected to any of the stator contacts 698 of this oscillator switch section. B plus voltage for the transistor 634, which is normally supplied through the coil 664 to the collector of the transistor oscillator 634 is thus removed.

In the UHF positions of the shaft 42, the transistors 630 and 632 act as amplifiers for the UHF-IF signal. To this end the transformer 698 is provided, the primary winding 700 of this transformer being connected to the collector of the transistor 630 and the secondary winding 702 thereof being connected to the base of the transistor 632. A suitable 40-Mhz IF output signal is derived from the collector of the transistor 632 for both VHF and UHF reception, by means of the tuning coil 704, this IF output signal being supplied through the capacitor 706 to the IF output terminal 708.

Referring now to FIGS. 39 to 44, inclusive, an alternative embodiment of the VHF-UHF tuning system of the present invention is shown wherein a different method of driving and fine tuning the UHF portion of the VHF-UHF tuning system is provided. More particularly, the UHF tuner 50a of the embodiment of FIGS. 39 to 44, inclusive, is mounted on the rear end of the VHF tuner portion 52a by means of a U-shaped bracket 710 which is secured to the rear wall 68a of the VHF tuner 52a by means of the screws 712. The housing 116a of the UHF tuner is pivotally mounted on the U-shaped bracket 710 by means of a transversely extending rod 714 which is secured to the top wall of the housing 116a by means of a pair of mounting brackets 716 which are secured to the side walls of the housing 116a by any suitable means such as soldering or the like, the outer ends of the rod 714 extending through a pair of washers 718 and through suitable openings 720 in the opposed walls of the U-shaped bracket 710.

The UHF tuner 50a is generally similar to the UHF tuner 50 described in detail heretofore in connection with the embodiment of FIGS. 1 to 19, inclusive. However, the UHF tuner 50a is arranged to be driven by a worm and worm wheel arrangement from the common selector shaft 42a rather than through the pinion gears 74, 76, 80 and 82 as in the embodiment of FIGS. 1 to 19, inclusive. More particularly, the selector shaft 42a is rotatably mounted in the rear wall 68a of the VHF tuner 52a and has a worm drive element 722 secured to the end thereof by means of the set screw 724. The worm 722 is in engagement with a worm wheel 726 which is mounted on the rotor shaft 72a of the UHF tuner 50a. The worm wheel 726 is secured to the rotor shaft 72a by any suitable means such as soldering, or the like, so that upon rotation of the common selector shaft 42a to different UHF positions of this shaft the tuning elements 426, 427 etc. carried by the rotor shaft 72a are rotated to receive different UHF stations, the worm 722 and worm wheel 726 providing the necessary stepdown ratio between the selector shaft 42a and the rotor shaft 72a so that the entire UHF band is covered by rotating the shaft 42a through somewhat more than five revolutions, as described in detail heretofore in connection with the embodiment of FIGS. 1 to 19, inclusive.

In order to provide a fine tuning function for th UHF tuner 50a, the common selector shaft 42a is made hollow and a UHF fine tuning shaft 730 is rotatably mounted within the hollow selector shaft 42a and extends throughout the length of the shaft 42a. The forward end of the UHF fine tuning shaft 730 has a separate centrally located fine tuning knob 732 secured thereto which can be rotated independently of the common selector knob 734 which is secured to the end of the selector shaft 42a. The rear end of the UHF fine tuning shaft 730 is provided with a threaded portion 736 of slightly reduced diameter which is in engagement with internal threads on the worm 722 which is secured to the selector shaft 42a. A bracket 738 is secured to a transverse partition 740 of the housing 116a of the UHF tuner 50a, the bracket 738 being biased into engagement with the end of the threaded portion 736 of the fine tuning shaft 730 by means of a pair of coil springs 742. More particularly, the coil springs 742 are connected to a pair of studs 744 which are provided at forward bottom corners of the housing 116a, the other ends of the springs 742 being connected to a pair of lugs 746 which are struck out of the bracket 710.

The common selector shaft 42a is detented in twenty-four equally spaced detent positions by means of a detent wheel 748 which is secured to the selector shaft 42a by means of the set screw 750, the end of the detent spring 274a cooperating with the detent wheel 748 to provide these equally spaced detent positions during successive revolutions of the shaft 42a, as described in detail heretofore in connection with the embodiment of FIGS. 1 to 19, inclusive.

When the selector shaft 42a is rotated to different UHF positions the worm 722 is also rotated which causes advancement of the worm wheel 726 and corresponding movement of the rotor shaft 72a. During these station selecting operations the fine tuning shaft 730 rotates with the selector shaft 42a, due to the frictional drag between the shafts 730 and 42a throughout the length thereof and due to the frictional engagement between the threaded end portion 736 and the internal threads of the worm 722. Accordingly, during a station selecting operation the threaded end portion 736 merely rotates with respect to the bracket 738 and does not function to change the position of the pivotally mounted housing 116a. After a desired UHF station has been selected the common selector shaft 42a, and hence the worm 722, remains fixed in this detented position.

When it is desired to effect a UHF fine tuning operation at a particular station detent position of the shaft 42a, the fine tuning shaft 730 is rotated by manipulation of the centrally located fine tuning knob 732. When this occurs, the threaded end portion 736 is moved axially with respect to the worm 722 and since the threaded end portion 736 is held in engagement with the bracket 738 by means of the coil spring 742, the housing 116a is rocked about the fulcrum formed by engagement of the ends of the rod 714 with the openings 720 in the bracket 710. Preferably, the openings 720 are provided with right angle edges 752 and 754 and the coil springs 742 function to bias the ends of the rod 714 into engagement with the surfaces 752, 754 so that a very accurate pivot having minimum friction is provided for the housing 116a.

As the housing 116a is thus rocked about the pivot rod 714, the worm 722 remains fixed in position and since the worm 722 is in engagement with the top of the worm wheel 726, when the housing 116 is rocked a slight rotation of the rotor shaft 72a and corresponding movement of the rotor tuning elements 426, 427, etc. relative to the fixed tuning elements 425, 431, etc. is produced. The pitch of the threaded portion 736 is chosen so as to provide a desired amount of rocking motion of the housing 116a, and consequent rotation of the rotor shaft 72a, for a given angular rotation of the fine tuning shaft 730. By way of example, and not in any sense by way of limitation, it has been found that the worm 722 and worm wheel 726 may have a tep down ratio of approximately 12 to 1, and the threaded portion 736 has a pitch of 100 threads per inch. The UHF tuner 50a is in other respects similar to the UHF tuner 50 described in detail heretofore. However, since the housing 116a is physically separated from the housing of the VHF tuner portion 52a in the embodiment of FIGS. 39 to 44, inclusive, it is necessary to supply the UHF IF signal produced by the tuner 50a to the 40-Mhz IF input of the VHF tuner 52a by means of a coaxial cable, this cable being connected from the UHF IF output connector 760 (FIG. 39) provided on the tuner housing 116a and the UHF IF input connector 762 which is mounted on the chassis of the VHF tuner portion 52a.

Considering now the manner in which a VHF fine tuning operation is performed in the embodiment of FIGS. 39 to 44, inclusive, a VHF fine tuning knob 764 which is positioned outside of the common selector knob 734 and is independent of the centrally located UHF fine tuning knob 732, is rotatably mounted on the common selector shaft 42a and is employed to drive a fine tuning sleeve 766 which is also rotatably mounted on the selector shaft 42a immediately ahead of the front wall 104a of the VHF tuner 52a. A planetary gear driving arrangement indicated generally at 768 is employed to couple the VHF fine tuning knob 764 and the sleeve 766.

In general, this planetary driving mechanism is similar to that described in detail in Badger et al U.S. Pat. No. 3,982,187 and reference may be had to said Badger et al patent for a detail description of this planetary drive mechanism. For the purposes of the present invention, it may be stated that a housing section indicated generally at 770 is secured to the common selector shaft 42a by means of the set screw 772. The housing 770 rotatably mounts a series of three planetary spindle elements 774 having gear teeth 776 and 778 on opposite ends thereof. The gear teeth 778 of the planetary spindle 774 mesh with an input driving gear 780 formed integrally with the fine tuning knob 764. Similarly, the gear teeth 776 on the spindles 774 engage an output driving gear 782 formed integrally with the fine tuning sleeve 766. An outer housing member 784 is provided with the fexible fingers 786 which are arranged to snap into engagement with a rearwardly extending flange portion 788 of the housing 770 so that a totally enclosed structure is provided.

When the common selector shaft 42a is positioned at any one of the VHF detent positions thereof and the VHF fine tuning knob 764 is rotated, the gear 780 rotates the spindles 774 which in turn rotate the fine tuning sleeve 766. In the embodiment of FIGS. 39 to 44, inclusive, a VHF memory fine tuning arrangement is provided for the VHF tuner 52a which is of the type described in Badger U. S. Pat. No. 3,183,726 and reference may be had to said Badger patent for a detailed description of such a memory fine tuning arrangement. For the purposes of the present invention it may be stated that a staggered gear input driving element 790 is formed integrally with the fine tuning sleeve 766. The staggered gear teeth on the driving element 790 engage corresponding teeth 792 and 794 on an output member 796 which is rotatably mounted on the post portion 798 of a pivotally mounted lever 800. The output member 796 is provided with gear teeth 802 which are adapted to engage the gear teeth 242 on the tuning screw 244 which is mounted in the end of each of the tuning sticks 58. When the tuning sleeve 766 is rotated, the initial rotation of the driving element 790 forces the lever 800 outwardly so that the gear 802 is moved into engagement with the gear 242 on the tuning stick 58. Upon further rotation of the VHF fine tuning knob 764, the tuning screw 244 may be rotated so as to adjust the frequency of the VHF oscillator by changing the impedance of the oscillator coil 246 which is wound on the stick 58. When the VHF fine tuning knob 764 is released the lever 800 is biased by means of the spring 238a so that the gear 802 is moved out of engagement with the tuning screw gear 242. Accordingly, the tuning of the stick 58 is maintained without further fine tuning adjustment until another fine tuning adjustment is desired for that particular VHF station.

In the embodiment of FIGS. 39 to 44, inclusive, the planetary gear coupling mechanism 768 is provided so that the outer VHF fine tuning knob 764 may be employed to provide a VHF fine tuning operation as described in detail heretofore, while at the same time permitting the common selector shaft 42a to drive directly a common VHF-UHF dial indicator indicated generally at 86a. More particularly, the housing 770 is provided with a gear element 804 which is formed in the periphery of the flange portion 788 and cooperates with a crown gear 806 to drive the filmstrip 816 of the common dial indicator 86a. A bracket 808 is mounted on the front wall 104a of the VHF tuner 52a by means of the screws 810 and the dial indicator 86a is mounted on the bracket 808 through an intermediate spacer block 812 by means of the screw 814.

The dial indicator 86a is generally similar to the dial indicator 86 described heretofore in connection with the embodiment of FIGS. 1 to 19, inclusive, and the VHF and UHF channel numbers on the strip 816 are arranged generally similar to the strip 92 described heretofore, it being noted that the strip 816 is of somewhat less width than the strip 92 so that the dial indicator 86a is of smaller overall width than the indicator 86. In this connection it will be understood that the strip 816 is preferably arranged to be viewed through a viewing window in the associated television cabinet, similar to the window 96 in the embodiment of FIGS. 1 to 19, inclusive, so that only a single VHF or UHF channel number is visible through this window for any given VHF or UHF detent position of the common selector shaft 42a.

Referring now to FIGS. 45 to 50, inclusive, of the drawings, an alternative embodiment of the present invention is therein disclosed wherein a memory fine tuning arrangement is provided for the UHF channels. The embodiment of FIGS. 45 to 50, inclusive, is generally similar to the embodiment of FIGS. 1 to 19, inclusive, described in detail heretofore and the same reference characters have been applied to elements which correspond to the embodiment of FIGS. 1 to 19, inclusive, in describing the embodiment of FIGS. 45 to 50, inclusive. In the embodiment of FIGS. 45 to 50, inclusive, the common VHF-UHF fine tuning knob 48 is normally biased to a forward position in which it is ineffective to perform either a VHF fine tuning operation or a UHF fine tuning operation. When the common fine tuning knob 48 is moved to a rearward position, rotation of this knob is effective to perform either a VHF fine tuning operation or a UHF fine tuning operation depending upon the detent position of the common selector shaft 42 at that time. Furthermore, facilities are provided for memorizing the adjusted position of either the VHF tuner 52 or the UHF tuner 50 during periods when the fine tuning knob 48 is disengaged from the respective VHF and UHF fine tuning mechanisms.

The common fine tuning knob 48 is secured to the end of a first fine tuning sleeve 820 which is rotatably mounted on the selector shaft 42 and may be moved axially with respect thereto. The sleeve 820 is provided with gear teeth 780a which are adapted to engage the teeth 778a of the three spindles 742a of a planetary gear coupling mechanism 768a which is generally similar to the mechanism 768 described heretofore in connection with the embodiment of FIGS. 39 to 44, inclusive. However, in the coupling mechanism 768a the housing 770a thereof, which is secured to the shaft 42 by means of the pin 822, has the end rings 824 and 826 thereof separated by an amount sufficient to permit the spindles 742a to be slid along the length of the shaft 42 when the knob 48 is pushed inwardly by the operator. The gear teeth 776a of the spindles 742a engage the gear teeth 782a of a second fine tuning sleeve 828 which is rotatably and slidably mounted on the selector shaft 42 and is provided with the annular series of gear teeth 220 at the rear end thereof which are adapted to engage the teeth 222 on the tiltable VHF fine tuning member 168 of the VHF fine tuning mechanism described in detail heretofore in connection with the embodiment of FIGS. 1 to 19, inclusive. Accordingly, when the knob 48 is pushed rearwardly to the common VHF-UHF fine tuning position the flange portion 830 on the rear end of the fine tuning sleeve 820 engages the spindles 742a and moves them rearwardly, these spindles in turn engaging the sleeve 828 so as to cause rearward movement of this sleeve to a VHF fine tuning position in which the gear teeth 220 and 222 are fully in mesh. Such position has been illustrated previously in connection with the embodiment of FIGS. 1 to 19, inclusive, in FIG. 11. When the fine tuning knob 48 is released the coil spring 160 moves the members 828, 742a and 820 and 48 back to their normally disengaged positions shown in FIG. 46.

Considering now the manner in which a UHF fine tuning operation is performed in the embodiment of FIGS. 45 to 50, inclusive, a UHF memory wheel indicated generally at 832 is provided with a series of twenty-four equally spaced individually adjustable cam members 834 about the periphery thereof. Each of the cam members 834 is provided with a shaft portion 836 which is rotatably mounted in the openings 838 in the periphery of the wheel 832, the wheel 832 being provided with notches 840 between each cam member 834 so as to provide flexible wall portions 842 which grip the shaft portions 836 with a predetermined force so as to retain the members 834 in adjusted position. Each of the members 834 is provided with an eccentric cam flange 844 on one end thereof and a head portion 846 at the other end thereof, each of the head portions 846 having a cone-shaped forwardly facing surface 848 which terminates in a screwdriver slot 850.

The UHF memory wheel 832 is rotatably mounted eccentrically with respect to the selector shaft 42 by means of a retaining member 852 which is mounted on the front wall of the bracket 140 by means of the screws 854. The memory wheel 832 rides on the front surface of the forward wall of the bracket 140 and is provided with an internal ring gear 856 the teeth of which ride in an annular rearwardly facing notch portion 858 of the support member 852 so that the wheel 832 may be rotated about a center which is offset with respect to the shaft 42.

The UHF memory wheel 832 is arranged to be driven from the common selector shaft 42 at a rate such that a different one of the cam members 834 will be moved into a UHF fine tuning adjustment position when the common selector shaft 42 is rotated two detent positions, i.e. from one UHF station position to the next. Furthermore, the UHF memory wheel 832 is arranged to be rotated approximately three revolutions as the common selector shaft 42 is moved through somewhat more than five revolutions to cover the entire UHF television band of seventy stations. This means that the same memory cam member 834 will be presented to the UHF adjustment position when different UHF stations are being received. However, these different UHF stations are spaced more than twenty-four UHF channels apart. Accordingly, it is highly unlikely that the same cam member 834 will be called upon to adjust two different UHF channels in the same receiving area. In order to drive the memory wheel 832 at the desired rate, the body portion 770a of the planetary drive coupling mechanism 768a which is secured to the shaft 42 by means of the pin 822, is provided with the external gear 860 which meshes with the teeth of the internal ring gear 856 of the memory wheel 832, the supporting member 852 being provided with a cutout portion 862 to provide clearance for the gear 860.

Considering now the manner in which the UHF cam members 832 may be individually adjusted when they are moved to the UHF adjusting position by rotation of the common selector shaft 42, a screwdriver support member indicated generally at 864 is secured to the bracket 140 by means of the screws 866, the member 864 being positioned offset with respect to the selector shaft 42. The member 864 is provided with a central opening 868 which is positioned in alignment with that one of the cam members 834 of the memory wheel 832 which is positioned at the nine o'clock position of the memory wheel 832 as viewed in FIG. 45, for any particular UHF position of the common selector shaft 42.

The central opening or bore 868 is arranged to receive the end portion of a sleeve 870 which is rotatably mounted in an offset flange portion 872 of a sleeve 874 which is mounted on and moves with the fine tuning sleeve 820. 1A screwdriver adjustment member 876 is slidably mounted within the sleeve 870 and is provided with a screwdriver tip 878 which is adapted to be received in the screwdriver slot 850 of one of the cam members 834. The adjustment member 876 is prevented from rotating with respect to the sleeve 870 by means of a transversely extending pin 880 which is secured to the member 876 and extends outwardly through the slot 882 formed in the sleeve 870. A coil spring 884 normally biases the adjustment member 876 forward with respect to the sleeve 870 to the point at which a second pin 886 on the adjustment member 876 strikes the forward end of the slot 882, as shown in FIG. 46. The sleeve 874 is mounted on the fine tuning sleeve 820 between a spur gear 888, which is formed integrally with the fine tuning sleeve 820, and a C washer 890 which is positioned in a groove in the fine tuning sleeve 820. The gear 888 is in mesh with an idler gear 892 which is rotatably mounted on a headed post 894 which is mounted in the offset flange portion 872 of the sleeve 874. The idler gear 892 is in mesh with the spur gear teeth 896 which are formed integrally with the sleeve 870, it being noted that the sleeve 870 is rotatably mounted on the end of the flange 872 and is held in place thereon by means of the C washer 898.

When it is desired to effect a UHF fine tuning operation, the common fine tuning knob 48 is moved rearwardly. When this occurs the sleeve 874 which is mounted on the fine tuning sleeve 820 is moved rearwardly and the end portion of the sleeve 870 moves rearwardly within the opening 868 in the guide member 864. The screwdriver adjustment member 876 is also advanced until the screwdriver tip portion 878 thereof is seated in a screwdriver slot 850 in the cam member 834 which is positioned opposite the opening 868.

When the fine tuning knob 48 is rotated while in its rearward position, the sleeve 870 is correspondingly rotated by means of the gears 888, 892 and 896 so that the cam member 834 which is engaged by th screwdriver tip 878 is rotated. A UHF fine tuning rod 190a, which is generally similar to the rod described in detail heretofore in connection with the embodiment of FIGS. 1 to 19, inclusive, is provided with an offset end portion (FIG. 47) which is biased into engagement with the eccentric head portion 844 of the active cam member 834 which is in engagement with the screwdriver adjustment member 876. The other end of the fine tuning rod 190 is generally similar to the end portion 204 of the tuning rod 190 in the embodiment of FIGS. 1 to 19, inclusive, this end portion 204 entering the oscillator coil 210 of the UHF tuner 50 so as to change the inductance thereof. However, since the eccentric head portion 844 of each cam member 834 causes a relatively small variation in the physical position of the end portion 204, it is necessary to provide a somewhat larger mass of the head portion 204 within the coil 210 so that for a given displacement of the cam member 834 the desired change in fine tuning of the UHF tuner 50 is provided, as will be readily understood by those skilled in the art.

The fine tuning rod 190a is biased in the opposite direction from the tuning rod 190 in the embodiment of FIGS. 1 to 19, inclusive, so that the end portion 900 of the rod 190a is continuously urged against the periphery of the cam head 844 of the active cam member. To this end, a flat spring 193a is provided with an end portion 902 which engages an upwardly extending V-shaped portion 904 in the rod 190a (similar to the V-shaped portion 194 of the tuning rod 190) and urges the end portion 900 of the rod 190a against the periphery of the cam 844 of the active cam member.

After the UHF fine tuning operation has been completed the fine tuning knob 48 is released and the coil spring 160 returns the members 828, 742a and 820 to their initial position shown in FIG. 46. During this movement the sleeve 874 and hence the screwdriver adjustment member 876 is withdrawn to the position shown in FIG. 46 wherein the screwdriver tip 878 is out of engagement with any of the cam members 834.

In accordance with an important aspect of the embodiment of FIGS. 45 to 51, inclusive, facilities are provided for preventing adjustment of one of UHF cam members 834 when the common selector shaft 42 is in any of the alternate VHF detent positions of this shaft. More particularly, when the shaft 42 has been moved to a VHF position, and the fine tuning knob 48 is moved rearwardly, the memory wheel 832, which is geared to the selector shaft 42 through the gears 860, 856, is adjusted to a position in which the screwdriver tip 878 is in between two of the cam members 834, as shown in FIGS. 49 and 50. Accordingly, when the fine tuning knob 48 is moved to a rear position the screwdriver tip 878 engages the edges of two adjacent cam members 834, as shown in FIG. 49. As the fine tuning knob 48 continues to be moved rearwardly so as to bring about engagement of the teeth 220 and 222 to effect a VHF fine tuning operation as described heretobefore, the screwdriver adjustment member 876 is moved with respect to the sleeve 870 against the force of the coil spring 884 which becomes compressed, as shown in FIG. 49. The additional movement permitted by recession of the adjustment member 876 within the sleeve 870 is sufficient to permit engagement of the gear teeth 220 and 222 and movement of the lever 234 to the position in which the gear teeth 240 engage one of the VHF tuning screws 242 on one of the tuning sticks 58 in the VHF tuner 52. Upon rotation of the fine tuning knob 48 and adjustment of the VHF fine tuning screw 242 is thus made without causing a corresponding adjustment of one of the UHF memory cam members 834.

When the selector shaft 42 is in a UHF detent position and the common fine tuning knob 48 is moved to its rearward position the screwdriver 878 is positioned to enter the screwdriver slot 850 of the active one of the UHF cam members 834. However, when the shaft 42 is in a UHF detent position the gear 240 is positioned between the VHF fine tuning screws 244 on adjacent ones of the tuning sticks 58 so that as the lever 234 is moved outwardly to a position in which the member 228 strikes a bushing 910 mounted in the front wall 104 of the VHF tuner 52, the gear 240 is not moved outwardly by an amount sufficient to engage either of the adjacent tuning screws 242. At the same time, however, the fine tuning knob 48 is moved inwardly by an amount sufficient to cause engagement of the screwdriver tip 878 with one of the cam members 834 so as to provide a UHF memory fine tuning adjustment in this UHF position of the common shaft 42. It will thus be seen that in the embodiment of FIGS. 45 to 51, inclusive, a noninteractive fine tuning arrangement is provided for both VHF and UHF stations so that memory fine tuning is provided for both the VHF and UHF channels while preventing misalignment of one of the UHF cam members 834 when one of the adjustment screws 242 is adjusted, and vice versa.

In some instances it is desirable to provide an arrangement wherein rotation of the common fine tuning knob in a pedetermined direction during UHF fine tuning always produces an oscillator frequency change in the same direction. Conventionally, a clockwise rotation of the fine tuning knob causes the oscillator frequency to increase. In the embodiment of FIGS. 1 to 19, inclusive, the UHF cam surface 186 is symmetrical and the cam member 180 has no stop so that clockwise movement of the fine tuning knob 48 may produce either an increasing or a decreasing oscillator frequency, depending upon the position of the cam surface 186 at the time the UHF fine tuning operation is performed. The embodiment of FIGS. 1 to 19, inclusive, may be modified as shown in FIGS. 52 and 53 to insure that rotation of the knob 48 in a given direction during UHF fine tuning will always produce a change in oscillator frequency in the same direction.

Referring to FIGS. 52 and 53, the cam 180a is provided with a spiral cam surface 186a. A projecting stop portion 187 is provided on th cam member 180a which is adapted to engage either one of a pair of lugs 189 which are struck out of the front wall of the bracket 140. Rotation of the cam 180a is limited by the lugs 189 so that the cam member 180a is prevented from rotating more than about 270° and the oscillator frequency will be varied in the same direction throughout the range of the cam surface 186a. In the embodiment of FIGS. 32 to 36 the potentiometer 560 is provided with internal stops and hence UHF fine tuning in a given direction always produces a change in oscillator frequency in the same direction.

In FIGS. 54 and 55 an alternative embodiment of the invention is disclosed wherein the necessity to push in the common fine tuning knob 48 is eliminated. In this embodiment the fine tuning mechanism for both VHF and UHF is arranged so that rotation of the common knob 48 is sufficient to effect a fine tuning operation of either a VHF station or a UHF station depending upon the detent position of the common selector shaft. In the embodiment of FIGS. 54 and 55 a VHF memory fine tuning arrangement of the staggered gear type, similar to that shown in Badger U.S. Pat. No. 3,183,726 and described heretofore in connection with the embodiment of FIGS. 39 to 44, inclusive, is employed. In other respects the embodiment of FIGS. 54 and 55 is generally similar to the embodiment of FIGS. 1 to 19, inclusive, described in detail heretofore.

Referring to FIGS. 54 and 55, the common fine tuning sleeve 44a which carries the knob 48, is rotatably mounted on the selector shaft 42 and extends all the way back to the front panel 104a of the VHF tuner. The staggered gear input driving element 790a of the memory VHF fine tuning mechanism is formed integrally with the sleeve 44a so that rotation of the knob 48 when the selector shaft 42 is in a VHF detent position is effective to rotate the pivotally mounted lever 800 and bring the gear teeth 802 into engagement with the tuning screw 244 on the active one of the VHF tuning sticks 58. However, when the shaft 42 is in a UHF detent position and the knob 48 is rotated the lever 800 is pivoted outwardly but the gear teeth 802 are positioned between the tuning screws 244 of two adjacent tuning sticks 58 but is not in engagement with either tuning screw. Accordingly, rotation of the knob 48 when the shaft 42 is in a UHF position is effective only to provide a UHF fine tuning operation.

To provide a UHF fine tuning operation, a UHF fine tuning cam member 180a is loosely mounted on the fine tuning sleeve 44a. Rotation of the member 180a is arranged to effect a UHF fine tuning operation through movement of the rod 190, as discussed in detail heretofore in connection with the embodiment of FIGS. 1 to 19, inclusive. Like the cam member 180 in the embodiment of FIGS. 1 to 19, inclusive, the member 180a is provided with a cam surface 186 against which the end portion 200 of the rod 190 is urged and the member 180a is not provided with stops so that it may be rotated continuously. However, the member 180a is loosely mounted on the sleeve 44a and is driven from this sleeve through a lost motion connection. More particularly, a pair of radially extending pins 920 are mounted on the sleeve 44a and extend into V-shaped openings 922 and 924 in the rear face of the cam member 180a. The pins 920 are arranged to engage one side or the other of the openings 922, 924 depending upon the direction of rotation of the sleeve 44a.

When the selector shaft is in a UHF detent position and it is desired to effect a UHF fine tuning operation, the knob 48 is rotated and the pins 920 engage one side of the openings 922, 924 so that the cam member 180a is rotated and moves the rod 190 to produce a slight change in the oscillator frequency as described heretofore in connection with the embodiment of FIGS. 1 to 19, inclusive. This rotation of the sleeve 44a also causes the staggered gear drive element to move the lever 800 outwardly but since the selector shaft 42 is in a UHF detent position the gear 802 is positioned between two tuning sticks 58 and does not engage the tuning screws 242 on either stick so that no VHF fine tuning operation is erroneously made at the same time as the desired UHF fine tuning operation. However, after the UHF fine tuning operation is completed and the knob 48 is released it is necessary that the lever 800 be moved back to its initial position, under the force of the spring 238a, so that the gear 802 will be moved out of the path of the tuning screws 242 and the shaft 42 may thereafter be rotated to select a different VHF or UHF station without moving the tuning screws 242 on any of the tuning sticks 58. To this end, the lost motion provided by the openings 922, 924 permits the lever 800 to be returned to its initial position with consequent rotation of the sleeve 44a without engaging the cam member 180a. If the cam member 180a were directly connected to the sleeve 44a the frictional force of the rod 190 on the cam surface 186 might be enough to prevent the lever 800 from returning to its initial position. In this connection, it is noted that the staggered gear drive element 790a always rotates the sleeve 44a away from the side of the openings 922, 924 as the lever 800 is returned to its initial position irrespective of the direction of rotation of the sleeve 44a.

Since a memory fine tuning arrangement is provided for VHF in the embodiment of FIGS. 54 and 55, the common fine tuning knob 48 will be used primarily as a UHF fine tuning knob. This is because the correct VHF tuning adjustment is effectively memorized by adjusting the tuning screws 242 and once this adjustment is made it is not disturbed by making a UHF fine tuning adjustment, as described above.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. A television tuner arrangement for receiving signals in both the VHF and UHF television bands, comprising a combined VHF and UHF station selector shaft, detent means for establishing twenty-four equally spaced positions for said selector shaft, VHF tuner means operative in alternate ones of said positions to receive signals from different VHF television stations, UHF tuner means having a main tuning shaft rotation of which is effective in less than one revolution to receive signals from all of the television stations within the UHF band, means operative in the positions between said alternate positions for enabling said UHF tuner means, and means interconnecting said station selector shaft and said main tuning shaft so that rotation of said station selector shaft a plurality of revolutions causes said UHF tuner means to receive signals from all of the television stations within the UHF band, said VHF tuner means being operative repeatedly to receive the same VHF stations in said alternate positions during successive rotations of said station selector shaft.

2. The combination of claim 1, which includes dial indicator means connected to said selector shaft and arranged to provide an exact numerical indication of the channel number assigned to each UHF station in said UHF band in the detent positions between said alternate positions and a digital indication of the twelve VHF channel numbers assigned to stations in the VHF band which is repeated during successive revolutions of said selector shaft.

3. The combination of claim 1 which includes display means operative in said alternate positions to display the VHF channel number of the VHF station received by said VHF tuner means and operative in the positions between said alternate positions to display the UHF channel number of the UHF station received by said UHF tuner means during successive revolutions of said selector shaft.

4. A television tuner arrangement for receiving signals in both the VHF and UHF television bands, comprising a common VHF and UHF station selector shaft,
   detent means for establishing a plurality of equally spaced detent positions for said common selector shaft,
   VHF tuner means operative in a first group of said detent positions to receive different VHF television stations in the VHF band, and UHF tuner means operative in a different group of said detent positions to receive a different group of UHF television stations during successive rotations of said station selector shaft, said VHF tuner means being operative repeatedly to receive the same VHF television stations in said first group of detent positions during successive rotations of said station selector shaft.

5. A television tuner arrangement for receiving signals in both the VHF and UHF television bands, comprising a common VHF and UHF station selector shaft,
   detent means for establishing a plurality of equally spaced detent positions for said common selector shaft,
   VHF tuner means for receiving television stations in the VHF band, UHF tuner means for receiving television stations in the UHF band, and means responsive solely to rotation of said selector shaft for selectively controlling said VHF tuner means and said UHF tuner means to receive signals in a predetermined sequence in which said VHF tuner means receives the same VHF television stations repeatedly and said UHF tuner means receives each television station in the UHF band only once.

6. The combination of claim 5, which includes display means operative during said predetermined sequence to display in a repeated sequence the VHF channel number of the VHF stations received by said VHF tuner means and to display in a single sequence the UHF channel number of the UHF stations received by said UHF tuner means.

7. The combination of claim 5 wherein said predetermined sequence is carried out by rotating said selector shaft a plurality of revolutions.

8. A television tuner arrangement for receiving signals in both the VHF and UHF television bands, comprising a common VHF and UHF station selector shaft,
detent means for establishing a plurality of equally spaced detent positions for said common selector shaft,
VHF tuner means for receiving television stations in the VHF band, UHF tuner means for receiving television stations in the UHF band, and means responsive solely to rotation of said selector shaft for selectively controlling said VHF tuner means and said UHF tuner means to receive signals in a predetermined sequence in which all of the VHF stations are interspersed with different ones of a first group of UHF stations during a first increment of rotation of said common station selector shaft and all of the VHF stations are interspersed with different ones of a second group of UHF stations during a second increment of rotation of said common station selector shaft.

9. The combination of claim 8 which includes display means operative during said predetermined sequence to display at a common location the VHF and UHF channel numbers corresponding to the signals received by said VHF tuner means and said UHF tuner means.

10. A television tuner arrangement for receiving signals in both the VHF and UHF television bands, comprising a common VHF and UHF station selector shaft,
detent means for establishing a plurality of equally spaced detent positions for said common selector shaft,
VHF tuner means for receiving television stations in the VHF band, UHF tuner means for receiving television stations in the UHF band, and means responsive solely to rotation of said selector shaft for selectively controlling said VHF tuner means and said UHF tuner means to receive signals in a predetermined sequence in which the same VHF stations are repeatedly received by said VHF tuner means during successive rotations of said common station selector shaft and UHF stations from different groups within the UHF band are received by said UHF tuner means during said successive rotations of said common station selector shaft.

11. The combination of claim 10, which includes a viewing window, and means for displaying in said window the individual VHF and UHF channel numbers corresponding to the VHF and UHF stations selected during said predetermined sequence.

12. A television tuner arrangement for receiving signals in both the VHF and UHF television bands, comprising a common VHF and UHF station selector shaft,
detent means for establishing a series of one hundred forty detent positions of said shaft when said shaft is rotated through a predetermined increment of rotation, VHF tuner means operative in alternate ones of said detent positions repeatedly to receive the twelve VHF stations in the VHF band, and UHF tuner means operative in the detent positions between said alternate positions to receive in succession the seventy UHF stations in the UHF band.

13. A television tuner arrangement for receiving signals in both the VHF and UHF television bands, comprising a common VHF and UHF station selector shaft, detent means for establishing a plurality of equally spaced detent positions for said common selector shaft, VHF tuner means for receiving television stations in the VHF band, UHF tuner means for receiving television stations in the UHF band, and control means responsive to rotation of said common selector shaft for selectively controlling said VHF tuner means and said UHF tuner means to receive signals in a predetermined sequence in which the same VHF stations are received during different rotational increments of movement of said common selector shaft but are interspersed with different groups of UHF stations during said different rotational increments of said common selector shaft.

14. The combination of claim 13, which includes a viewing window, and means for displaying in said window the VHF and UHF channel numbers corresponding to the VHF and UHF stations selected during said predetermined sequence.

15. The combination of claim 13, which includes an elongated strip of material bearing channel numbers corresponding to each of the seventy UHF television stations and a plurality of groups of channel numbers each group corresponding to the twelve VHF television stations, and display control means for moving said elongated strip in accordance with said predetermined sequence.

16. The combination of claim 13, which includes an elongated strip of material bearing channel numbers corresponding to each of the seventy UHF television stations and a plurality of groups of channel numbers each group corresponding to the twelve VHF television stations, said VHF and UHF channel numbers being positioned along the length of said elongated strip in accordance with said predetermined sequence, means defining a viewing location, and display control means for moving said elongated strip past said viewing position in synchronism with rotation of said common station selector shaft.

17. The combination of claim 15, wherein said UHF channel numbers are positioned in one area extending along the length of said elongated strip and said groups of VHF channel numbers are positioned in a second area extending along the length of said elongated strip and laterally displaced from said first area.

18. The combination of claim 15, wherein said VHF channel numbers and said UHF channel numbers are positioned in an area extending along the length of said elongated strip and interspersed in accordance with said predetermined sequence.

19. The combination of claim 15 wherein said UHF channel numbers are displayed in a different color from said groups of VHF channel numbers.

20. The combination of claim 15 wherein said elongated strip has a dark background and said UHF channel numbers thereon are of a color different from said groups of VHF channel numbers.

21. The combination of claim 13, which includes first dial indicator means providing an exact digital indication corresponding to each UHF station received by said UHF tuner means, and second dial indicator means providing an exact digital indication corresponding to each VHF station received by said VHF tuner means.

22. The combination of claim 21, which includes means for presenting said first and second dial indications at a common viewing location in said predetermined sequence.

23. The combination of claim 21, wherein said first and second indicator means include VHF and UHF channel numbers on a common elongated medium, means defining a viewing position, and means for moving said medium past said view position so that said VHF and UHF channel numbers are displayed in said predetermined sequence.

24. The combination of claim 21, wherein said first dial indicator means comprises a rotatable member bearing the twelve VHF channel numbers, and means for rotating said member more than one revolution during said predetermined sequence.

25. The combination of claim 21, wherein said second dial indicator means comprises first and second concentric discs, said first disc having indicia corresponding to the units digits of the channel number assigned to UHF stations received by said UHF tuner means, said second disc having indicia corresponding to the tens digit of the channel number assigned to UHF stations received by Said UHF tuner means, and means interconnected with said common station selector shaft for driving said first and second discs to indicate the UHF stations in said predetermined sequence.

26. A television tuner arrangement for receiving both VHF and UHF television signals comprising, a common input shaft, detent means for establishing a plurality of equally spaced detent positions for said input shaft, UHF tuner means having a continuously variable main tuning shaft rotation of which is effective selectively to receive signals from all television stations in the UHF television band, gear means interconnecting said input shaft and said main tuning shaft so that said main tuning shaft is moved less than the width of one UHF channel when said input shaft is moved from one detent position to the next, VHF tuner means controlled by said common input shaft and operative to select different VHF stations in predetermined positions of said input shaft at which said UHF main tuning shaft is positioned between two adjacent UHF stations, and means for enabling said VHF tuner means to receive VHF stations and said UHF tuner means to receive UHF stations in a predetermined sequence in which said main tuning UHF tuner means is enabled when said main tuning shaft is positioned to receive each UHF station and said VHF tuner means is enabled when said main tuning shaft is positioned between two adjacent UHF stations, whereby all of the UHF stations in the UHF band may be received by rotating said input shaft a plurality of revolutions and the twelve VHF stations are repeatedly received during said plurality of revolutions of said input shaft.

27. The tuner arrangement set forth in claim 26, wherein said detent means establishes twenty-four detent positions of said input shaft for one revolution thereof, and said main tuning shaft is moved one-half of the width of one UHF channel when said input shaft is moved from one detent position to the next.

28. The tuner arrangement of claim 26, which includes digital indicator means connected to said input shaft and arranged to indicate the channel numbers of both VHF and UHF stations which said VHF and UHF tuner means receive in said predetermined sequence.

29. The tuner arrangement of claim 26, which includes a gear rotatable with said input shaft, an elongated strip of material bearing the channel numbers of all of the UHF stations in the UHF band, and means interconnected with said gear for moving said medium to indicate the channel number of each UHF station which said UHF tuner means receives when enabled in said predetermined sequence.

30. The tuner arrangement of claim 29, wherein said medium also bears VHF channel numbers which indicate the VHF station which said VHF tuner means receives when enabled in said predetermined sequence.

31. The tuner arrangement of claim 29, which includes means for indicating the VHF channel number of the VHF station which said VHF tuner receives when enabled in said predetermined sequence.

32. The tuner arrangement of claim 26, which includes a common VHF and UHF fine tuning shaft concentric with said input shaft, VHF fine tuning means controlled by said fine tuning shaft for fine tuning the VHF station which said VHF tuner means receives when enabled in said predetermined sequence, and UHF fine tuning means controlled by said fine tuning shaft for fine tuning the UHF station which said UHF tuner means receives when enabled in said predetermined sequence.

33. The tuner arrangement of claim 26, which includes a fine tuning shaft concentric with said input shaft, said UHF tuner means including an oscillator provided with a variable frequency determining element, and means responsive to rotation of said fine tuning shaft for varying said frequency determining element, thereby to fine tune said UHF tuner means to the UHF station which it receives when enabled in said predetermined sequence.

34. The tuner arrangement of claim 26, which includes a fine tuning shaft concentric with said input shaft, said UHF tuner means including an oscillator provided with a frequency determining oscillator coil, a rod pivotally mounted for movement about a predetermined axis and having an end portion which affects the tuning of said oscillator coil when said rod is pivoted about said axis, and means responsive to rotation of said fine tuning shaft for pivotally moving said rod about said axis.

35. The tuner arrangement of claim 26, which includes a fine tuning shaft concentric with said input shaft, said UHF tuner means including an oscillator provided with a frequency determining oscillator coil, a fine tuning member having an intermediate portion positioned parallel to said fine tuning shaft, a fine tuning cam on said fine tuning shaft, said member having one end portion in engagement with said fine tuning cam and another end portion positioned to affect the inductance of said coil, whereby rotation of said fine tuning shaft pivots said member about the axis of said intermediate portion and moves said other end portion relative to said oscillator coil.

36. The tuner arrangement of claim 26, which includes a fine tuning shaft concentric with said input shaft, said UHF tuner means including an oscillator provided with a frequency determining oscillator coil, a a support member having a pair of intersecting walls defining a trough which extends parallel to said fine tuning shaft, a fine tuning member having an elongated intermediate portion extending along said trough and in engagement with the walls thereof, a fine tuning cam on said fine tuning shaft and extending transversely thereof, said member having one end portion in engagement with the periphery of said fine tuning cam and other end portion extending in the vicinity of said oscillator coil, whereby upon rotation of said fine tuning shaft said intermediate portion is pivoted within said trough and said other end portion moved with respect to said oscillator coil to change the frequency of said oscillator.

37. The tuner arrangement of claim 36, wherein said intermediate portion of said fine tuning member is formed with a transversely extending projection, and spring means in engagement with said projection for holding said intermediate portion in engagement with the walls of said trough and said one portion in engagement with said cam.

38. The tuner arrangement of claim 37, wherein said spring means comprises a flat spring secured to one of said walls and having an aperture for receiving said projection, said flat spring also positioning said intermediate portion within said trough by engagment of said projection with the sides of said aperture.

39. The tuner arrangement of claim 26, wherein said VHF tuner means includes a fixed stator member carrying a plurality of stator contacts, means positioned on said input shaft for supporting a plurality of tuning panels individually arranged to be connected to said stator contacts in alternate detent positions of said input shaft, a fine tuning shaft concentric with said input shaft, VHF fine tuning means responsive to movement of said fine tuning shaft and operative to vary the tuning said VHF tuner means a gear mounted on said input shaft behind said VHF fine tuning means, and channel indicator means including second gear means in engagement with said gear for indicating the channel numbers of both VHF and UHF stations which said VHF and UHF tuner means receive in said predetermined sequence.

40. The tuner arrangement of claim 39, which includes a housing for enclosing said VFH tuner means and said gear, said gear having a diameter such that a portion of the periphery thereof extends through an opening in said housing.

41. The tuner arrangement of claim 40, wherein said second gear means comprises a crown gear in engagement with said gear and connected for rotation about an axis perpendicular to said input shaft.

42. The tuner arrangement of claim 41, wherein said channel indicator means includes an elongated strip of material bearing VHF channel numbers and UHF channel numbers in said predetermined sequence, means defining a viewing position which is diametrically opposite the point of engagement of said gear and said crown gear and means interconnecting said crown gear and said strip to move said strip past said viewing position so that VHF and UHF channel numbers are displayed in said predetermined sequence.

43. A television tuner arrangement for receiving both VHF and UHF television signals comprising, a VHF tuner having a main tuning shaft, detent means for establishing an even number of equally spaced detent positions for said main tuning shaft, said VHF tuner having tuning means effective in alternate detent positions of said main tuning shaft selectively to receive different VHF stations, a UHF tuner having a continuously variable rotor shaft rotation of which is effective selectively to receive all of the seventy UHF stations, means interconnecting said main tuning shaft and said rotor shaft and having a step-down ratio such that said rotor shaft is moved a distance equal to the width of one UHF channel when said main tuning shaft is moved a predetermined number of detent positions, and means for enabling said UHF tuner to receive UHF television signals in the detent positions of said main tuning shaft, other than said alternate positions, whereby all of the seventy UHF stations may be selectively received by rotating said main tuning shaft a plurality of revolutions.

44. The tuner arrangement of claim 43, wherein said UHF tuner includes a transistor oscillator having a base and a collector, means for continuously supplying a unidirectional supply voltage to said collector, and means for connecting said base to ground in said alternate detent positions of said main tuning shaft.

45. The tuner arrangement of claim 44, wherein said VHF tuner includes a fixed stator member carrying a plurality of stator contacts, means carried by said main tuning shaft for supporting a plurality of VHF tuning panels each of which includes a plurality of tuning coils which are connected to said stator contacts in said alternate positions of said main tuning shaft, means permanently connecting the base of said transistor oscillator to a first one of said stator contacts, means connecting a second one of said stator contacts to ground, and means carried by each of said tuning panels for electrically connecting said first and second stator contacts together in said alternate positions of said main tuning shaft, thereby to disable said oscillator in said alternate positions.

46. The tuner arrangement of claim 44, wherein said VHF tuner includes a fixed stator member carrying a plurality of stator contacts, means carried by said main tuning shaft for supporting a plurality of VHF tuning panels each of which includes a tuning coil which is connected to said stator contacts in said alternate positions of said main tuning shaft, means permanently connecting the base of said transistor oscillator to a first one of said stator contacts, means connecting a second one of said stator contacts to ground, said first and second stator contacts being connected to said tuning coil on one of said panels in said alternate positions of said main tuning shaft so that said base is connected to ground through said tuning coil and said UHF oscillator is disabled in said alternate positions of said main tuning shaft.

47. The tuner arrangement of claim 46, wherein said stator contacts are positioned so that they do not contact any of said VHF tuning panels in the detent positions of said main tuning shaft other than said alternate positions thereof, whereby said transistor base is ungrounded and said UHF tuner means enabled in said other detent positions.

48. The tuner arrangement of claim 47, wherein said tuning panels carry contacts having arcuate portions adapted to engage said stator contacts and said stator contacts each comprise a flat strip of metal secured to a stator bar of insulating material and forming a flatened loop extending transversely across said stator bar and having an upper central section which is engaged by said arcuate tuning panel contacts in said alternate detent positions, each of said stator contact loops having gradually inclined intermediate portions joining said central portion and the ends of the loops, said inclined portions having sufficient slope to prevent contact with the next VHF tuning panel contacts when said main tuning shaft is in said other detent positions while minimizing wear on said intermediate portions when engaged by said arcuate tuning panel contacts.

49. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, a common VHF and UHF fine tuning shaft concentric with said selector shaft and movable from a forward UHF fine tuning position to a rear VHF fine tuning position, VHF fine tuning means responsive to rotation of said common fine tuning shaft when in said rear position for fine tuning the VHF station to which said VHF tuner is tuned in said alternate detent positions, and UHF fine tuning means responsive to rotation of said common fine tuning shaft when in said forward position for fine tuning the UHF station to which said UHF tuner is tuned in said detent positions between said alternate detent positions.

50. The tuner arrangement of claim 49, wherein said UHF tuner includes an oscillator provided with a frequency determining oscillator coil, a UHF fine tuning member pivotally mounted for movement about an axis parallel to said selector shaft, means carried by said member for varying the impedance of said oscillator coil when said member is pivoted about said axis, and means responsive to rotation of said common fine tuning shaft when in said forward position for moving said member about said axis.

51. The tuner arrangement of claim 49, wherein said UHF tuner includes an oscillator provided with a frequency determining oscillator coil, a fine tuning member having an intermediate portion positioned parallel to said fine tuning shaft, a fine tuning cam on said fine tuning shaft, said member having one end portion in engagement with said fine tuning cam and another end portion positioned to affect the inductance of said coil, whereby rotation of said fine tuning shaft pivots said member about the axis of said intermediate portion and moves said other end portion relative to said oscillator coil.

52. The tuner arrangement of claim 49, wherein said selector shaft is provided with a recess extending along the length thereof, a UHF fine tuning member positioned within said recess, means interconnecting said member with said common fine tuning shaft when said fine tuning shaft is in said forward position, and means responsive to rotation of said UHF fine tuning member for actuating said UHF fine tuning means.

53. The tuner arrangement of claim 52, which includes means responsive to movement of said common fine tuning shaft from said forward to said rear position for disconnecting said common fine tuning shaft from said UHF fine tuning member.

54. The tuner arrangement of claim 52, wherein said interconnecting means includes an arcuate slot in said selector shaft and communicating with said recess, and a pin extending transversely through said slot and adapted to engage said common fine tuning shaft.

55. The tuner arrangement of claim 54, which includes an annular series of projections on said common fine tuning shaft, and means for biasing said projections into engagement with said pin, thereby to interconnect said common fine tuning shaft and said UHF fine tuning member when said common fine tuning shaft is in said forward position.

56. The tuner arrangement of claim 49, which includes a UHF fine tuning member mounted for rotation about the longitudinal axis of said selector shaft, means interconnecting said member with said common fine tuning shaft when said fine tuning shaft is in said forward position, and means responsive to rotation of said UHF fine tuning member for controlling said UHF fine tuning means.

57. The tuner arrangement of claim 56, which includes means responsive to movement of said common fine tuning shaft from said forward to said rear position for disconnecting said common fine tuning shaft from said UHF fine tuning member.

58. The tuner arrangement of claim 49, wherein said UHF tuner includes an oscillator provided with a voltage-responsive frequency determining element, a variable resistor coupled to said common fine tuning shaft when said common fine tuning shaft is in said forward position, means including said variable resistor for developing a variable control voltage, and means for supplying said variable control voltage to said frequency determining element.

59. The tuner arrangement of claim 58, wherein said variable resistor has an input shaft, first gear means mounted on said input shaft, and second gear means on said common fine tuning shaft and adapted to engage said first gear means when said common fine tuning shaft is in said forward position.

60. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, first automatic frequency control means for said VHF tuner means, second automatic frequency control means for said UHF tuner means, means for supplying an AFC control voltage to said first and second automatic frequency control means, a common AFC defeat switch for said first and second automatic frequency control means, and means for actuating said common switch to a disabling position when said selector shaft is moved from one of said detent positions to the next.

61. The tuner arrangement of claim 60, which includes a gear mounted on said selector shaft, and dial indicator means connected to said gear and adapted to indicate the channel numbers of the VHF and UHF stations received by said VHF tuner means and said UHF tuner means respectively during said plurality of revolutions of said common selector shaft, said actuating means including means in engagement with said gear for moving said common switch to said disabling position.

62. The tuner arrangement of claim 61, wherein said common switch includes a flexible member movable between an AFC operative position and an AFC disabling position, and a follower member biased into engagement with the periphery of said gear and connected to said flexible member so that said flexible memtions as said selector shaft is moved between said detent positions.

63. The tuner arrangement of claim 60, wherein said VHF tuner means includes a chassis, a pair of feed-through capacitors mounted on said chassis and having central conductors, means for supplying said AFC control voltage to said central conductors, said AFC defeat switch including a pair of contact carrying members, and means for physically supporting said AFC defeat switch on said feedthrough capacitors with said contact carrying members electrically connected to said central conductors.

64. The tuner arrangement of claim 63, wherein said supporting means comprises a pair of flat, conductive strips connected to said contact carrying members.

65. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, first automatic frequency control means for said VHF tuner means, second automatic frequency control means for said UHF tuner means for said UHF tuner means, means for supplying an AFC control voltage to said first and second automatic frequency control means, a disc member carried by said selector shaft and having a series of notches in the periphery thereof corresponding to said equally spaced detent positions, a switch actuating member biased into engagement with the notched periphery of said disc, and a common AFC defeat switch controlled by said actuating member for alternately disabling said first and second automatic frequency control means as said selector shaft is rotated.

66. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, first automatic frequency control means for said VHF tuner means, second automatic frequency control means for said UHF tuner means, means for supplying an AFC control voltage to said first and second automatic frequency control means, a common AFC defeat switch for said first and second automatic frequency control means, fine tuning means for said VHF tuner means and including a knob which is movable from a forward to a rear position for fine tuning said VHF tuner, and means for actuating said common switch to a disabling position in response to movement of said knob to said rear position.

67. A television tuner arrangement for receiving both VHF and UHF television signals comprising, a UHF tuner having a housing within which is positioned a continuously variable main tuning shaft, tuning elements carried by said main tuning shaft so that rotation of said main tuning shaft is effective selectively to receive all of the seventy UHF stations, said UHF tuner having mixer means for developing an IF signal and connected to UHF IF terminal on one wall of said UHF tuner housing, VHF tuner means for selectively receiving any one of the twelve VHF stations and including a VHF antenna input circuit normally connected to an input stage of said VHF tuner means, VHF housing means including at least a portion of said one wall of said UHF tuner housing for electrically shielding said VHF tuner means, and means positioned entirely within said VHF housing means for selectively connecting said IF terminal to said input stage of said VHF tuner means in place of said VHF antenna input circuit.

68. A television tuner arrangement for receiving both VHF and UHF television signals comprising, a UHF tuner having a housing within which is positioned a continuously variable main tuning shaft, tuning elements carried by said main tuning shaft so that rotation of said main tuning shaft is effective selectively to receive all of the seventy UHF stations, said UHF tuner having mixer means for developing an IF signal and connected to a UHF IF terminal on one wall of said UHF tuner housing, VHF tuner means for selectively receiving any one of the twelve VHF stations and including a VHF antenna circuit normally connected to an input stage of said VHF tuner means, VHF housing means including at least a portion of said one wall of said UHF tuner housing for electrically shielding said VHF tuner means, said VHF tuner means having a main tuning shaft, detent means for establishing an even number of equally spaced detent positions for said VHF main tuning shaft, means for enabling said VHF tuner means selectively to receive VHF stations in alternate detent positions of said VHF main tuning shaft, and switching means for selectively connecting said IF terminal to said input stage of said VHF tuner means in place of said VHF antenna input circuit when said VHF main tuning shaft is in detent positions other than said alternate positions.

69. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, a common VHF and UHF fine tuning shaft concentric with said selector shaft, and means responsive solely to rotation of said common fine tuning shaft for performing a VHF fine tuning operation on said VHF tuner means when said common selector shaft is in one of said alternate detent positions and a UHF fine tuning operation on said UHF tuner means when said common selector shaft is in a detent position between said alternate detent positions.

70. The tuner arrangement of claim 69, which includes memory fine tuning means for said VHF tuner means having a plurality of individually adjustable members for different VHF stations, and means responsive solely to rotation of said common fine tuning shaft for selectively adjusting different ones of said individually adjustable members when said selector shaft is in one of said alternate detent positions.

71. The tuner arrangement of claim 70, which includes means for preventing adjustment of any of said individually adjustable members in response to rotation of said common fine tuning shaft when said selector shaft is in a detent position between said alternate detent positions.

72. The tuner arrangement set forth in claim 69, which includes a UHF fine tuning control member, means responsive to rotation of said control member for performing said UHF fine tuning operation on said UHF tuner means, and a lost motion connection between said UHF fine tuning control member and said common fine tuning shaft.

73. The tuner arrangement as set forth in claim 72, wherein said control member comprises a cam member concentric with said common fine tuning shaft, and means responsive to rotation of said cam member for performing said UHF fine tuning operation on said UHF tuner means, said lost-motion connection permitting movement of said common fine tuning shaft relative to said cam member.

74. The tuner arrangement as set forth in claim 72, wherein said control member comprises a cam member, and means responsive to rotation of said cam member for performing said UHF fine tuning operation on said UHF tuner means, said lost-motion connection permitting movement of said common fine tuning shaft relative to said cam member.

75. The tuner arrangement as set forth in claim 74, wherein said cam member is rotatable about an axis parallel to said common fine tuning shaft.

76. The tuner arrangement of claim 72, wherein said UHF fine tuning control member is concentric with said common fine tuning shaft.

77. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, said UHF tuner means including a transistor oscillator having a base and a collector, means for continuously supplying a unidirectional supply voltage to said collector, and means for connecting said base to ground when said common selector shaft is in said alternate detent positions.

78. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, said UHF tuner means including a transistor oscillator having a base and a collector, means for continuously supplying a unidirectional supply voltage to said collector, said VHF tuner means including a fixed stator member carrying a plurality of stator contacts, means carried by said main tuning shaft for supporting a plurality of VHF tuning panels each of which includes a plurality of tuning coils which are connected to said stator contacts in said alternate detent positions of said common selector shaft, means permanently connecting the base of said transistor oscillator to a first one of said stator contacts, means connecting a second one of said stator contacts to ground, and means carried by each of said tuning panels for electrically connecting said first stator contact to said second stator contact in said alternate detent positions of said common selector shaft, thereby to disable said oscillator in said alternate detent positions of said common selector shaft.

79. The tuner arrangement of claim 78, which includes tuning means permanently connected to said stator contacts for tuning said VHF tuner means to the IF frequency of said UHF tuner means when said common selector shaft is in a detent position between said alternate detent positions.

80. The tuner arrangement of claim 79, wherein said tuning coils on each of said VHF tuning panels are effective to tune said VHF tuner means to a predetermined VHF station when connected in circuit with said permanently connected tuning means through said stator contacts.

81. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means connected to said selector shaft and effective to receive any one of the seventy UHF stations in the detent positions between said alternate detent positions upon rotation of said selector shaft through a plurality of revolutions, said UHF tuner means including a transistor oscillator having a base and a collector, means for continuously supplying a unidirectional supply voltage to said collector, means for supplying an enabling bias potential to said base in the detent positions between said alternate detent positions, and means for reducing said bias potential so that said oscillator is disabled in said alternate detent positions.

82. The tuner arrangement of claim 81, wherein said UHF tuner means includes an IF output circuit, and means for connecting a low impedance across said IF output circuit when said common selector shaft is in said alternate detent positions.

83. A television tuner arrangement for receiving signals in the VHF television band, comprising means defining a tuner housing having a front wall, a VHF channel selector shaft rotatably mounted in said front wall, detent means for establishing a plurality of equally spaced detent positions for said selector shaft, a fixed stator member mounted in said housing and carrying a plurality of stator contacts, means positioned on said selector shaft for supporting a plurality of tuning panels individually arranged to be connected to said stator contacts in said detent positions of said selector shaft, said tuning panels each having a rotatable fine tuning adjustment member carried thereby, a VHF fine tuning shaft concentric with said selector shaft and positioned outside said front wall, VHF fine tuning means responsive to movement of said fine tuning shaft and operative through said front wall to rotate the fine tuning adjustment member on each one of said panels when said one panel is connected to said stator contacts, a first gear mounted on said selector shaft behind said front wall and positioned outside the path of movement of said fine tuning adjustment members on said panels as said selector shaft is rotated, and chhanel indicator means including a second gear in engagement with said first gear for indicating the channel numbers of VHF stations received by said VHF tuner means as said selector shaft is rotated.

84. The arrangement of claim 83, wherein said first gear forms a part of said tuning panel supporting means.

85. The arrangement of claim 83, wherein said second gear comprises a crown gear and said housing has an opening therein to permit engagement of said first and second gears.

86. The arrangement of claim 83, wherein said second gear comprises a crown gear rotatable about an axis perpendicular to said selector shaft, and said channel indicator means includes means defining a viewing position which is diametrically opposite the point of engagement of said first gear and said crown gear.

87. The arrangement of claim 83, which includes a disc secured to said selector shaft and extending transversely therefrom, means defining a plurality of apertures in said disc one for each of said tuning panels, said first gear being formed in the periphery of said disc.

88. The arrangement of claim 87, wherein said disc includes means in engagement with said fine tuning adjustment members for holding the same in adjusted position.

89. A UHF tuner arrangement comprising, a continuously variable main tuning shaft rotation of which is effective selectively to receive signals from all stations in the UHF band, a station selector shaft positioned perpendicular to said main tuning shaft and offset from the axis thereof, detent means for establishing a plurality of equally spaced detent positions for said selector shaft, a worm gear connected to said main tuning shaft and rotatable therewith, a worm connected to said selector shaft and in engagement with said worm gear, whereby rotation of said selector shaft through a number of revolutions is effective selectively to position said main tuning shaft to receive signals from any UHF station in the UHF band, a fine tuning shaft concentric with said selector shaft, and means responsive to rotation of said fine tuning shaft for producing relative movement between said worm and said main tuning shaft, thereby to provide a fine tuning adjustment of said main tuning shaft when said station selector shaft is restrained by said detent means.

90. The tuner arrangement of claim 89, wherein said fine tuning shaft is positioned inside said selector shaft.

91. The tuner arrangement of claim 89, wherein said fine tuning shaft and said selector shaft are provided with cooperating threaded portions, and means responsive to relative axial motion of said threaded portions for producing said relative movement.

92. The tuner arrangement of claim 91, wherein said main tuning shaft is mounted in a housing, means mounting said housing for pivotal movement with respect to said selector shaft, and means for biasing said housing into engagement with said fine tuning shaft, whereby rotation of said fine tuning shaft is effective to move said housing and said main tuning shaft relative to said worm.

93. The tuner arrangement of claim 92, wherein said fine tuning shaft is positioned inside said selector shaft and has one end which extends beyond the end of said selected shaft, and means for biasing said housing into engagement with said one end of said fine tuning shaft.

94. The tuner arrangement of claim 89, which includes means for restraining said selector shaft against axial movement, cooperating threaded portions on said fine tuning shaft and said selector shaft, whereby rotation of said fine tuning shaft when said selector shaft is in one of said detent positions produces axial movement of said fine tuning shaft relative to said selector shaft, and means responsive to said axial movement of said fine tuning shaft for moving said main tuming shaft relative to said worm.

95. The tuner arrangement of claim 94, wherein ssaid main tuning shaft is mounted in a housing, means mounting said housing for pivotal movement about an axis parallel to said main tuning shaft, and means for biasing said housing into engagement with said fine tuning shaft, whereby said axial movement of said fine tuning shaft is effective to move said main tuning shaft relative to said worm.

96. A television tuner arrangement for receiving both VHF and UHF television signals, comprising a common VHF and UHF station selector shaft, detent means for establishing a plurality of equally spaced detent positions for said selector shaft, VHF tuner means for selecting different VHF stations in alternate detent positions of said selector shaft, UHF tuner means including a continuously variable main tuning shaft rotation of which is effective selectively to receive signals from all stations in the UHF band, a worm gear connected to said main tuning shaft and rotatable therewith, a worm connected to said selector shaft and in engagement with said worm gear, said worm and worm gear providing a sufficiently large step-down ratio between said common selector shaft and said main tuning shaft that all of the stations in the UHF band are covered by rotating said selector shaft a plurality of revolutions, and means for enabling said UHF tuner means in the detent positions between said alternate detent positions.

97. The tuner arrangement of claim 96, wherein said detent means provides twenty-four equally spaced detent positions and said selector shaft is rotated more than five revolutions to cover the entire UHF band.

98. The tuner arrangement of claim 96, wherein said main tuning shaft is positioned perpendicular to said selector shaft.

99. The tuner arrangement of claim 96, which includes a fine tuning shaft concentric with said selector shaft, and means responsive to rotation of said fine tuning shaft for producing relative movement between said worm and said main tuning shaft, thereby to provide a fine tuning adjustment of said main tuning shaft when said selector shaft is in detent positions between said alternate detent positions.

100. The tuner arrangement of claim 96, which includes a fine tuning shaft concentric with said selector shaft, means defining cooperative threaded portions on said fine tuning shaft and said selector shaft, and means responsive to relative axial motion of said threaded portions for producing relative movement between said worm and said main tuning shaft.

101. The tuner arrangement of claim 100, wherein said main tuning shaft is mounted in a housing, means mounting said housing for pivotal movement with respect to said selector shaft, and means for biasing said housing into engagement with said fine tuning shaft, whereby rotation of said fine tuning shaft is effective to move said housing and said main tuning shaft relative to said worm.

102. The tuner arrangement of claim 101, wherein said fine tuning shaft is positioned inside said selector shaft and has one end which extends beyond the end of said selector shaft, and means for biasing said housing into engagement with said one end of said fine tuning shaft.

103. A UHF tuning system, comprising a UHF tuner having a main tuning shaft and including an oscillator tunable in response to rotation of said main tuning shaft, said oscillator also including a fine tuning oscillator coil for varying the frequency of said oscillator independently of said main tuning shaft, a selector shaft, gear means interconnecting said selector shaft and said main tuning shaft, detent means for said selector shaft, a fine tuning shaft positioned outside said selector shaft and concentric therewith, a fine tuning element mounted for movement about an axis parallel to but offset from said selector shaft and having an end portion which affects the tuning of said oscillator coil when said element is rotated about said axis, and means responsive solely to rotation of said fine tuning shaft for rotating said element about said axis.

104. The system of claim 103, wherein said fine tuning element comprises a rod having an intermediate portion which extends along said axis and one end portion which is arranged to affect the tuning of said oscillator coil when said rod is rotated about said axis, and cam means in engagement with the other end of said rod and driven from said fine tuning shaft.

105. The system of claim 104, wherein said cam means is connected to said fine tuning shaft and said other end of said rod is perpendicur to said intermediate portion and engages said cam means.

106. The system of claim 104, which includes means defining a stationary trough extending parallel to said fine tuning shaft, said intermediate portion of said rod being rotatably positioned in said trough.

107. The system of claim 106, wherein said intermediate portion of said rod has a transversely extending projection and means in engagement with said projection for holding said intermediate portion in engagement with the walls of said trough.

108. The system of claim 107, wherein said engaging means comprises a flat spring secured to one of said walls and engaging said projection.

109. The tuning system of claim 103, which includes a first gear mounted on said selector shaft behind said fine tuning shaft, and channel indicator means including a second gear in engagement with said first gear for indicating the channel numbers of UHF stations received by said UHF tuner as said selector shaft is rotated.

* * * * *